(12) United States Patent
Masumura et al.

(10) Patent No.: US 9,230,946 B2
(45) Date of Patent: Jan. 5, 2016

(54) SEMICONDUCTOR INTEGRATED CIRCUIT DEVICE

(71) Applicant: Renesas Electronics Corporation, Kanagawa (JP)

(72) Inventors: Yoshihiro Masumura, Kanagawa (JP); Hideki Sasaki, Kanagawa (JP); Toshiharu Okamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/105,281

(22) Filed: Dec. 13, 2013

(65) Prior Publication Data

US 2014/0167292 A1    Jun. 19, 2014

(30) Foreign Application Priority Data

Dec. 17, 2012    (JP) ................... 2012-274261

(51) Int. Cl.
*H01L 23/48*    (2006.01)
*H01L 25/18*    (2006.01)
*H01L 23/00*    (2006.01)

(52) U.S. Cl.
CPC ............... *H01L 25/18* (2013.01); *H01L 24/48* (2013.01); *H01L 24/45* (2013.01); *H01L 24/49* (2013.01); *H01L 2224/05554* (2013.01); *H01L 2224/05624* (2013.01); *H01L 2224/05647* (2013.01); *H01L 2224/32225* (2013.01); *H01L 2224/45015* (2013.01); *H01L 2224/45124* (2013.01); *H01L 2224/45139* (2013.01); *H01L 2224/45144* (2013.01); *H01L 2224/45147* (2013.01); *H01L 2224/45164* (2013.01); *H01L 2224/4848* (2013.01); *H01L 2224/48091* (2013.01); *H01L 2224/48137* (2013.01); *H01L 2224/48227* (2013.01); *H01L 2224/48228* (2013.01); *H01L 2224/48465* (2013.01); *H01L 2224/48471* (2013.01); *H01L 2224/48479* (2013.01); *H01L 2224/48624* (2013.01); *H01L 2224/49175* (2013.01); *H01L 2224/73265* (2013.01); *H01L 2224/85051* (2013.01); *H01L 2224/92247* (2013.01); *H01L 2924/1306* (2013.01); *H01L 2924/13091* (2013.01); *H01L 2924/15174* (2013.01); *H01L 2924/15183* (2013.01); *H01L 2924/15311* (2013.01);

(Continued)

(58) Field of Classification Search
CPC .................... H01L 25/18; H01L 25/48; H01L 2924/15174
See application file for complete search history.

(56) References Cited

U.S. PATENT DOCUMENTS 6,453,445 B1 *  9/2002  Kuhn et al. ..................... 716/55
6,525,394 B1 *  2/2003  Kuhn et al. ................... 257/509

(Continued)

FOREIGN PATENT DOCUMENTS

JP    09-223705 A     8/1997
JP    2001-267491 A   9/2001

(Continued)

*Primary Examiner* — A. Sefer
(74) *Attorney, Agent, or Firm* — Foley & Lardner LLP

(57) ABSTRACT

The present invention provides a multichip package in which a first semiconductor chip having an RF analog circuit area and a digital circuit area, and a second semiconductor chip having a digital circuit area are plane-arranged over an organic multilayer wiring board and coupled to each other by bonding wires. In the multichip package, the first semiconductor chip is made thinner than the second semiconductor chip.

8 Claims, 30 Drawing Sheets

(52) U.S. Cl.
CPC ............... *H01L 2924/15788* (2013.01); *H01L 2924/3011* (2013.01); *H01L 2924/3025* (2013.01); *H01L 2924/30107* (2013.01)

(56) References Cited

U.S. PATENT DOCUMENTS

| | | | |
|---|---|---|---|
| 7,939,907 B2 * | 5/2011 | Osaka et al. | 257/500 |
| 8,018,048 B2 | 9/2011 | Tamaki | |
| 8,124,452 B2 * | 2/2012 | Sheats | 438/109 |
| 2002/0024125 A1 | 2/2002 | Shibata | |
| 2009/0189158 A1 * | 7/2009 | Takemoto | 257/48 |
| 2009/0302438 A1 * | 12/2009 | Chauhan et al. | 257/659 |
| 2009/0315167 A1 * | 12/2009 | Sasaki et al. | 257/686 |
| 2010/0221858 A1 * | 9/2010 | Miyairi | 438/34 |
| 2012/0104588 A1 * | 5/2012 | Chen et al. | 257/676 |
| 2012/0208324 A1 | 8/2012 | Harata et al. | |
| 2012/0238056 A1 * | 9/2012 | Numazaki | 438/107 |
| 2013/0187031 A1 * | 7/2013 | Popp et al. | 250/214 DC |

FOREIGN PATENT DOCUMENTS

| | | |
|---|---|---|
| JP | 2004-356382 A | 12/2004 |
| JP | 2008-251731 A | 10/2008 |
| JP | 2012-169417 A | 9/2012 |
| WO | WO-03/003461 A1 | 1/2003 |

* cited by examiner

SEMICONDUCTOR INTEGRATED CIRCUIT DEVICE

CROSS-REFERENCE TO RELATED APPLICATIONS

The disclosure of Japanese Patent Application No. 2012-274261 filed on Dec. 17, 2012 including the specification, drawings and abstract is incorporated herein by reference in its entirety.

BACKGROUND

The present application relates to a semiconductor integrated circuit device (or semiconductor device), and is applicable to, for example, a semiconductor integrated circuit device having an analog circuit area and a digital circuit area.

Japanese Unexamined Patent Publication Laid-Open No. 2001-267491 (Patent Document 1) or U.S. Patent Application Publication No. 2002-24125 (Patent Document 2) corresponding to it relates to a multichip package in which a plurality of semiconductor chips are arranged side by side at the surface of a semiconductor chip and flip-chip bonded. There has been disclosed therein a technology in which the semiconductor chips to be flip-chip bonded are die-bonded in thin order in such a manner that a flip-chip bonding collet and the previously-bonded chips do not interfere with each other.

Japanese Unexamined Patent Publication Laid-Open No. 2008-251731 (Patent Document 3) or U.S. Pat. No. 8,018,048 (Patent Document 4) corresponding to it relates to a resin-sealed multichip package in which a plurality of semiconductor chips are arranged side by side and die-bonded. There has been disclosed therein a technology in which the semiconductor chip largest in thickness is mounted to the central part of the package to prevent the package from being curved.

Japanese Unexamined Patent Publication Laid-Open No. 2004-356382 (Patent Document 5) relates to a resin-sealed multichip package in which a plurality of semiconductor chips are arranged side by side over a lead frame and die-bonded and the chips are interconnected therebetween by bonding wires. There has been disclosed therein a technology in which in order to prevent a wire shift or the like, the semiconductor chips thick in thickness are coupled to each other by ball bonding, and the semiconductor chips thin in thickness are coupled to each other by wedge bonding.

Japanese Unexamined Patent Publication Laid-Open No. 2012-169417 (Patent Document 6) relates to a high-frequency resin-sealed multichip package in which a plurality of semiconductor chips are arranged side by sided and die-bonded using a lead frame, and the chips are interconnected therebetween by bonding wires. There has been disclosed therein a technology in which the semiconductor chip on the high-frequency side is made thicker in thickness than other semiconductor chips to ensure mechanical strength.

Japanese Unexamined Patent Publication Laid-Open No. Hei 9 (1997)-223705 (Patent Document 7) relates to a resin-sealed package in which semiconductor chips each having an analog circuit area and a digital circuit area are mounted overt die pads. There has been disclosed therein a technology in which the die pads below the analog circuit area and the die pads below the digital circuit area are separated from one another.

International Patent Publication No. 2003/3461, Pamphlet (Patent Document 8) relates to the layout or the like of semiconductor chips each having an analog circuit area and a digital circuit area. There has been disclosed therein a technology in which they are separated from one another by a well structure, a guard ring and the like to prevent noise from propagating from the digital circuit area to the analog circuit area.

RELATED ART DOCUMENTS

Patent Documents

[Patent Document 1] Japanese Unexamined Patent Publication Laid-Open No. 2001-267491
[Patent Document 2] U.S. Patent Application Publication No. 2002-24125
[Patent Document 3] Japanese Unexamined Patent Publication Laid-Open No. 2008-251731
[Patent Document 4] U.S. Pat. No. 8,018,048
[Patent Document 5] Japanese Unexamined Patent Publication Laid-Open No. 2004-356382
[Patent Document 6] Japanese Unexamined Patent Publication Laid-Open No. 2012-169417
[Patent Document 7] Japanese Unexamined Patent Publication Laid-Open No. Hei 9 (1997)-223705
[Patent Document 8] International Patent Publication No. 2003/3461, Pamphlet

SUMMARY

It has been revealed that a multichip package in which a first semiconductor chip having an RF analog circuit area and a digital circuit area, and a second semiconductor chip having a digital circuit area are plane-arranged over an organic multilayer wiring board and mutually coupled by bonding wires is accompanied by a problem about the propagation of noise from various digital circuit areas to the RF analog circuit area through various paths.

Although means and the like for solving such a problem are described below, other objects and novel features will become apparent from the description of the present specification and the accompanying drawings.

A summary of a typical one of embodiments disclosed in the present application will briefly be described as follows:

A summary of one embodiment of the present application is that in a multichip package in which a first semiconductor chip having an RF analog circuit area and a digital circuit area, and a second semiconductor chip having a digital circuit area are plane-arranged over an organic multilayer wiring board and mutually coupled by bonding wires, the first semiconductor chip is made thinner in thickness than the second semiconductor chip.

An advantageous effect obtained by the typical one of the embodiments disclosed in the present application will briefly be described as follows:

According to one embodiment of the present application, it is possible to reduce the propagation of noise from a digital circuit area to an RF analog circuit area.

DETAILED DESCRIPTION

1. Summary of the Embodiments

Figure 1:
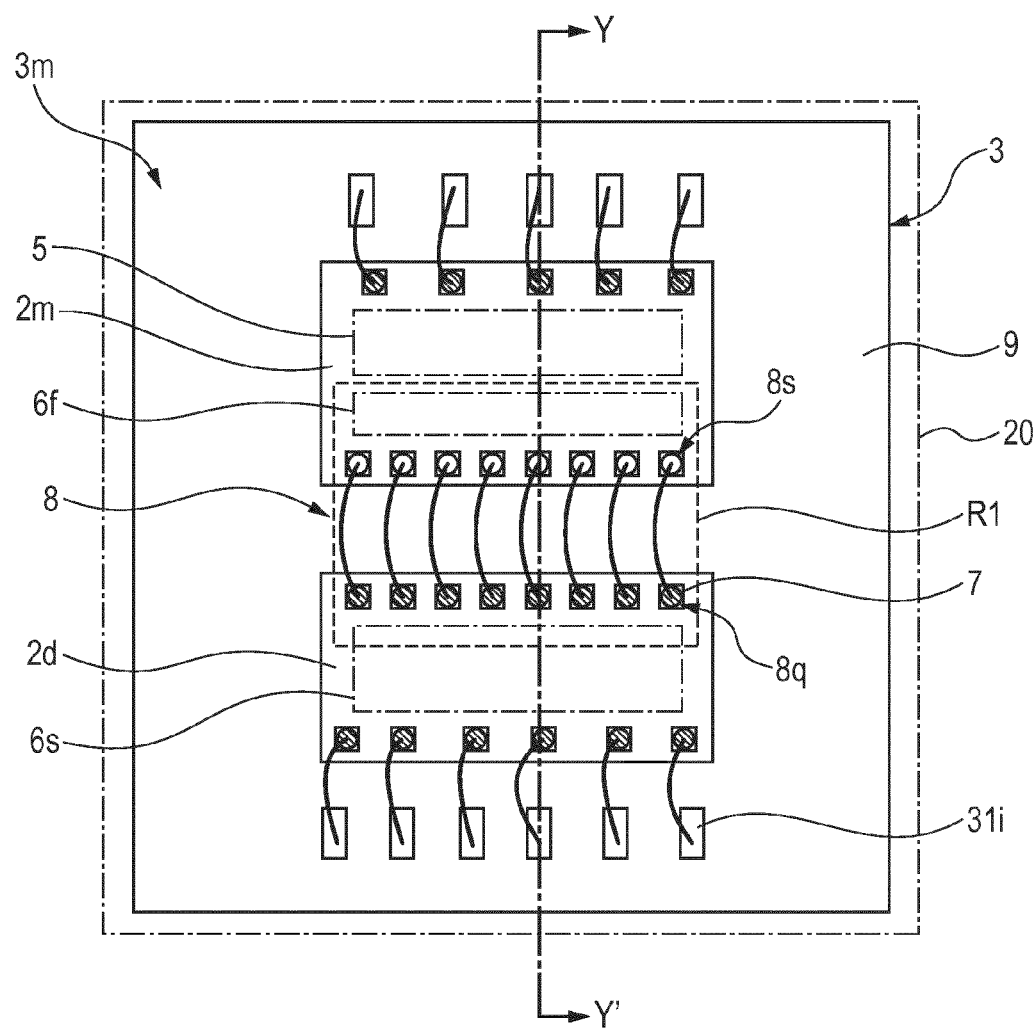
FIG. 1 is a typical top view (from which a sealing resin has been eliminated to make it easy to see) of a BGA (Ball Grid Array) for describing a device structure or the like in a semiconductor integrated circuit device according to one embodiment of the present application.

A summary of a typical embodiment disclosed in the present application will first be described.

1. A semiconductor integrated circuit device includes the following: (a) an organic multilayer wiring board having a chip mounting surface and an external land arrangement surface; (b) a first semiconductor chip mounted over the chip mounting surface and having an analog circuit area and a first digital circuit area; (c) a second semiconductor chip mounted over the chip mounting surface and having a second digital circuit area; and (d) a plurality of bonding wires which interconnect between a plurality of terminals provided over respective surfaces of the first and second semiconductor chips. Here, the thickness of the first semiconductor chip is thinner than that of the second semiconductor chip.

2. In the semiconductor integrated circuit device of the section 1, a semiconductor substrate of the first semiconductor chip is a P-type single crystal semiconductor silicon substrate, and an in-substrate structure thereof is a non-epitaxial substrate type bulk CMOS structure.

3. In the semiconductor integrated circuit device of the section 1 or 2, the organic multilayer wiring board includes the following: (a1) a front surface wiring layer provided on the front surface side; (a2) a back surface wiring layer provided on the back surface side; (a3) a front surface-side internal wiring layer provided between the front surface wiring layer and the back surface wiring layer; (a4) a back surface-side internal wiring layer placed between the front surface wiring layer and the back surface wiring layer and provided on the side closer to the back surface wiring layer than the front surface-side internal wiring layer; (a5) a first analog circuit-internal layer reference voltage plane which is below the first semiconductor chip and provided in one of the front surface-side internal wiring layer and the back surface-side internal wiring layer; and (a6) a first digital circuit-internal layer reference voltage plane which is below the first semiconductor chip and which is provided in the one of the front surface-side internal wiring layer and the back surface-side internal wiring layer and plane-geometrically separated from the first analog circuit-internal layer reference voltage plane.

4. In the semiconductor integrated circuit device of any one of the sections 1 through 3, the first semiconductor chip includes the following: (b1) a low-noise amplifier area provided in the analog circuit area; (b2) a plurality of analog element circuit areas provided within the analog circuit area, separately from the low-noise amplifier area; (b3) a low-noise amplifier area-reference voltage terminal for the low-noise amplifier area, and (b4) an analog element circuit area-reference voltage terminal for each analog element circuit area. Here, the low-noise amplifier area-reference voltage terminal and each of the analog element circuit area-reference voltage terminals are shortest-interconnected through an analog circuit-back surface reference voltage plane provided in the back surface wiring layer.

5. In the semiconductor integrated circuit device of the section 4, the individual analog element circuit area-reference voltage terminals are shortest-interconnected through the first analog circuit-internal layer reference voltage plane.

6. In the semiconductor integrated circuit device of the section 4 or 5, the front surface wiring layer includes the following: (a1-1) a low-noise amplifier area-reference voltage wiring coupled to the low-noise amplifier area-reference voltage terminal by a bonding wire; (a1-2) a low-noise amplifier area-power wiring coupled to a low-noise amplifier area-power terminal by a bonding wire; and (a1-3) a low-noise amplifier area-signal wiring coupled to a low-noise amplifier area-signal terminal by a bonding wire. Here, the first analog circuit-internal layer reference voltage plane has a cutout portion that monolithically includes these wirings, at a portion where the first analog circuit-internal layer reference voltage plane overlaps with these wirings.

7. The semiconductor integrated circuit device of any one of the sections 1 through 6 further includes the following: (e) a first digital circuit area-reference voltage terminal provided over the first semiconductor chip; (f) a second digital circuit area-reference voltage terminal provided over the second semiconductor chip; and (g) a digital circuit-back surface reference voltage plane provided in the back surface wiring layer. Here, the first digital circuit area-reference voltage terminal and the second digital circuit area-reference voltage terminal are shortest-interconnected through the digital circuit-back surface reference voltage plane.

8. In the semiconductor integrated circuit device of any one of the sections 3 through 7, the first digital circuit area includes the following: (b5) a digital baseband processing circuit area; and (b6) a differential output buffer circuit area for differential-outputting a signal outputted from the digital baseband processing circuit area to the outside of the first semiconductor chip. Further, the other of the front surface-side internal wiring layer and the back surface-side internal wiring layer includes the following: (a5-1) a digital baseband processing circuit area-inner layer power plane which is below the first semiconductor chip and provided in the other of the front surface-side internal wiring layer and the back surface-side internal wiring layer; and (a5-2) a differential output buffer circuit area-inner layer power plane which is below the first semiconductor chip and which is provided in the other of the front surface-side internal wiring layer and the back surface-side internal wiring layer and plane-geometrically separated from the digital baseband processing circuit area-inner layer power plane.

9. In the semiconductor integrated circuit device of any one of the sections 3 through 8, the second digital circuit area includes the following: (b7) a digital demodulator circuit area; and (b8) a differential input buffer circuit area for receiving a differential signal sent from the outside of the second semiconductor chip and sending the same to the digital demodulator circuit area. The other of the front surface-side internal wiring layer and the back surface-side internal wiring layer includes the following: (a5-3) a differential input buffer circuit area-inner layer power plane which is below the second semiconductor chip and provided in the other of the front surface-side internal wiring layer and the back surface-side internal wiring layer; and (a5-4) a digital demodulator circuit-power plane which is below the second semiconductor chip and which is provided in the other of the front surface-side internal wiring layer and the back surface-side internal wiring layer and plane-geometrically separated from the differential input buffer circuit area-inner layer power plane.

10. In the semiconductor integrated circuit device of any one of the sections 4 through 9, the first semiconductor chip includes the following: (b9) a guard band provided so as to separate between the analog circuit area and the first digital circuit area; and (b10) a guard ring provided so as to surround a periphery of the low-noise amplifier area. Here, the guard band and the guard ring are respectively electrically coupled to reference voltage terminals different from the low-noise amplifier area-reference voltage terminal and different from each other.

Another summary of a typical embodiment disclosed in the present application will next be described.

11. A semiconductor integrated circuit device includes the following: (a) an organic multilayer wiring board having a chip mounting surface and an external land arrangement surface; (b) an analog RF signal processing semiconductor chip mounted over the chip mounting surface; (c) a digital signal processing semiconductor chip mounted over the chip mounting surface; (d) an analog circuit area and a first digital circuit area provided on the front surface side of the analog RF signal processing semiconductor chip; (e) a second digital circuit area provided on the front surface side of the digital signal processing semiconductor chip; (f) a first bonding pad provided on the front surface side of the analog RF signal processing semiconductor chip and for sending out one signal of a first differential digital signal pair; (g) a second bonding pad provided on the front surface side of the analog RF signal processing semiconductor chip and provided in close vicinity to the first bonding pad to send out the other signal of the first differential digital signal pair; (h) a third bonding pad provided on the front surface side of the digital signal processing semiconductor chip and for receiving the one signal of the first differential digital signal pair; (i) a fourth bonding pad provided on the front surface side of the digital signal processing semiconductor chip and provided in close vicinity to the third bonding pad to receive the other signal of the first differential digital signal pair; (j) a first bonding wire which interconnects between the first bonding pad and the third bonding pad; and (k) a second bonding wire which interconnects between the second bonding pad and the fourth bonding pad.

12. The semiconductor integrated circuit device of the section 11 further includes the following: (l) a fifth bonding pad provided on the front surface side of the analog RF signal processing semiconductor chip and for sending out one signal of a second differential digital signal pair; (m) a sixth bonding pad provided on the front surface side of the analog RF signal processing semiconductor chip and provided in close vicinity to the fifth bonding pad to send out the other signal of the second differential digital signal pair; (n) a seventh bonding pad provided on the front surface side of the digital signal processing semiconductor chip and for receiving the one signal of the second differential digital signal pair; (o) an eighth bonding pad provided on the front surface side of the digital signal processing semiconductor chip and provided in close vicinity to the seventh bonding pad to receive the other signal of the second differential digital signal pair; (p) a third bonding wire which interconnects between the fifth bonding pad and the seventh bonding pad; and (q) a fourth bonding wire which interconnects between the sixth bonding pad and the eighth bonding pad.

13. In the semiconductor integrated circuit device of the section 11 or 12, the distance between the first bonding pad and the second bonding pad is approximately equal to the distance between the third bonding pad and the fourth bonding pad.

14. In the semiconductor integrated circuit device of the section 12 or 13, the distance between the fifth bonding pad and the sixth bonding pad is approximately equal to the distance between the seventh bonding pad and the eighth bonding pad.

15. In the semiconductor integrated circuit device of any one of the sections 12 through 14, a straight line that couples the second bonging pad and the fourth bonding pad is made substantially parallel with a straight line that couples the fifth bonding pad and the seventh bonding pad as seen in a planar manner.

16. In the semiconductor integrated circuit device of any one of the sections 12 through 15, the second bonding pad is adjacent to the fifth bonding pad. The fourth bonding pad is adjacent to the seventh bonding pad.

17. In the semiconductor integrated circuit device of any one of the sections 11 through 16, the third bonding pad and the fourth bonding pad are terminated therebetween by a first terminating resistor built in the digital signal processing semiconductor chip.

18. In the semiconductor integrated circuit device of the section 17, the first terminating resistor is a salicide resistor.

19. In the semiconductor integrated circuit device of any one of the sections 12 through 16, the seventh bonding pad and the eighth bonding pad are terminated therebetween by a second terminating resistor built in the digital signal processing semiconductor chip.

20. In the semiconductor integrated circuit device of the section 19, the second terminating resistor is a salicide resistor.

[Explanations of Description Format, Basic Terms, and Usage in the Present Application]

1. In the present application, a description in the embodiments may be described separately into plural sections for convenience as needed, but unless otherwise specifically indicated, they are not separated independently of each other. Each portion of a single example one of which is a partial detail of the other or a modification example of a part or whole of the other one, or the like. In addition, as a general rule, each part of the same will not be repeated. Further, respective components in the aspect of the embodiment are not essential unless otherwise specifically indicated, limited to the number theoretically and otherwise apparently from the context.

Further, in the present application, the term "semiconductor device" or "semiconductor integrated circuit device" refers to a single of various transistors (active elements), and one obtained by integrating resistors, capacitors and the like over a semiconductor chip or the like (e.g., single crystal silicon substrate) centering on the transistors, and one obtained by packaging each semiconductor chip. Here, as a representative one of the various transistors, there can be illustrated a MISFET (Metal Insulator Semiconductor Field Effect Transistor) typified by a MOSFET (Metal Oxide Semiconductor Field Effect Transistor). At this time, as a representative one of integrated circuit configurations, there can be illustrated a CMIS (Complementary Metal Insulator Semiconductor) type integrated circuit typified by a CMOS (Complementary Metal Oxide Semiconductor) type integrated circuit in which an N channel type MISFET and a P channel type MISFET are combined.

A wafer process of a current-day semiconductor integrated circuit device, i.e., LSI (Large Scale Integration) is normally considered to be divided into two parts. That is, as the first part, there is an FEOL (Front End of Line) that goes up to a Premetal process (process comprised of formation of an interlayer insulating film or the like between a lower end of an M1 wiring layer and a gate electrode structure, formation of each contact hole, tungsten plugs, embedding and the like) from the carrying-in of a silicon wafer as a raw material. As the second part, there is a BEOL (Back End of Line) that goes up to the formation of a pad opening in a final passivation film over an aluminum-based pad electrode (in a wafer level package process, the corresponding process is also included), starting with the formation of the MI wiring layer.

2. Likewise, in the description of the aspect or the like of the embodiment, even though being such as "X consists of A" as to a material, composition, etc., unless otherwise specifically indicated and otherwise apparently from the context, each of the elements other than A is not intended to preclude one used as one of main constituent elements. For example, as for the term of each component, it is a meaning of such as "X including A as a major component". For example, even in the case of a "silicon member" and the like, it is not limited to pure silicon, but it is needless to say that they also include members containing a SiGe alloy, a multiple alloy with other silicon as a main component, other additives, etc.

3. The term of "wafer" refers to a single crystal silicon wafer over which a semiconductor integrated circuit device (a semiconductor device and an electronic device are also the same) is normally formed, but it is needless to say that it also includes an epitaxial wafer, an SOI substrate, an insulating substrate such as an LCD glass substrate, a composite wafer of semiconductor layers, etc.

4. Graphics, positions, attributes and the like are suitably illustrated, but it is needless to say that no limitation is strictly imposed on them unless otherwise indicated in particular and otherwise apparent from the context. Accordingly, for example, the term "square" includes a substantially square shape, the term "orthogonal" includes a substantially orthogonal case, and the term "coincidence" includes a substantially coincident case. This is the same even with respect to the terms "parallel" and "right angle". Thus, for example, a deviation of about 10 degrees from the perfect parallelism belongs to the parallel. Likewise, for example, a deviation of about 10 degrees from the perfect perpendicular belongs to the vertical.

In a given area, the terms "whole", "general", "full region" and the like include "substantially whole", "substantially general", "substantially whole region", etc. Thus, for example, 80% or more of a given area can be defined to be "whole", "general" and "full region". This is the same even with respect to "whole circumference", "overall length", etc.

Further, when "rectangle" is given for the shape of a certain object, it includes "substantially rectangle". Thus, for example, if the area of a part different from the rectangle is less than about 20% of the whole, the shape can be said to be rectangular. This is the same even with respect to "circularity", etc. When a circular body is being divided in this case, a portion in which its divided element parts are interpolated or extrapolated is part of the circular body.

Even for periodicity, the term "periodic" includes substantially periodic. If for example, a periodic deviation is about less than 20% with respect to each element, each element can be said to be "periodic". Further, if one that falls outside this range is about less than for example, 20% of all elements targeted for its periodicity, the whole can be said to be "periodic".

Incidentally, the definition of this section is general. When there are definitions different in the following individual descriptions, the individual description is given priority with respect to each part herein. However, as to portions having no definitions or the like in the corresponding individual descriptions, the definition, provisions and the like of the present section are still effective therefor unless clearly denied.

5. Further, even when reference is made to specific numerical values and numerical quantity, they may be numerical values exceeding the specific numerical values or numerical values less than the specific numerical values unless otherwise particularly indicated, limited to the number theoretically and otherwise apparent from the context.

6. In a semiconductor substrate structure of a wafer or a chip in the present application, the term "non-epitaxial substrate type bulk CMOS structure" refers to the following. This will be explained divided into a "non-epitaxial substrate type" and a "bulk CMOS structure". That is, the "non-epitaxial substrate type" refers to a substrate structure of a standard CMOS device in which various doped regions are directly formed in a semiconductor substrate having a resistance higher than that of a low-resistance substrate portion without using a so-called "epitaxial substrate" that a relatively high-resistance epitaxial layer is formed over the entire surface over a relatively low-resistance semiconductor substrate (called "low-resistance substrate portion"). On the other hand, the portion of "bulk CMOS structure" indicates that it is not a special structure of an SOI substrate or the like.

Regarding a relationship of coupling of terminals lying over respective chips over an interposer or a motherboard, the term "shortest-interconnected via a specific plane" refers to the fact that the shortest path that couples two terminals to be noted and goes through the specific plane is the shortest of all paths. The corresponding path that goes through a chip's substrate is however eliminated.

Further, the term "guard ring" refers to, if described by taking a P-type semiconductor substrate for example, one which is a P+ impurity region formed in a semiconductor substrate surface corresponding to a specific circuit area and has a ring-like shape provided so as to surround the specific circuit area.

On the other hand, the term "guard band" is substantially the same as the "guard ring" structurally, but refers to one of which planar shape is not ring-shaped. This may refer to part of the "guard ring".

Incidentally, the term "seal ring" refers to a planar ring-like seal structure that covers external ends of a semiconductor chip in a wall manner. It is normally comprised of a structure similar to the guard ring at the semiconductor substrate surface, and a metal structure or the like in which wiring layers lying over a semiconductor substrate are stacked on each other. A major object thereof is to prevent infiltration of moisture or the like from outside and prevent mechanical shock. The seal ring is normally coupled to any reference potential.

The term "RF front-end module" refers to one which has a package format such as a BGA, a QFP or the like and has at least an LNA (Low Noise Amplifier), a mixer, a local oscillator circuit, a filter, a demodulator circuit (including part of demodulator circuit), etc. which are circuits for reception provided thereinside.

Further, the term "analog RF signal processing semiconductor chip" refers to a semiconductor chip which takes analog RF signal processing as one of major functions, and may take digital signal processing as one of other major functions in addition to it.

Likewise, the term "digital signal processing semiconductor chip" refers to a semiconductor chip which takes digital signal processing as one of major functions, and may take digital signal processing as one of other major functions in addition to it.

2. Further Detailed Description of the Embodiments

Embodiments will be explained in further detail. In the respective drawings, the same or like members will be identified by the same or like symbols or reference numerals and overlapping description will be omitted in principle.

When on the other hand, the accompanying drawings become cumbersome or a distinction from gaps is definite, hatching or the like may be omitted even in the case of sections. In the cases such as where apparent from the description or the like in relation to this, the profile line of the background may be omitted even if there are holes closed on a plane basis. Further, even though not sections, hatching may be provided to clearly demonstrate that they are not gaps.

Incidentally, when in regard to the designation of an alternative case, one of them is called "first" or the like, and the other thereof is called "second" or the like, there is a case in which they are illustrated with being associated with each other along a typical embodiment. It is however needless to say that even if it is called "first", for example, it is not limited to the corresponding choice illustrated by way of example.

Incidentally, there has been shown as Japanese Published Patent Application having described a tracking filter or the like used in an RF receiving device, for example, Japanese Unexamined Patent Application Publication (Translation of PCT Application) No. 2011-508486 or International Patent Publication No. 2009/76562, pamphlet corresponding to it. As Japanese Published Patent Application having described a Seal Ring or the like of a semiconductor chip peripheral portion, there is known, for example, Japanese Unexamined Patent Publication No. 2012-204630.

1. Description of device structure or the like in semiconductor integrated circuit device according to one embodiment of the present application (refer principally to FIGS. 1 through 19):

As one example, it will concretely be described below by taking for example, a broadband TV receiver that covers a VHF band and a UHF band. It is however needless to say that the invention can be applied to a transmitter-receiver, a telephone, a GPS (Global Positioning System) apparatus, other radio communication devices, a power communication device, etc. in an RF area.

Incidentally, a description will be made here centering on the applications in the RF area. It is however needless to say that the invention can be applied even to a device in which a plurality of chips other than in the RF area have been integrated, and a device equipped with an RF area and a single chip other than in the RF area.

Figure 2:
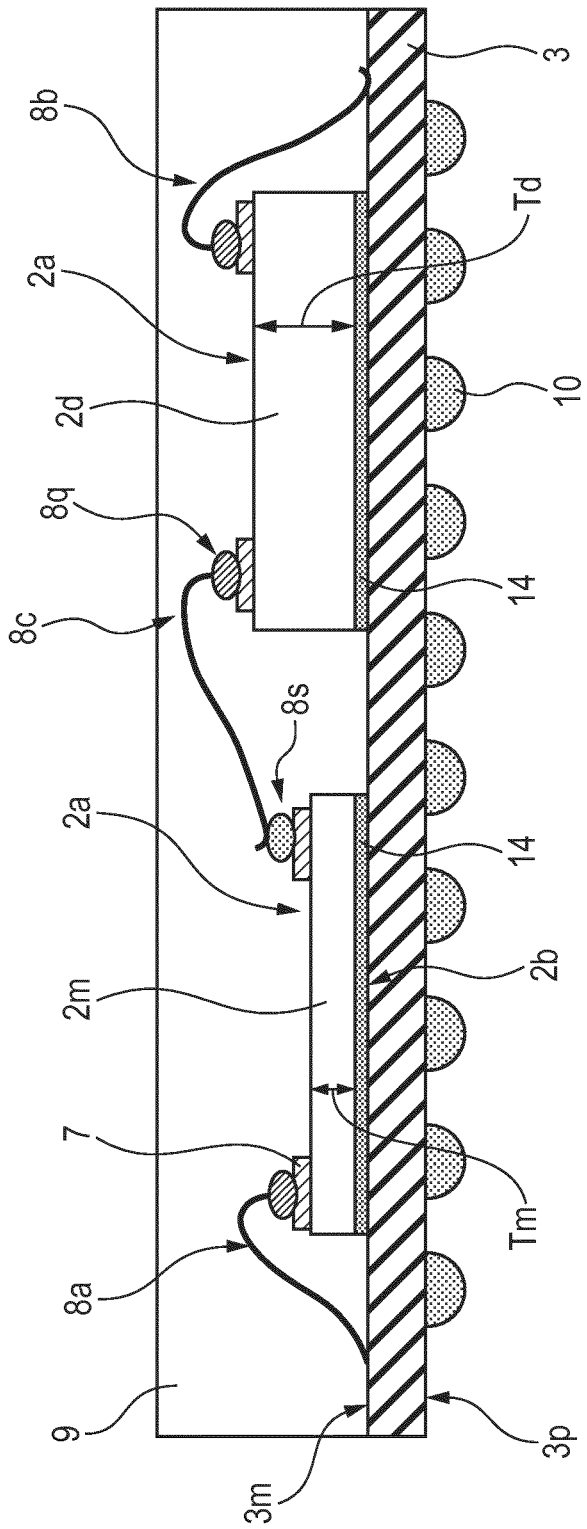
FIG. 2 is a typical sectional view of a section taken along line Y-Y' of FIG. 1.
Figure 3:
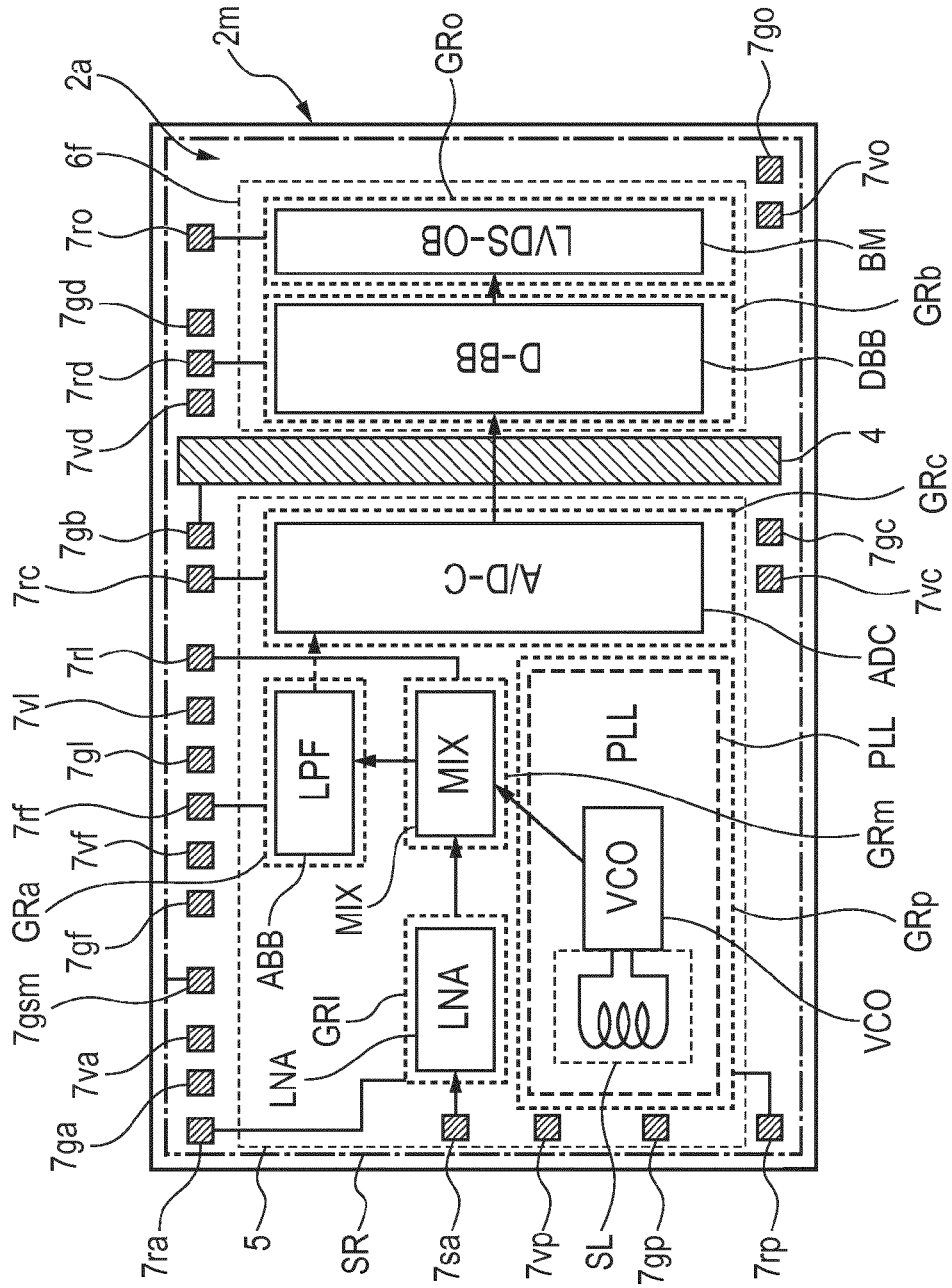
FIG. 3 is a typical top view of a mixed signal chip 2m (Mixed Signal Chip) in FIGS. 1 and 2.
Figure 4:
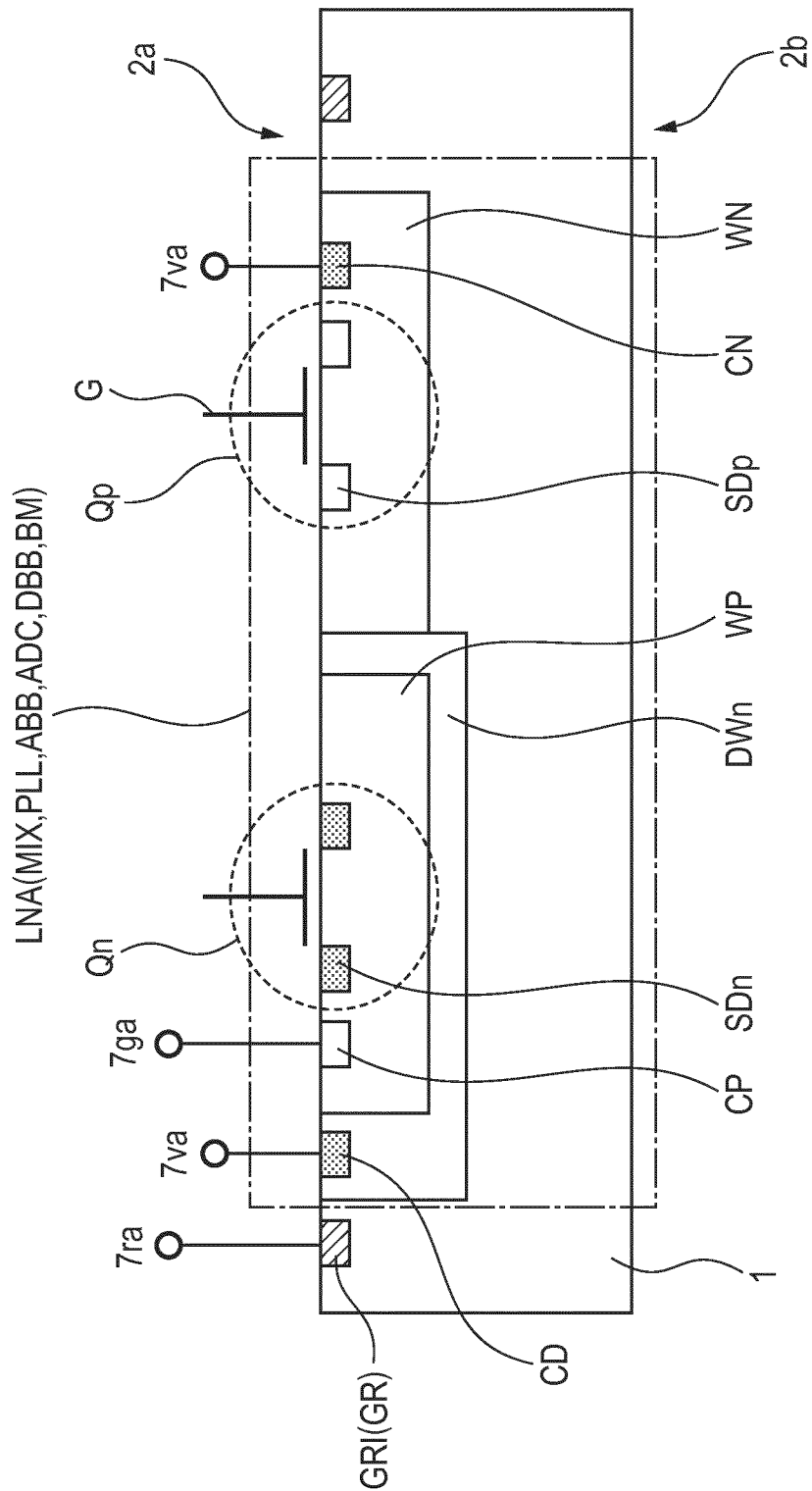
FIG. 4 is a typical sectional view for describing a low-noise amplifier circuit area LNA of FIG. 3 and a relationship of potential between respective areas in a semiconductor substrate at its periphery.
Figure 5:
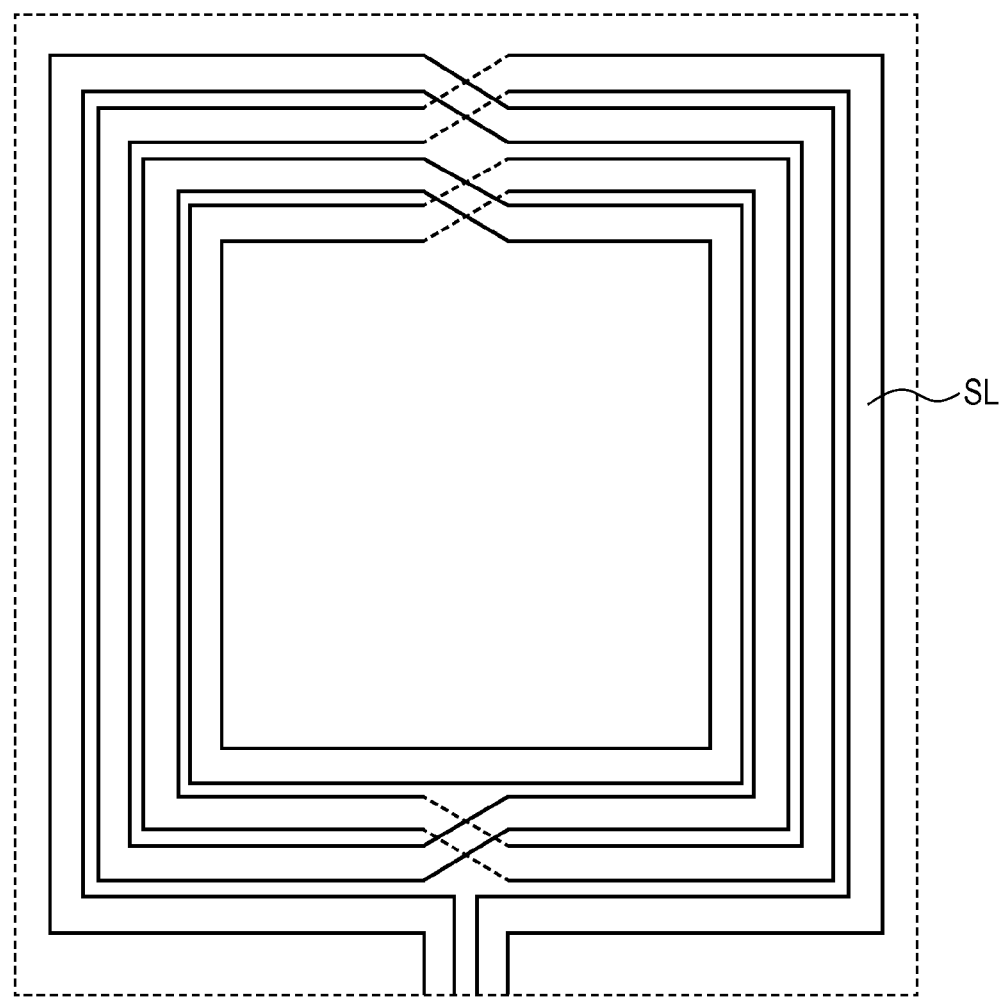
FIG. 5 is a chip local plan view showing one example of a spiral inductor SL of FIG. 3.
Figure 6:
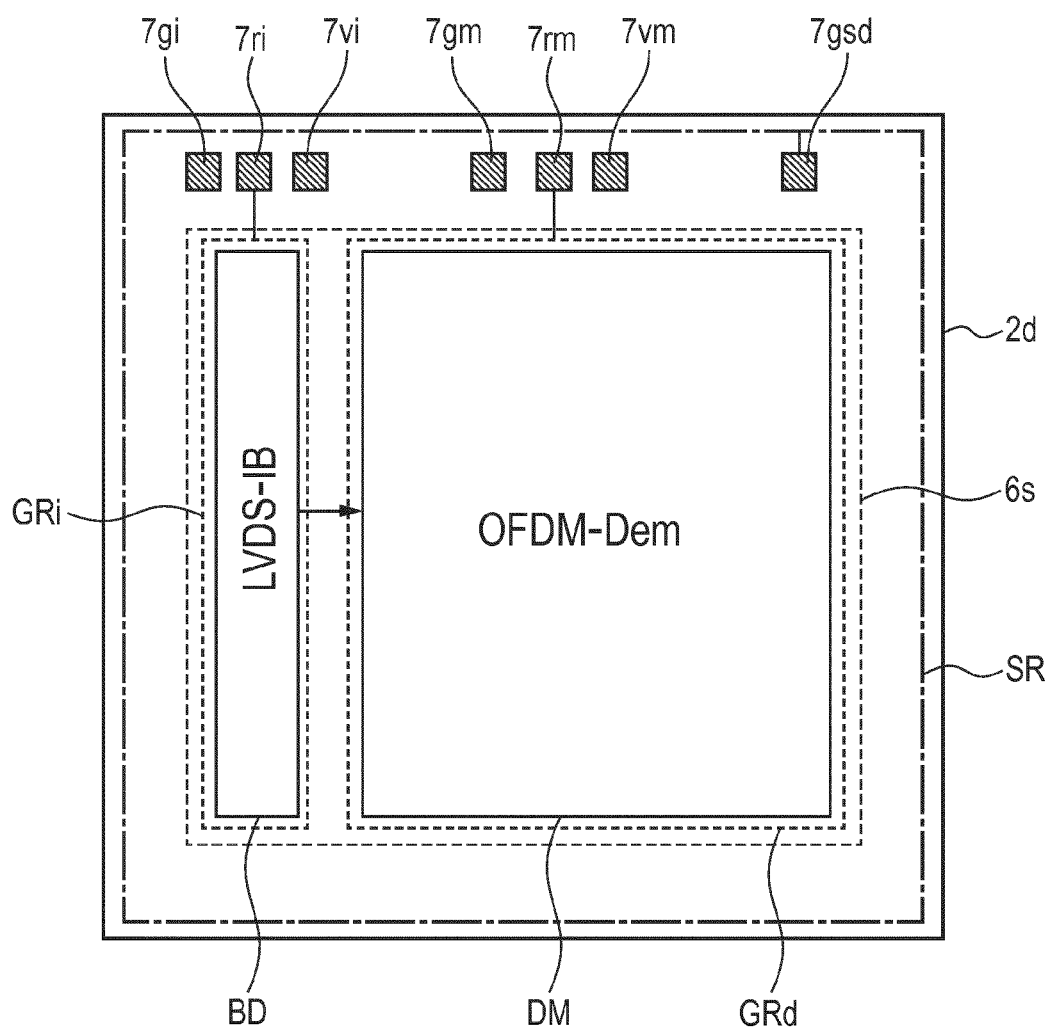
FIG. 6 is a typical top view of a digital chip 2d (Digital Chip) in FIGS. 1 and 2.
Figure 7:
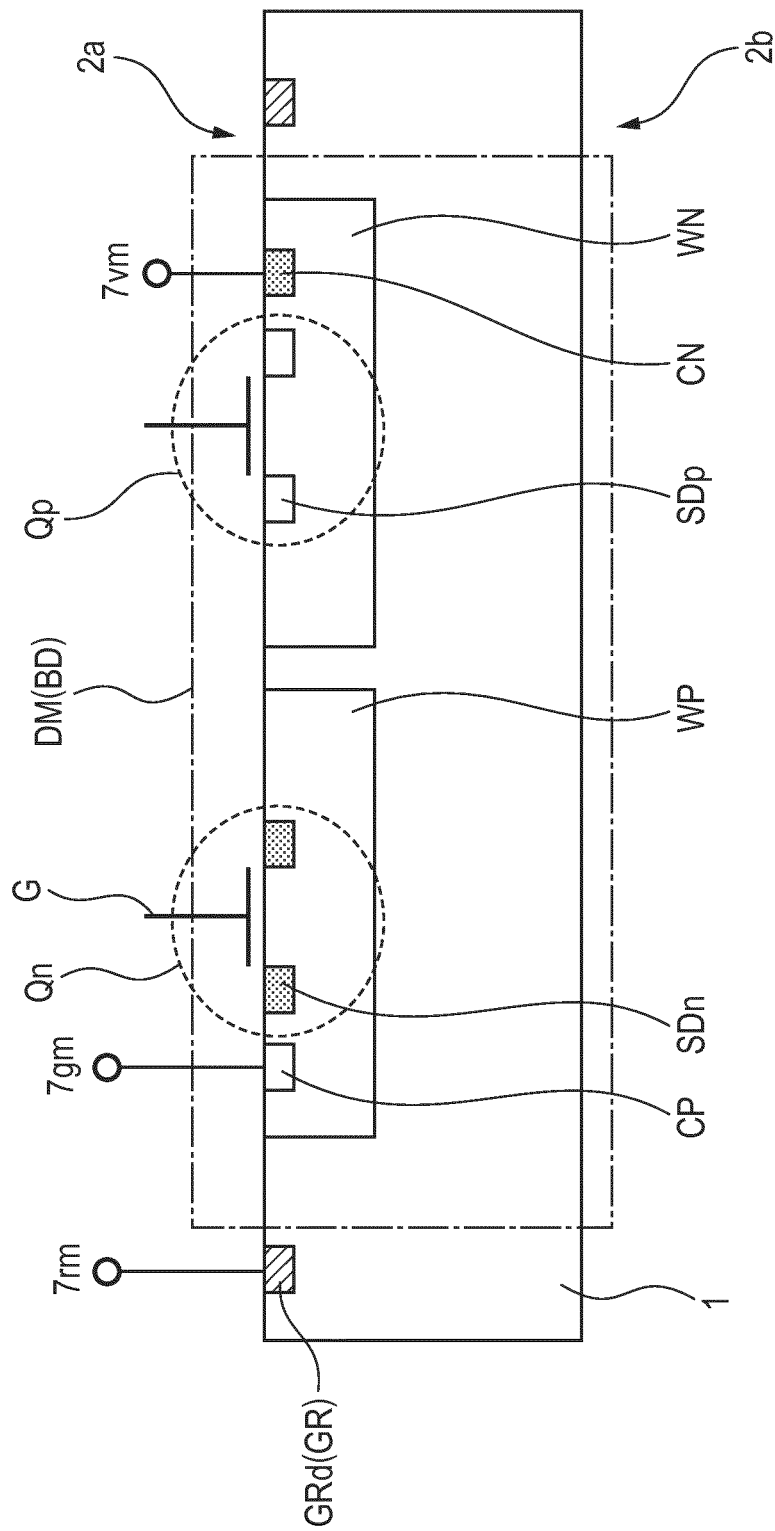
FIG. 7 is a typical sectional view for describing an OFDM demodulator circuit area DM of FIG. 6 and a relationship of potential between respective areas in the semiconductor substrate at its periphery.
Figure 8:
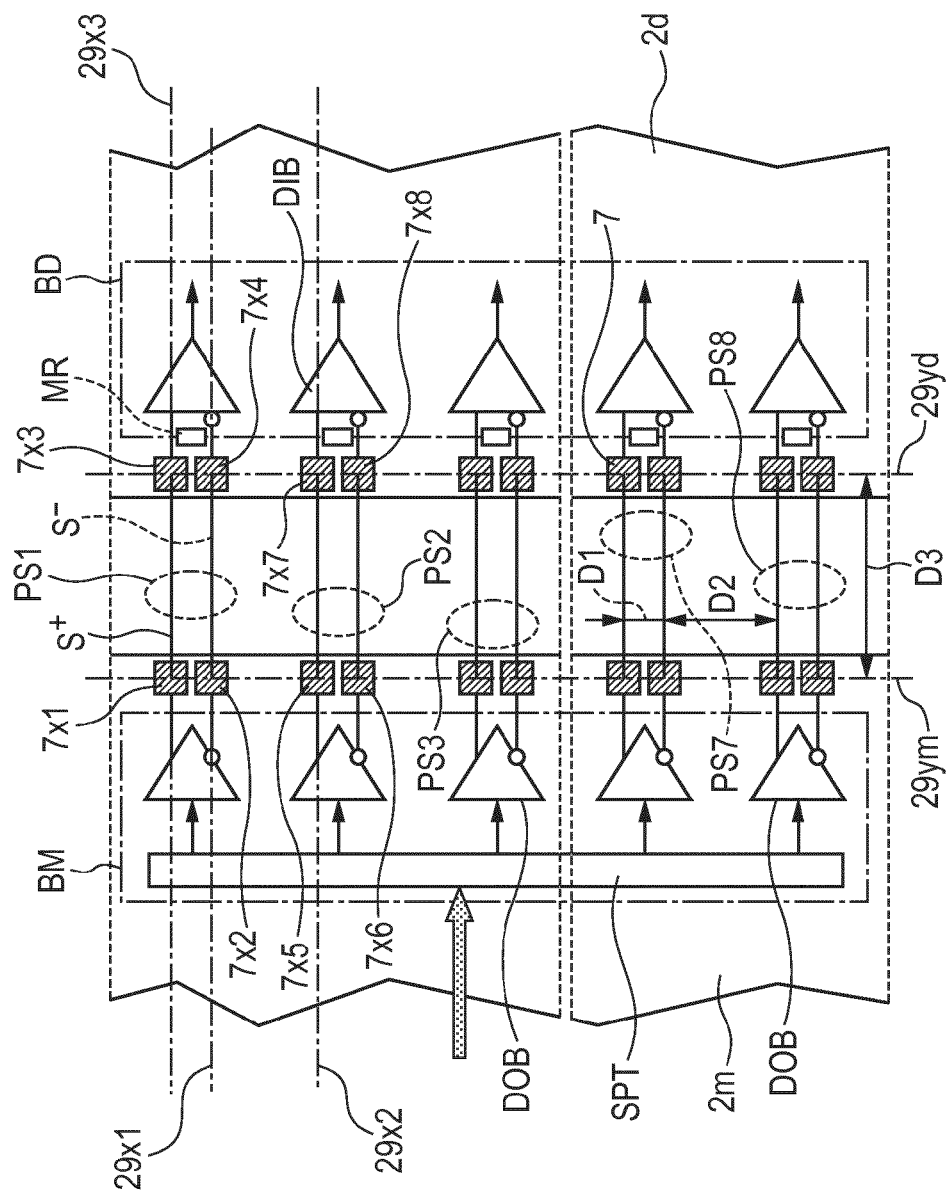
FIG. 8 is a typical circuit diagram of LVDS (Low Voltage Differential Signaling) between the mixed signal chip 2m and the digital chip 2d both shown in FIGS. 1 and 2.
Figure 9:
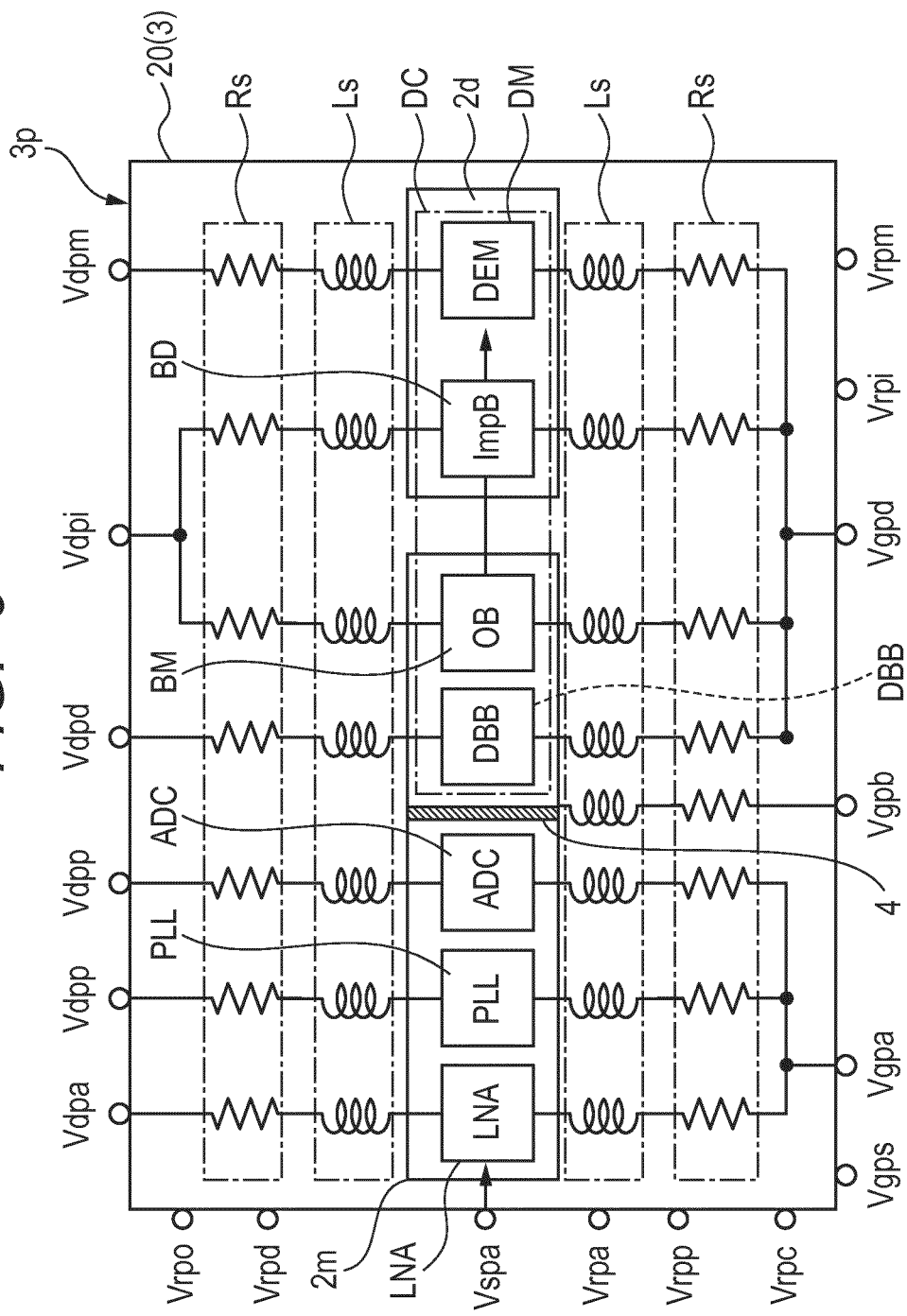
FIG. 9 is an overall typical equivalent circuit diagram for describing a global coupling structure in an RF module 20 in FIGS. 1 and 2.
Figure 10:
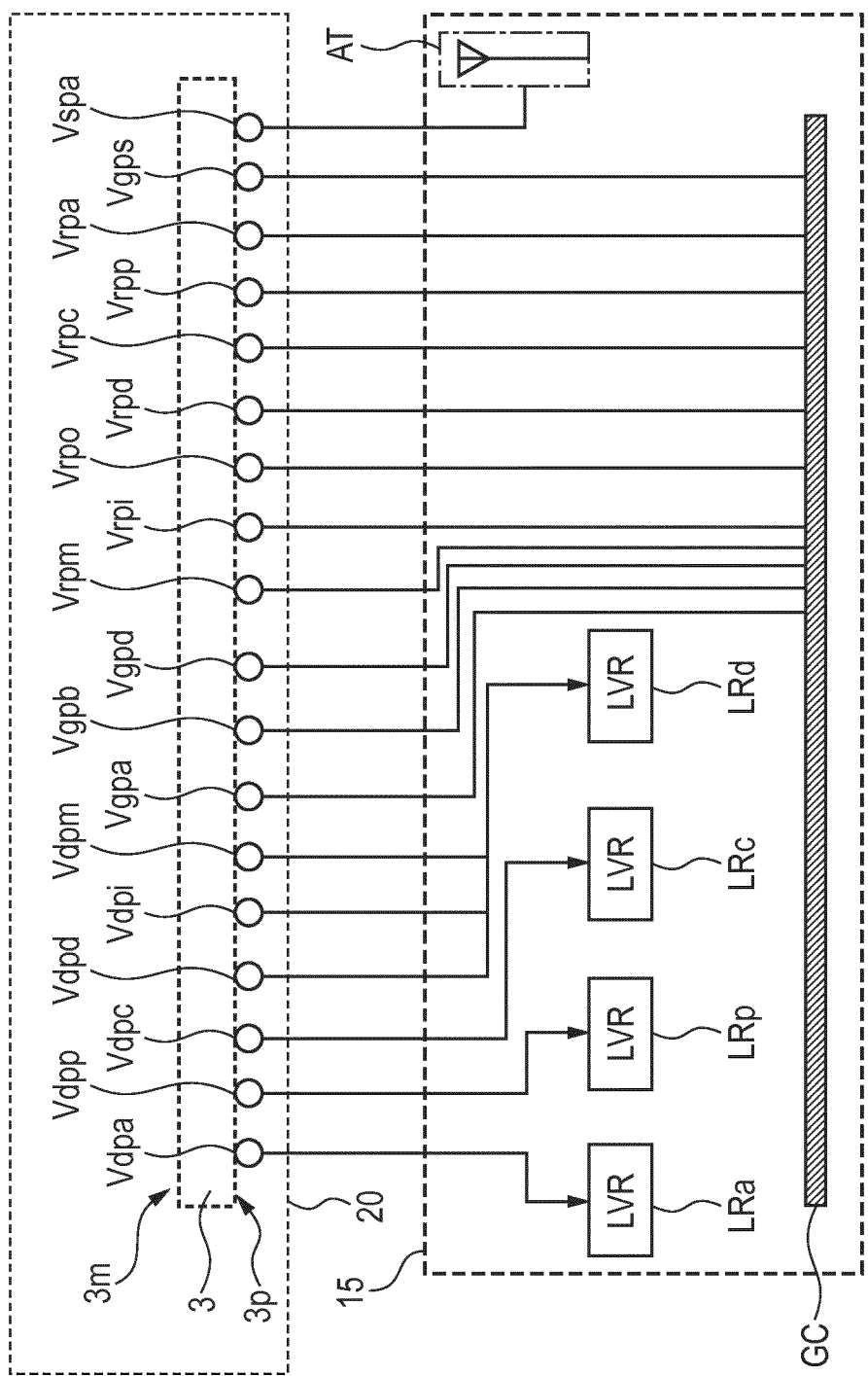
FIG. 10 is a typical section wiring diagram of the RF module 20 of FIG. 9 and a motherboard 15 for describing a relationship between the supply of power and grounding in a state of mounting of the RF module 20 and the motherboard 15.
Figure 11:
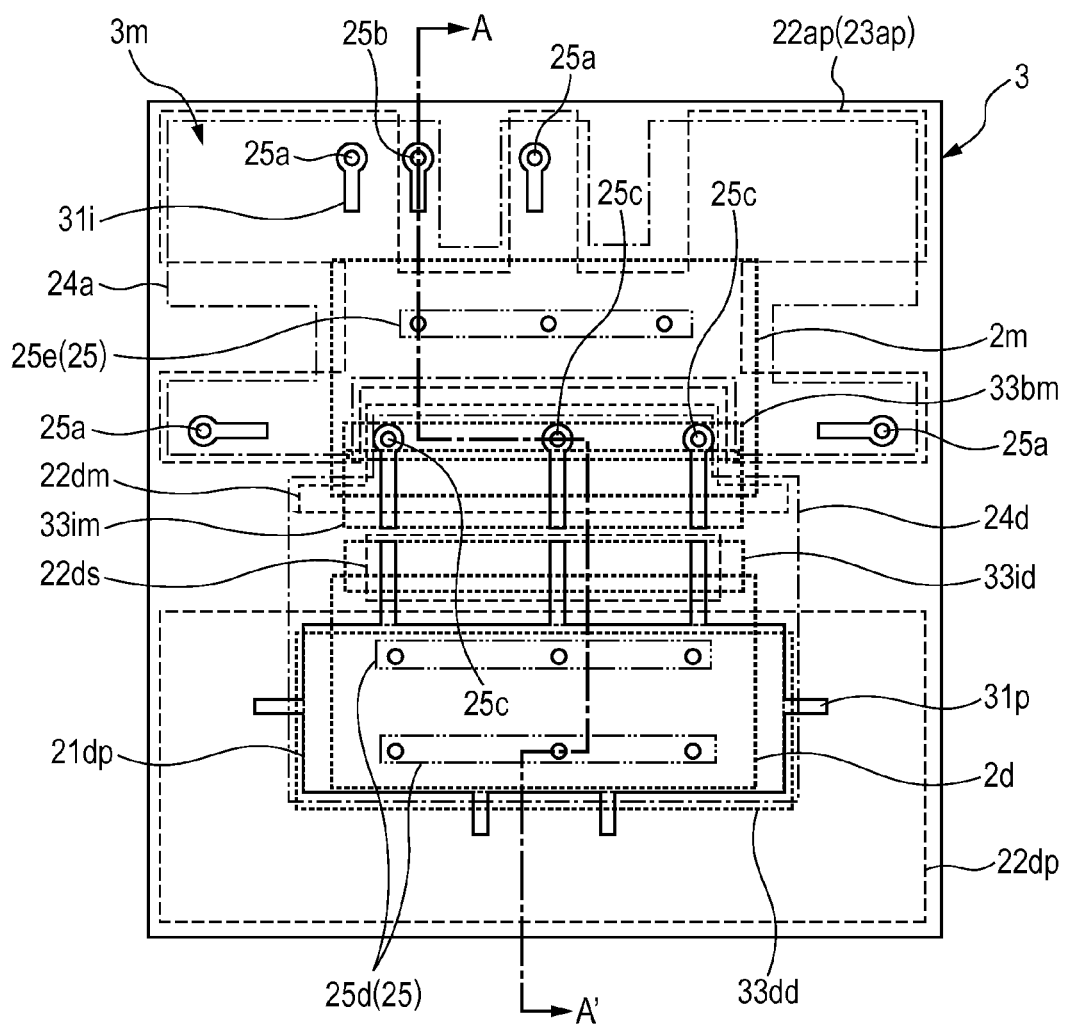
FIG. 11 is an overall top view for describing various planes, lands, through vias, wiring patterns and the like of respective layers in an interposer 3 in FIGS. 1 and 2.
Figure 12:
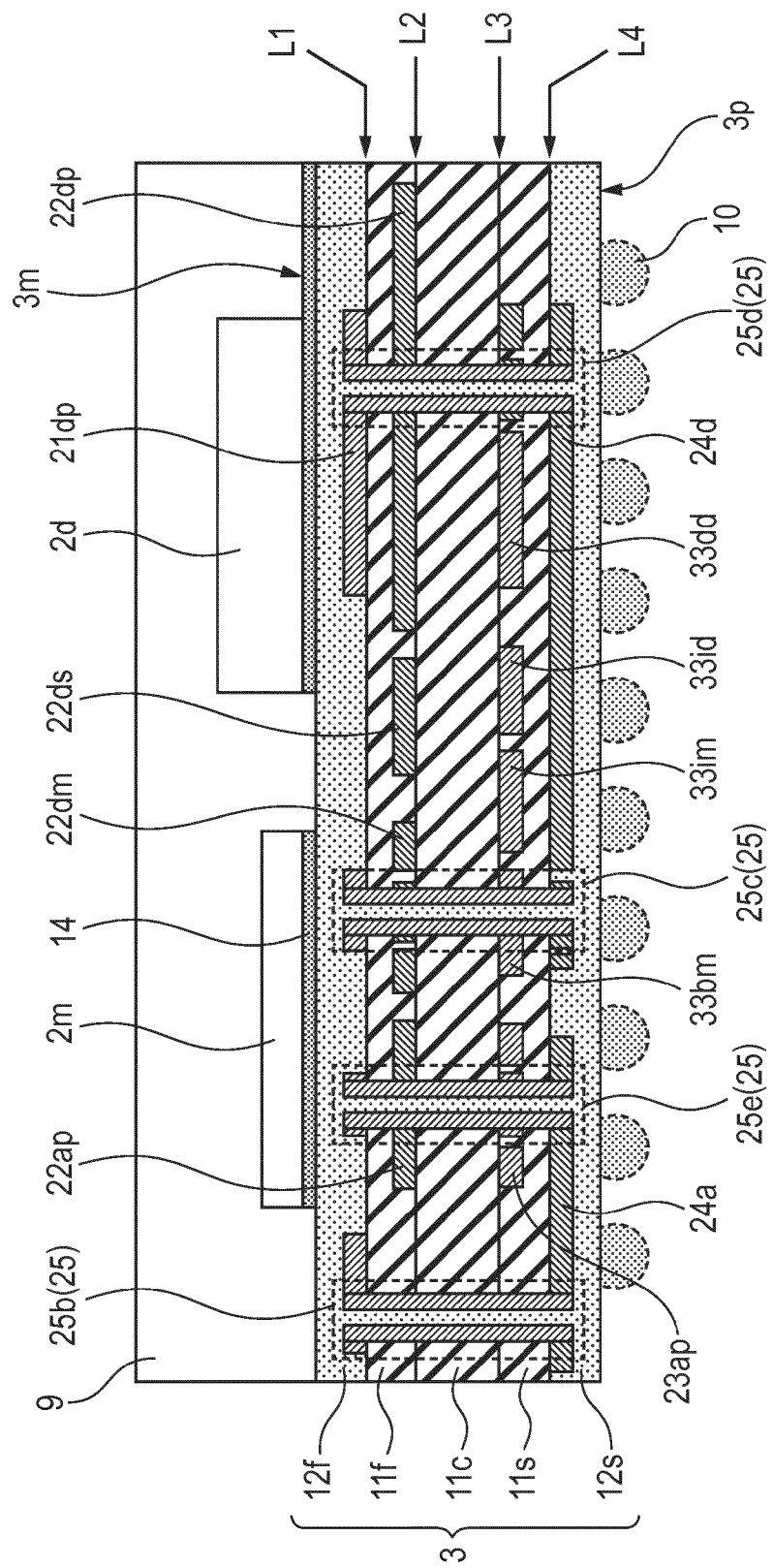
FIG. 12 is a typical sectional view of the RF module 20 corresponding to a section taken along line A-A' of FIG. 11.
Figure 13:
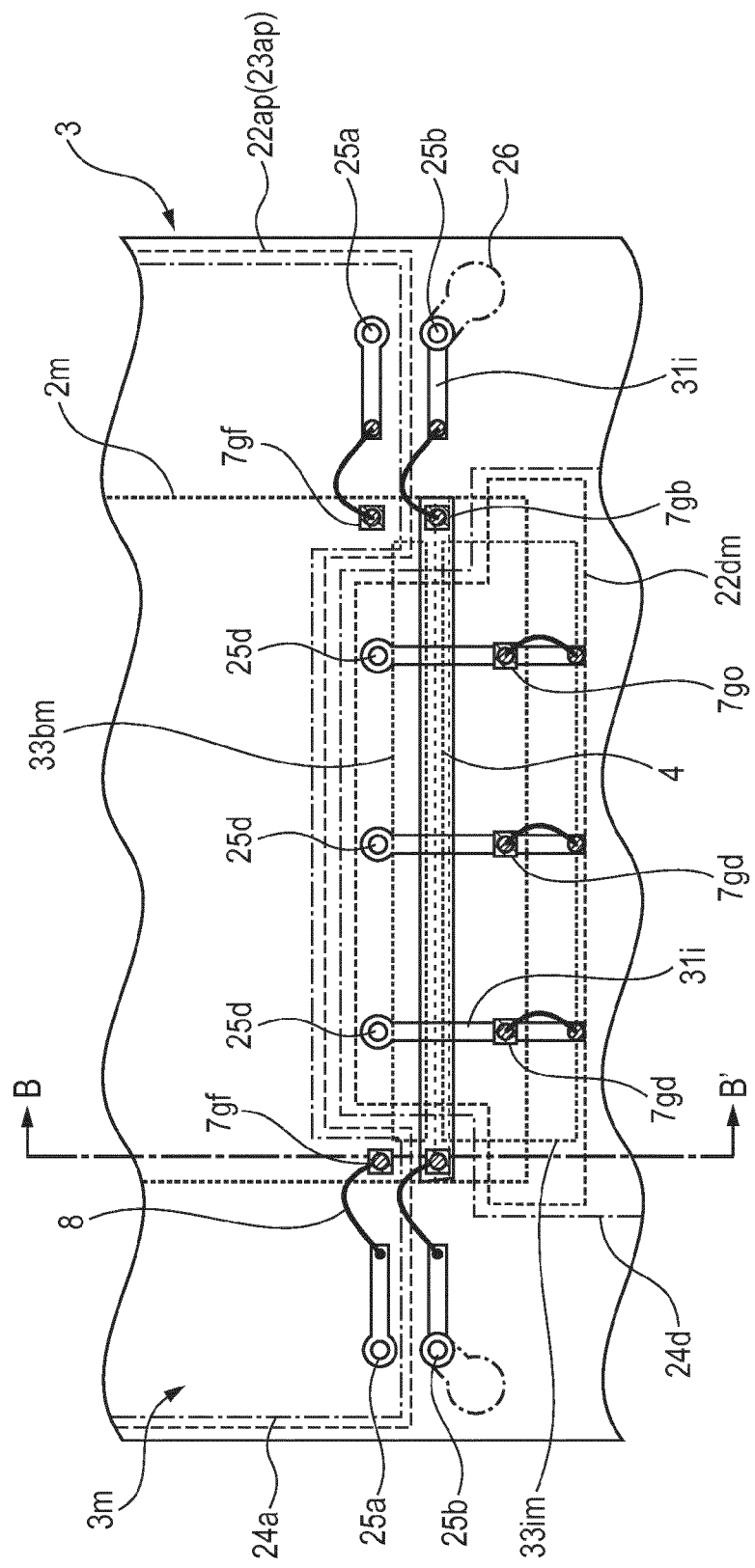
FIG. 13 is an enlarged top view of a neighborhood at the lower end of the mixed signal chip 2m in FIG. 11.
Figure 14:
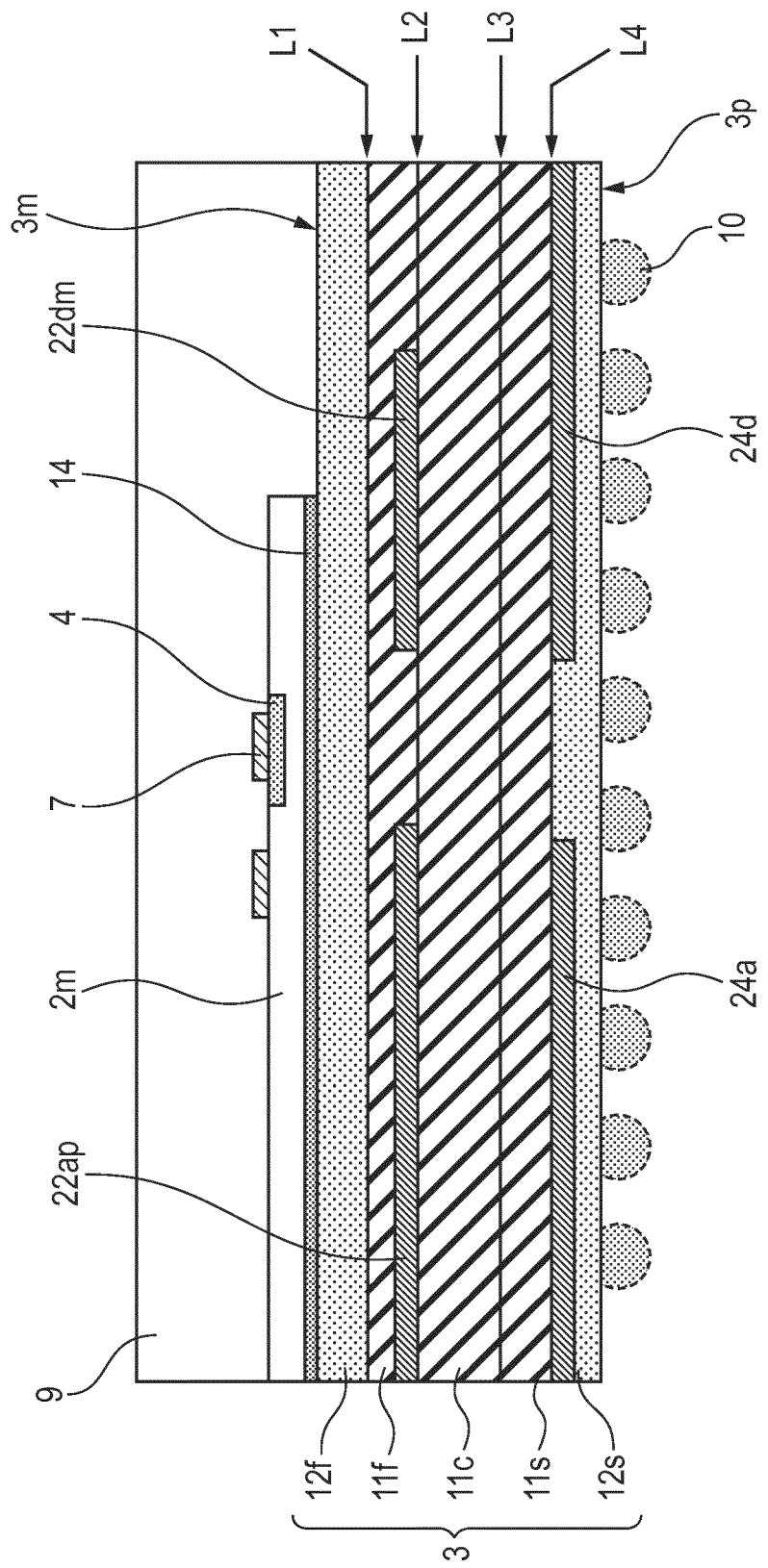
FIG. 14 is a typical sectional view of the RF module 20 corresponding to a section taken along line B-B' of FIG. 13.
Figure 15:
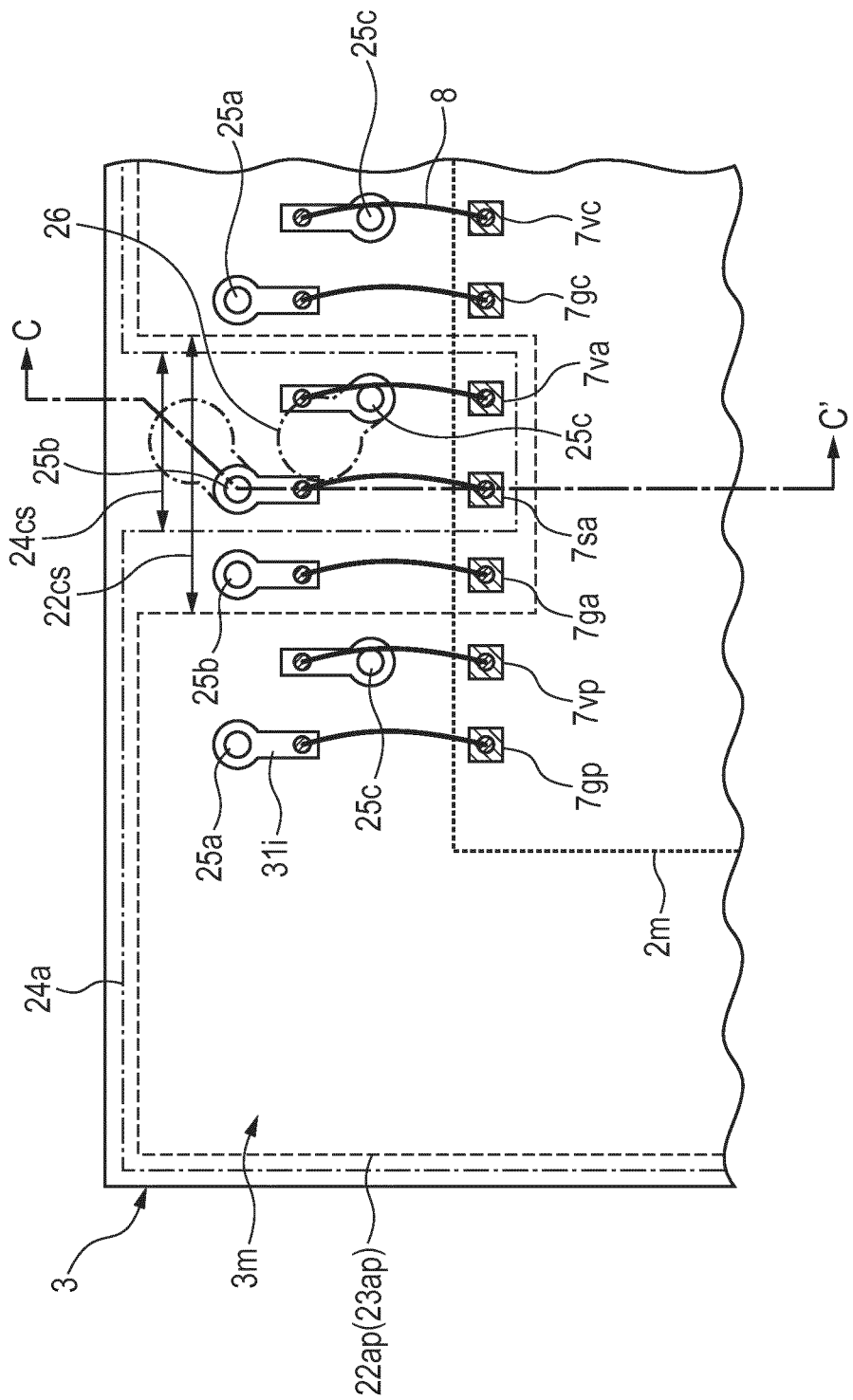
FIG. 15 is an enlarged top view of a neighborhood of a left corner section at the upper end of the mixed signal chip 2m in FIG. 11.
Figure 16:
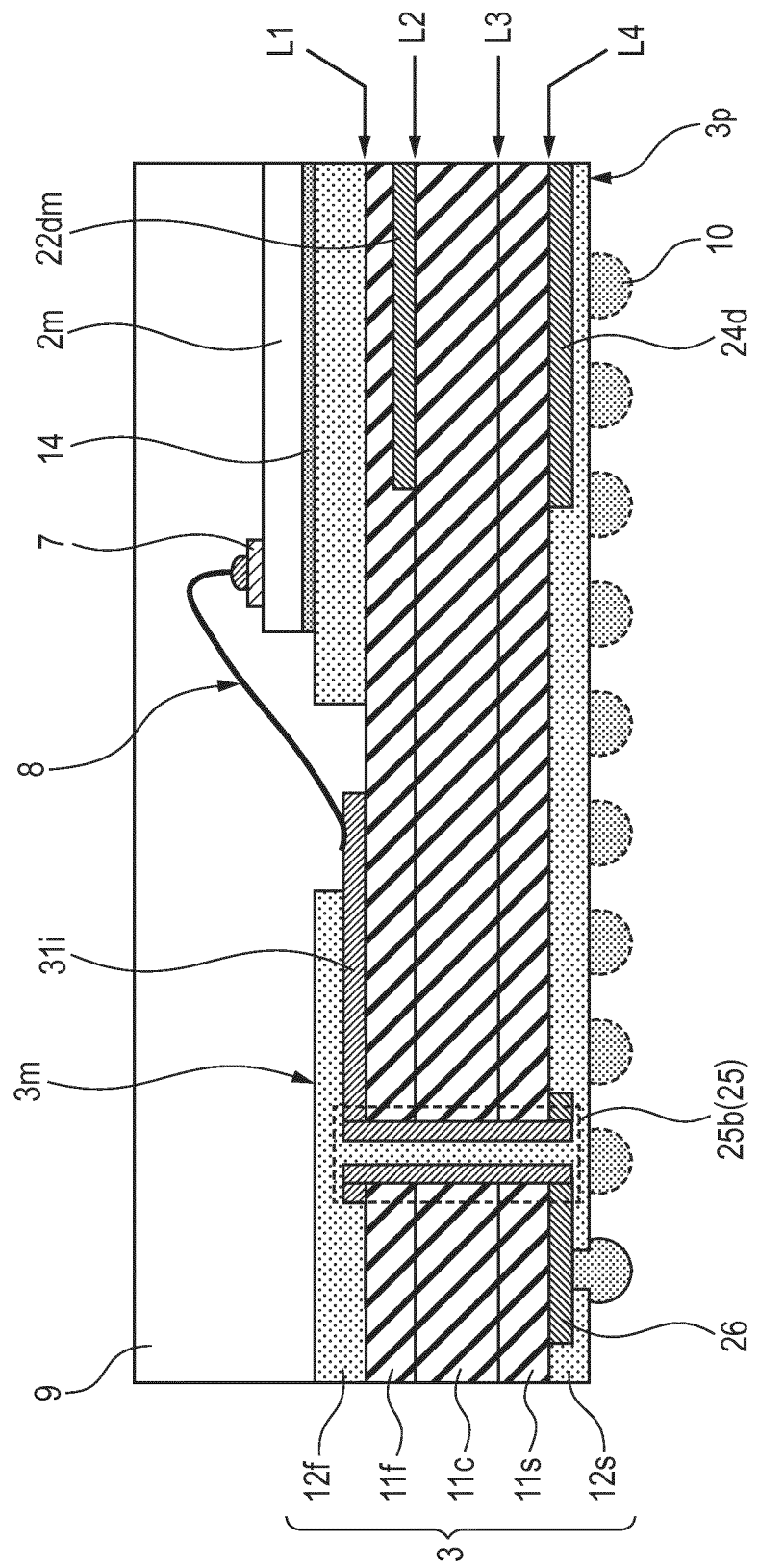
FIG. 16 is a typical sectional view of the RF module 20 corresponding to a section taken along line C-C' of FIG. 15.
Figure 17:
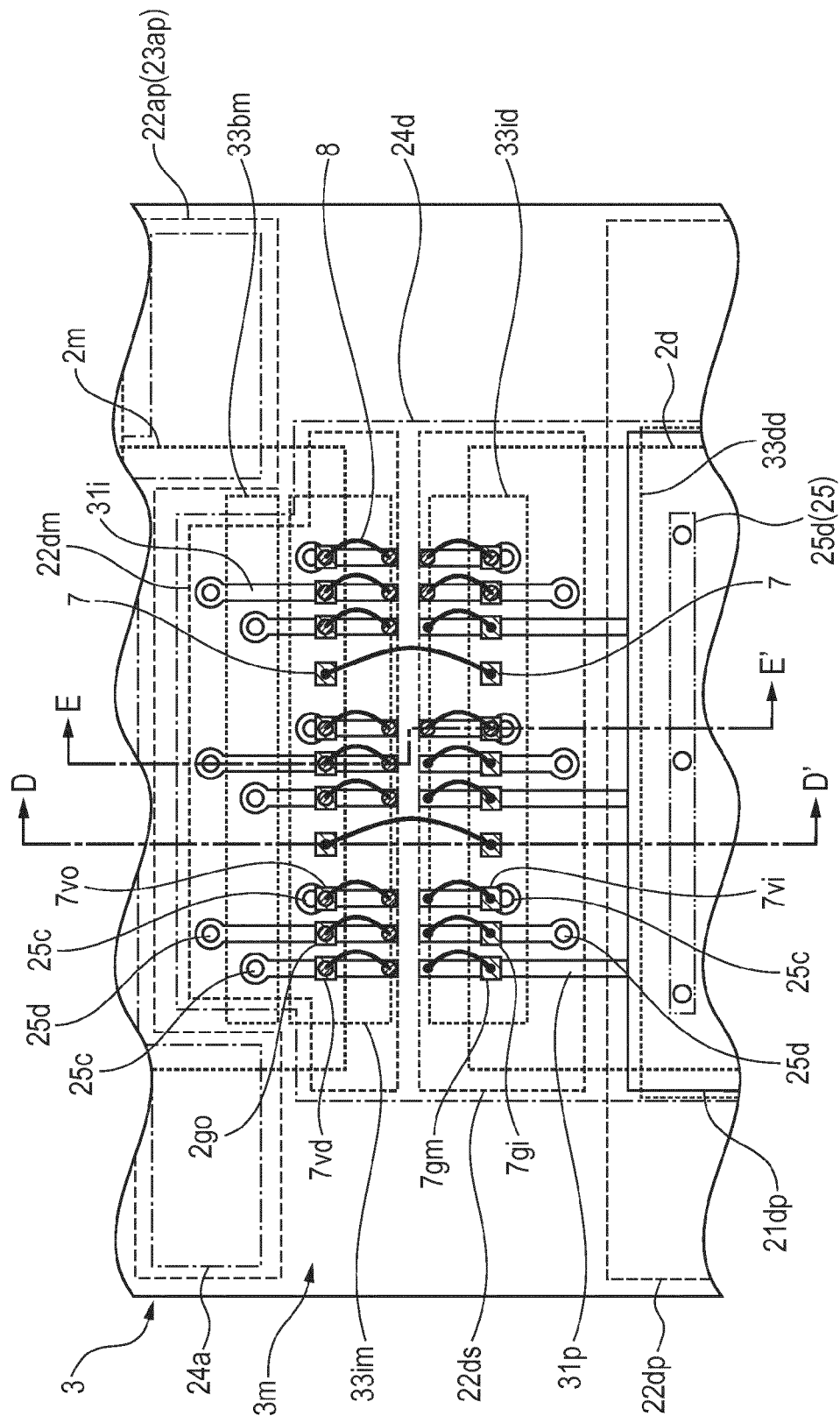
FIG. 17 is an enlarged top view of an area between the mixed signal chip 2m and the digital chip 2d in FIG. 11 and its neighborhood.
Figure 18:
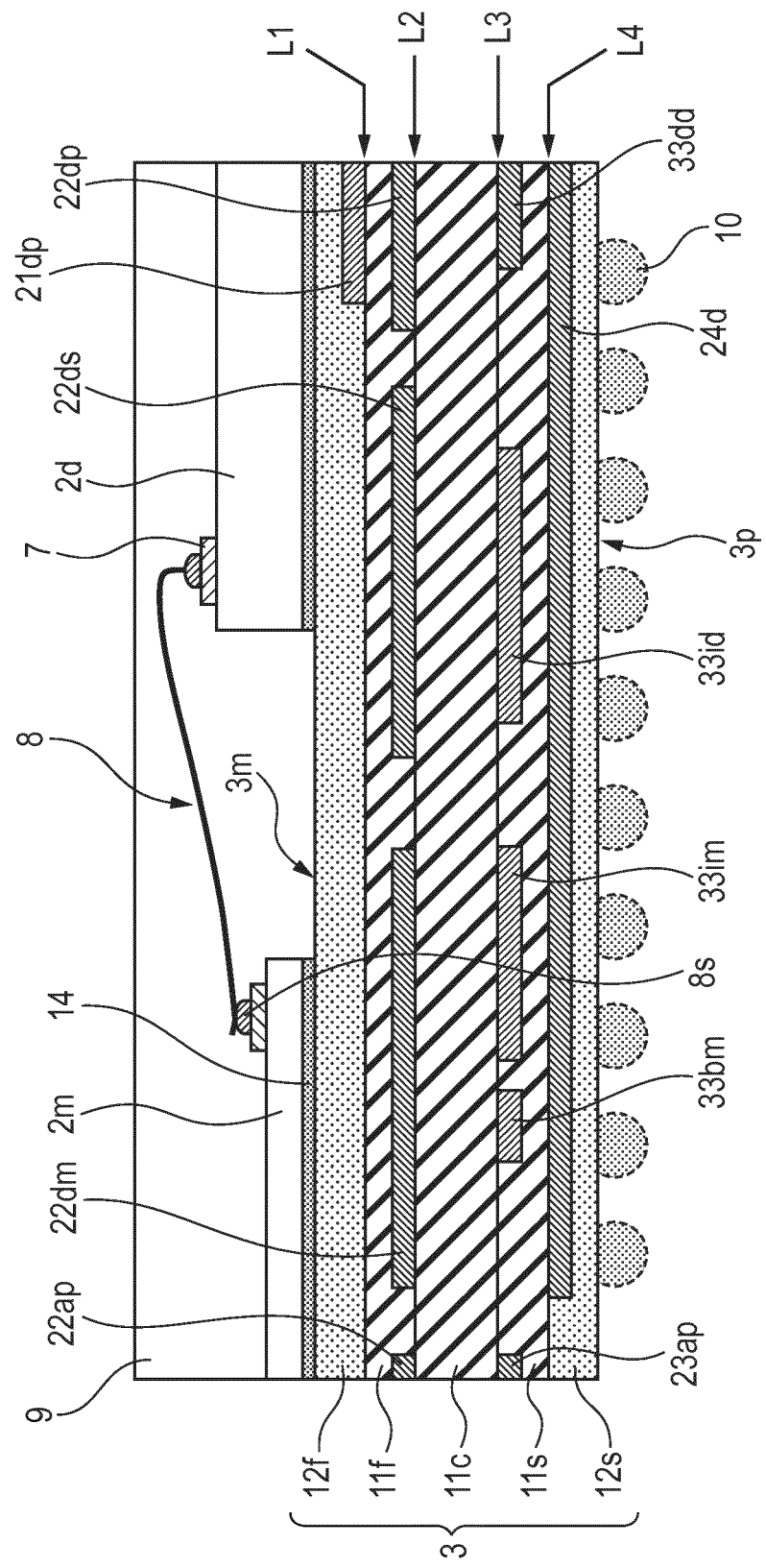
FIG. 18 is a typical sectional view of the RF module 20 corresponding to a section taken along line D-D' of FIG. 17.
Figure 19:
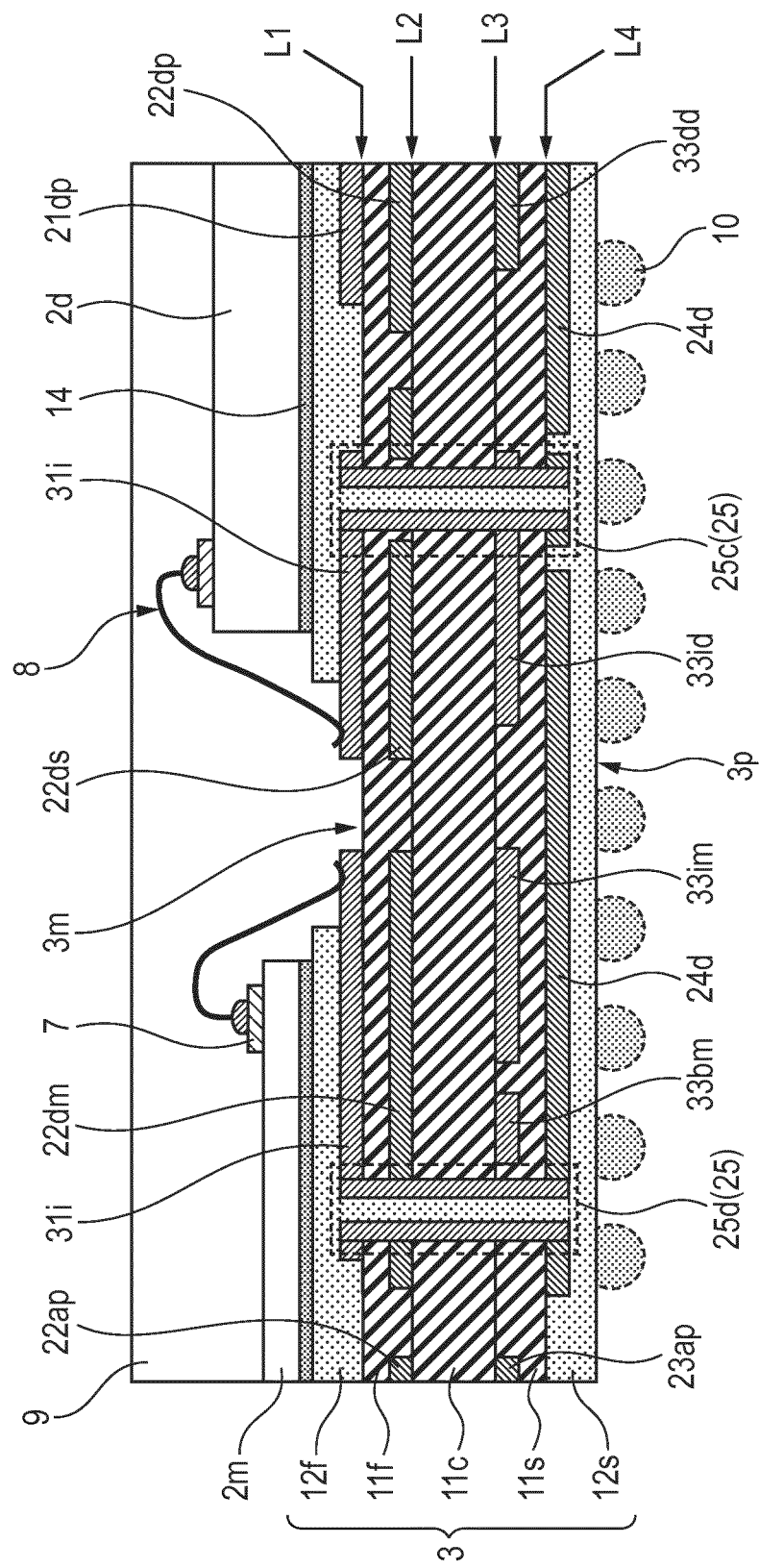
FIG. 19 is a typical sectional view of the RF module 20 corresponding to a section taken along line E-E' of FIG. 17.

FIG. 1 is a typical top view (from which a sealing resin has been eliminated to provide its viewability) of a BGA (Ball Grid Array) for describing a device structure or the like in a semiconductor integrated circuit device according to one embodiment of the present application. FIG. 2 is a typical sectional view of a section taken along line Y-Y' of FIG. 1. FIG. 3 is a typical top view of a mixed signal chip 2m (Mixed Signal Chip) in FIGS. 1 and 2. FIG. 4 is a typical sectional view for describing a low-noise amplifier circuit area LNA of FIG. 3 and a relationship of potential between respective areas in a semiconductor substrate at its periphery. FIG. 5 is a chip local plan view showing one example of a spiral inductor SL of FIG. 3. FIG. 6 is a typical top view of a digital chip 2d (Digital Chip) in FIGS. 1 and 2. FIG. 7 is a typical sectional view for describing an OFDM demodulator circuit area DM of FIG. 6 and a relationship of potential between respective areas in the semiconductor substrate at its periphery. FIG. 8 is a typical circuit diagram of LVDS (Low Voltage Differential Signaling) between the mixed signal chip 2m and the digital chip 2d both shown in FIGS. 1 and 2. FIG. 9 is an overall typical equivalent circuit diagram for describing a global coupling structure in an RF module 20 in FIGS. 1 and 2. FIG. 10 is a typical section wiring diagram of the RF module 20 of FIG. 9 and a motherboard 15 for describing a relationship between the supply of power and grounding in a state of mounting of the RF module 20 and the motherboard 15. FIG. 11 is an overall top view for describing various planes, lands, through vias, wiring patterns and the like of respective layers in an interposer 3 in FIGS. 1 and 2. FIG. 12 is a typical sectional view of the RF module 20 corresponding to a section taken along line A-A' of FIG. 11. FIG. 13 is an enlarged top view of a neighborhood at the lower end of the mixed signal chip 2m in FIG. 11. FIG. 14 is a typical sectional view of the RF module 20 corresponding to a section taken along line B-B' of FIG. 13. FIG. 15 is an enlarged top view of a neighborhood of a left corner section at the upper end of the mixed signal chip 2m in FIG. 11. FIG. 16 is a typical sectional view of the RF module 20 corresponding to a section taken along line C-C' of FIG. 15. FIG. 17 is an enlarged top view of an area between the mixed signal chip 2m and the digital chip 2d in FIG. 11 and its neighborhood. FIG. 18 is a typical sectional view of the RF module 20 corresponding to a section taken along line D-D' of FIG. 17. FIG. 19 is a typical sectional view of the RF module 20 corresponding to a section taken along line E-E' of FIG. 17. The device structure or the like in the semiconductor integrated circuit device according to the one embodiment of the present application will be described based on these.

(1) Description of basic device structure (refer principally to FIGS. 1 and 2): As shown in FIGS. 1 and 2, the RF module 20 (semiconductor integrated circuit device) has an interposer 3 (organic multilayer wiring board) as a principal component. A number of bump electrodes 10 (e.g., lead-free solder bump electrodes or the like) are provided at an outer coupling land arrangement surface 3p of the interposer 3.

On the other hand, the mixed signal chip 2m (first semiconductor chip) and the digital semiconductor chip 2d (demodulation chip, second semiconductor chip) and the like are die-bonded to a chip mounting surface 3m of the interposer 3 through a die bonding past layer 14 (adhesive layer) such as a silver paste layer or the like. The thickness of the interposer 3 is about 310 μm, for example. The thickness of the mixed signal chip 2m is about 200 μm, for example. The thickness of the digital semiconductor chip 2d is about 300 μm, for example.

An analog circuit area 5 and a first digital path area 6f are provided on the surface 2a (device formation surface) side of the mixed signal chip 2m. On the other hand, a second digital circuit area 6s is provided on the surface 2a (device formation surface) side of the digital semiconductor chip 2d. Incidentally, the mixed signal chip 2m belongs to, for example, a 90 nm technology node, and the digital semiconductor chip 2d belongs to a 55 nm technology node. Here, the mixed signal chip 2m and the digital semiconductor chip 2d are not required to belong to such technology nodes respectively, and may belong to the same technology node. Also they may belong to a technology node finer than the 55 nm technology node or a technology node larger than the 90 nm technology node.

As to the configuration of wiring layers for the mixed signal chip 2m and the digital semiconductor chip 2d in this example, six layers are provided for copper-embedded wiring layers, and one layer is provided for an aluminum-based pad layer. A wiring layer structure of each chip is arbitrary and not required to be the same structure. A circuit configuration for the mixed signal chip 2m and the digital semiconductor chip 2d is taken basically centering on a CMOS (CMIS) circuit. A substrate structure for the mixed signal chip 2m and the digital semiconductor chip 2d takes a non-epitaxial substrate type bulk CMOS structure, but may be other structures. The non-epitaxial substrate type bulk CMOS structure is however basically most advantageous in cost. Further, in this example, the mixed signal chip 2m adopts a triple well structure, whereas the digital semiconductor chip 2d does not adopt it. This is because the mixed signal chip 2m presents a problem about digital noise, but the digital semiconductor chip 2d does not cause its problem. It is needless to say that a non-triple well structure easy to raise the degree of integration thereof is advantageous in the digital semiconductor chip 2d, but needless to say, the triple well structure may be adopted therefor. The non-triple well structure can be adopted even for the mixed signal chip 2m when not necessary.

A plurality of bonding pads 7 (e.g., aluminum-based bonding pads) are provided over the surface 2a of the mixed signal chip 2m. Some of them are interconnected (off-chip interconnected) to leads (first layer independent wirings 3li) lying over the surface 3m of the interposer 3 through bonding wires 8a (e.g., metal wires). Incidentally, although other bonding pads actually exist in a section to which the sides of the two chips are adjacent (refer to FIG. 13 or 17), only a bonding pad group being a specific group that couples the two chips to each other is shown herein.

Likewise, a plurality of bonding pads 7 (e.g., aluminum-based bonding pads) are provided over the surface 2a of the digital semiconductor chip 2d. Some of them are interconnected to leads or wirings lying over the surface 3m of the interposer 3 via bonding wires 8b (e.g., metal wires).

Some other bonding pads 7 lying over the surface 2a of the mixed signal chip 2m and some other bonding pads 7 lying over the surface 2a of the digital semiconductor chip 2d are directly interconnected (inter-chip interconnected) to each other via bonding wires 8c (e.g., metal wires whose diameters are the same as before, for example).

Further, a sealing resin body 9 is formed over the chip mounting surface 3m of the interposer 3 so as to seal the mixed signal chip 2m, the digital semiconductor chip 2d, the bonding wires 8 (8a, 8b and 8c), etc.

In both of the off-chip interconnecting and the inter-chip interconnecting, for example, capillary ball wedge bonding can be illustrated as one suitable therefor. In this example, e.g., gold stud bumps, i.e., underlying bumps 8s are formed in advance over their corresponding bonding pads 7 on the mixed signal chip 2m side corresponding to the second bonding side and are given wedge bonding thereabove. Although it is not essential, it is effective in reducing bonding damage if the underlying bumps 8s are formed. In addition to this, connectivity is also improved. On the other hand, in this example, ball bonding based on bonding balls 8q is provided over the bonding pads 7 on the digital semiconductor chip 2d side corresponding to the first bonding side. Doing so is not essential but is effective in avoiding contact or the like between the wires and the chip. This is because in this example, when the thickness (semiconductor substrate thickness Td) of the digital semiconductor chip 2d and the semiconductor substrate thickness Tm of the mixed signal chip 2m are compared with each other, the semiconductor substrate thickness Tm of the mixed signal chip 2m becomes thinner than that of the digital semiconductor chip 2d. Incidentally, in this example, the thickness Td of the digital semiconductor chip 2d is about 300 μm, for example (its range is from about 100 μm to about 400 μm). The thickness Tm of the mixed signal chip 2m is about 200 μm, for example (its range is from about 50 μm to 350 μm). The reason why such a lower limit is taken is that when an application-based adhesive (silver paste or the like) is used in die bonding, the silver paste or the like is in danger of sneaking to the chip top when the thickness Td of the digital semiconductor chip 2d becomes extremely thin. This is also because problems such as a shortage of strength of its chip itself, etc. arise. On the other hand, the reason why such an upper limit is taken is that when one of the two chips becomes extremely thick, it will oppose a demand for the thinning of a package. Incidentally, if such problems do not arise, both chips may be made approximately identical in thickness to each other.

Here, the mixed signal chip 2m and the digital semiconductor chip 2d are both an integrated circuit chip formed over a P-type single crystal semiconductor silicon substrate and have a non-epitaxial substrate type bulk CMOS structure (called "bulk CMOS structure") as an in-substrate structure thereof.

Thus, the thickness Tm of the mixed signal chip 2m is made thinner than the thickness Td of the digital semiconductor chip 2d to make noise (including power fluctuation, variations in reference voltage potential, etc.) from the first digital circuit area 6f hard to reach the analog circuit area 5 (especially, the low-noise amplifier circuit area LNA of FIG. 3) through a substrate area (this is called "avoidance of digital noise"). The difference in thickness between the chips, i.e., the thickness Td of the digital semiconductor chip—the thickness Tm of the mixed signal chip most preferably ranges from about 50 μm to about 250 μm. Making the difference in thickness between both chips in this manner is effective in preventing wires from being short-circuited to the mixed signal chip 2m due to their sags in addition to countermeasures against noise.

(2) Structure Description of Mixed Signal Semiconductor Chip (Refer Principally to FIGS. 3 to 5):

In this subsection, the details of the mixed signal chip 2m described in the subsection (1) will be described. As shown in FIG. 3, a seal ring SR is provided along the outer peripheral portion of the surface 2a (device formation surface) of the semiconductor chip for the mixed signal chip 2m. An analog circuit area 5 and a first digital circuit area 6f are provided thereinside. A guard band 4 for preventing noise therebetween from propagating is provided between the two.

The analog circuit area 5 is provided with a low-noise amplifier circuit area LNA, a mixer circuit area MIX, a PLL (Phase Locked Loop) circuit area PLL having a voltage controlled oscillator circuit area VCO, an analog baseband processing circuit area ABB, an analog-digital converter circuit area ADC, etc. These are called analog-system element circuits.

On the other hand, the first digital circuit area 6f is provided with a digital baseband processing circuit area DBB, an output buffer circuit area BM, etc.

Here, the low-noise amplifier circuit area LNA amplifies an RF analog signal outputted from an LNA signal pad 7sa. The mixer circuit area MIX converts the RF analog signal amplified by the low-noise amplifier circuit area LNA to an analog baseband signal. In this example, an input frequency band takes a very wideband ranging over the whole of VHF and UHF bands, for example.

For example, a direct conversion system can be illustrated as one suitable for the mixer circuit area MIX. Incidentally, although a bandpass filter is incorporated in an RF receiving circuit, for example, a tracking filter or the like incorporated in the low-noise amplifier circuit area LNA or the mixer circuit area MIX and operated as a unit in the wideband receiver such as shown in this example can be illustrated as a suitable one.

The voltage controlled oscillator circuit area VCO is a local oscillation circuit for controlling an oscillation frequency by a voltage, which is operated with being incorporated in the PLL circuit area PLL and supplies a local oscillation signal to the mixer circuit area MIX.

The analog baseband processing circuit area ABB is comprised of, for example, a low pass filter which selects and passes only an analog baseband signal out of signals output from the mixer circuit area MIX, an AGC (Automatic Gain Control) circuit for automatically controlling gain, etc.

The analog-digital converter circuit area ADC converts the analog baseband signal to a digital baseband signal.

The digital baseband processing circuit area DBB has, for example, a function of a digital filter for selecting only a desired digital baseband signal out of the converted digital baseband signal, and the like. The operating frequency of the digital baseband processing circuit area DBB is about 264 MHz, for example.

The output buffer circuit area BM is, for example, one for serial-parallel converting the digital baseband signal and sending out it by a differential transmission system such as an LVDS (Low Voltage Differential Signaling) system or the like. The operating frequency of the output buffer circuit area BM is about 264 MHz, for example.

The seal ring SR is normally in contact with P+ type ring-shaped impurity doped regions each of which is formed in a semiconductor substrate surface lying therebelow and substantially identical in shape to itself on a plane basis. The seal ring SR is coupled to a mixed signal chip seal ring-ground pad 7gsm inclusive of these regions.

The periphery of each of element circuit areas that configure the analog circuit area 5 is surrounded by a specific peripheral guard ring as will be described below. That is, the periphery of the low-noise amplifier circuit area LNA is surrounded by a low-noise amplifier circuit area peripheral guard ring GRl, i.e., P+ type ring-shaped impurity doped region formed in the semiconductor substrate surface. The low-noise amplifier circuit area peripheral guard ring GRI is coupled to, for example, an LNA peripheral guard ring-ground pad 7ra.

Likewise, the periphery of the mixer circuit area MIX is surrounded by a mixer circuit area peripheral guard ring GRm. The mixer circuit area peripheral guard ring GRm is coupled to, for example, a mixer circuit peripheral guard ring-ground pad 7rl.

The periphery of the PLL circuit area PLL is surrounded by a PLL circuit area peripheral guard ring GRp. The PLL circuit area peripheral guard ring GRp is coupled to, for example, a PLL peripheral guard ring-ground pad 7rp.

Further, the periphery of the analog baseband processing circuit area ABB is surrounded by an analog baseband processing circuit area peripheral guard ring GRa. The analog baseband processing circuit area peripheral guard ring GRa is coupled to, for example, an analog baseband processing circuit peripheral guard ring-ground pad 7rf.

The periphery of the analog-digital converter circuit area ADC is surrounded by an analog-digital converter circuit area peripheral guard ring GRc. The analog-digital converter circuit area peripheral guard ring GRc is coupled to, for example, an ADC peripheral guard ring-ground pad 7rc.

The periphery of each of the element circuit areas that configure the first digital circuit area 6f is surrounded by a specific peripheral guard ring as will be described below. That is, the periphery of the digital baseband processing circuit area DBB is surrounded by a digital baseband circuit peripheral guard ring GRb. The digital baseband circuit peripheral guard ring GRb is coupled to, for example, a digital baseband processing circuit peripheral guard ring-ground pad 7rd.

Likewise, the periphery of the output buffer circuit area BM is surrounded by an output buffer circuit area peripheral guard ring GRo. The output buffer circuit area peripheral guard ring GRo is coupled to, for example, an output buffer circuit peripheral guard ring-ground pad 7ro.

There is illustrated herein the configuration in which a guard ring is provided for each element circuit and a dedicated reference voltage terminal is provided for each guard ring. When, however, the number of terminals is limited, for example, the LNA peripheral guard ring-ground pad 7ra can also be provided for exclusive use as a partly-common analog system element circuit peripheral guard ring-ground pad system in which peripheral guard ring-ground pads of other analog system element circuits are lumped together. At this time, for example, those for a digital system are also lumped together in like manner. The above system is slightly disadvantageous in terms of digital noise as compared with the previous individual ground pad system. Although a system of ground pads for an all-common analog system element circuit peripheral guard ring, which are lumped together inclusive of even an LNA peripheral guard ring-ground pad, is possible, it is further disadvantageous in terms of digital noise. Although a system of ground pads for an all-common element circuit peripheral guard ring, which are lumped together inclusive of even digital system element circuit peripheral guard ring-ground pads, is possible, it is further disadvantageous in terms of digital noise. Further, although a self ground pad system that makes individual guard ring ground pads common to ground pads of their own element circuits, appropriate element circuits, and commonality to ground pads of a sealing ring SR are possible, they are considered to have a lot of disadvantages in terms of digital noise. Although such combinations are considered below in various ways, they can be selected as needed and will therefore not be referred to repeatedly in detail. Incidentally, the above is similar even to the digital chip, and a repetitive description thereof will be omitted.

Here, in this example, the seal ring SR and the respective peripheral guard rings are not interconnected to each other inside the mixed signal chip 2m (however, except for conduction made through a relatively high-resistance portion of the semiconductor substrate). This is done to prevent noise from the first digital circuit area 6f from reaching each peripheral guard ring through the seal ring SR or the like and propagating to each element circuit area (analog element circuit area) therefrom. When, however, the number of bonding pads (terminals) is limited, it is also possible to make a coupling to any digital element circuit-ground pad, for example (it is otherwise the same as the above). There is, however, correspondingly, a fear that the propagation of noise will increase.

Further, the following bonding pads are provided at the surface 2a of the semiconductor chip for the mixed signal chip 2m. That is, an LNA ground pad 7ga (low-noise amplifier area-reference voltage terminal) is a bonding pad for supplying a reference potential to the low-noise amplifier area LNA.

A guard band-ground pad 7gb is a bonding pad for supplying a reference potential to the guard band 4. Incidentally, in this example, the guard band-ground pad 7gb and the seal ring SR are not interconnected to each other inside the mixed signal chip 2m (where conduction made through a relatively high-resistance portion of the semiconductor substrate is eliminated). Likewise, the guard band-ground pad 7gb and each peripheral guard ring are not interconnected to each other inside the mixed signal chip 2m (where conduction made through a relatively high-resistance portion of the semiconductor substrate is eliminated). This is done to prevent noise from the first digital circuit area 6f from reaching each peripheral guard ring through the guard band 4 and the seal ring SR or the like and propagating to each element circuit area (analog element circuit area) therefrom. When, however, the number of bonding pads (terminals) is limited, it is also possible to couple to any digital element circuit-ground pad, for example. There is, however, a fear that the propagation of noise will increase correspondingly.

An ADC ground pad 7gc (reference voltage terminal for analog element circuit area) is a bonding pad for supplying a reference potential to the analog-digital converter circuit area ADC.

A digital baseband processing circuit-ground pad 7gd is a bonding pad for supplying a reference potential to the digital baseband processing circuit area DBB.

An analog baseband processing circuit-ground pad 7gf (reference voltage terminal for analog element circuit area) is a bonding pad for supplying a reference potential to the analog baseband processing circuit area ABB.

A mixer circuit-ground pad 7gl (analog element circuit area-reference voltage terminal) is a bonding pad for supplying a reference potential to the mixer circuit area MIX.

An output buffer circuit-ground pad 7go is a bonding pad for supplying a reference potential to the output buffer circuit area BM.

A PLL ground pad 7gp (reference voltage terminal for analog element circuit area) is a bonding pad for supplying a reference potential to the PLL circuit area PLL.

An LNA power pad 7va is a bonding pad for supplying a power supply voltage (1.2 volts, for example) to the low-noise amplifier circuit area LNA.

An ADC power pad 7vc is a bonding pad for supplying a power supply voltage (1.2 volts, for example) to the analog-digital converter circuit area ADC.

A digital baseband processing circuit-power pad 7vd is a bonding pad for supplying a power supply voltage (1.2 volts, for example) to the digital baseband processing circuit area DBB.

An analog baseband processing circuit-power pad 7vf is a bonding pad for supplying a power supply voltage (1.2 volts, for example) to the analog baseband processing circuit area ABB.

A mixer circuit-power pad 7vl is a bonding pad for supplying a power supply voltage (1.2 volts, for example) to the mixer circuit area MIX.

An output buffer circuit-power pad 7vo is a bonding pad for supplying a power supply voltage (1.2 volts, for example) to the output buffer circuit area BM.

A PLL power pad 7vp is a bonding pad for supplying a power supply voltage (1.2 volts, for example) to the PLL circuit area PLL.

Incidentally, for example, a spiral inductor SL to be used in the voltage controlled oscillator circuit area VCO is provided in the PLL circuit area PLL. One example of the spiral inductor SL is shown in FIG. 5. In this example, the spiral inductor SL is shaped in a differential type, i.e., in antisymmetric plane as seen from side to side and has a merit that common mode noise is canceled each other. Here, it is needless to say that those other than the spiral inductor SL can also be utilized.

A typical structure of a semiconductor substrate section will next be described by taking the low-noise amplifier circuit area LNA for example. This structure is basically exactly the same even with respect to other element circuit areas MIX, PLL, ABB, ADC, DBB and BM lying over the mixed signal chip 2m.

As shown in FIG. 4, for example, a P-type silicon single crystal semiconductor substrate (whose resistivity is about 8 Ω·cm, for example) is used as a semiconductor substrate 1. A low-noise amplifier circuit area peripheral guard ring GRl (P+ type guard ring area GR) is provided at the surface 2a of the semiconductor substrate 1 about the low-noise circuit area LNA so as to surround the P-type silicon single crystal semiconductor substrate. The low-noise amplifier circuit area peripheral guard ring GRl is supplied with a reference potential via an LNA peripheral guard ring-ground pad 7ra.

A P-type well region WP and an N-type well region WN are provided at the surface 2a of the semiconductor substrate 1 in the low-noise amplifier circuit area peripheral guard ring GRl. N+ type source and drain regions SDn of an N channel type MOSFET (Qn) are provided at the surface 2a of the P-type well region WP. A gate electrode G is provided via a gate insulting film over the surface 2a of the semiconductor substrate 1 lying between the N+ type source and drain regions SDn.

On the other hand, P+ type source and drain regions SDp of a P channel type MOSFET (Qp) are provided at the surface 2a of the N-type well region WN. A gate electrode G is provided via an gate insulating film over the surface 2a of the semiconductor substrate 1 lying between the P+ type source and drain regions SDp.

A P+ type contact region CP is provided at the surface 2a of the P-type well region WP and supplied with a reference potential through an LNA ground pad 7ga (low-noise amplifier area-reference voltage terminal), for example. On the other hand, an N+ type contact region CN is provided at the surface 2a of the N-type well region WN and supplied with a power supply voltage (e.g., 1.2 volts) through an LNA power pad 7va, for example.

In this example, the P-type well region WP is separated from the other part of the semiconductor substrate 1 by a deep N well region DWn. Therefore, an N+ type deep well contact region CD is provided at the surface 2a of the deep N well region DWn and supplied with a power supply voltage (e.g., 1.2 volts) through the LNA power pad 7va, for example.

(3) Description of Structure of Digital Semiconductor Chip (Refer Principally to FIGS. 6 and 7):

In this subsection, the details of the digital chip 2d described in the subsection (1) will be described. As shown in FIG. 6, a seal ring SR is provided along an outer peripheral portion of a surface 2a (device formation surface) of a semiconductor chip for the digital chip 2d. A second digital circuit area 6s is provided thereinside.

There are provided in the second digital circuit area 6s, for example, an input buffer circuit area BD, an OFDM (Orthogonal Frequency Division Multiplexing) demodulator circuit area DM (digital demodulator circuit area), etc.

Here, the input buffer circuit area BD converts, for example, a differential signal (balanced signal; low-amplitude digital balanced signal herein) sent from the output buffer circuit area BM to a non-differential signal (non-balanced signal) and sends out it to the digital demodulator circuit area DM. On the other hand, the digital demodulator circuit area DM performs, for example, digital signal processing such as FFT (Fast Fourier Transformation) on a parallel digital signal sent from the input buffer circuit area BD to perform demodulation, i.e., non-multiplexing. Here, the operating frequency of the digital demodulator circuit area DM is about 66 MHz, for example.

The seal ring SR is normally in contact with P+ type ring-shaped impurity doped regions which are formed in a semiconductor substrate surface placed therebelow and which are substantially identical in shape to itself on a planar basis. The seal ring SR is coupled to a digital chip seal ring-ground pad 7gsd inclusive of these regions.

The periphery of each element circuit area that configures the second digital circuit area 6s is surrounded by its corresponding specific peripheral guard ring as will be described below. That is, the periphery of the input buffer circuit area BD is surrounded by an input buffer circuit area peripheral guard ring GRi, i.e., P+ type ring-shaped impurity doped regions formed in the semiconductor substrate surface. The input buffer circuit area peripheral guard ring GRi is coupled to, for example, an input buffer circuit peripheral guard ring-ground pad Tri.

Likewise, the periphery of the digital demodulator circuit area DM is surrounded by a digital demodulator circuit area peripheral guard ring GRd. The digital demodulator circuit area peripheral guard ring GRd is coupled to, for example, a digital demodulator circuit peripheral guard ring-ground pad 7rm.

Here, in this example, the seal ring SR and the respective peripheral guard rings are not interconnected to each other inside the digital chip 2d (however, except for conduction made through a relatively high-resistance portion of the semiconductor substrate). This is done to prevent noise from the digital demodulator circuit area DM from reaching the input buffer circuit area peripheral guard ring GRi through the seal ring SR or the like and indirectly propagating to each element circuit area (analog element circuit area) of the mixed signal chip 2m therefrom. When, however, the number of bonding pads (terminals) is limited, it is also possible to make a coupling to any digital element circuit-ground pad, for example. There is, however, a fear that the propagation of noise will increase correspondingly.

Further, the following bonding pads are provided at the surface 2a of the semiconductor chip for the digital chip 2d. That is, an input buffer circuit-ground pad 7gi is a bonding pad for supplying a reference potential to the input buffer circuit area BD.

The digital modulator circuit-ground pad 7gm is a bonding pad for supplying a reference potential to the digital demodulator circuit area DM.

The input buffer circuit-power pad 7vi is a bonding pad for supplying a power supply voltage (e.g., 1.2 volts) to the input buffer circuit area BD.

The digital demodulator circuit-power pad 7vm is a bonding pad for supplying a power supply voltage (e.g., 1.2 volts) to the digital demodulator circuit area DM.

A typical structure of a semiconductor substrate section will next be described by taking the digital demodulator circuit area DM for example. This structure is basically exactly the same even with respect to other element circuit areas, i.e., input buffer circuit area BD and the like lying over the digital chip 2d.

As shown in FIG. 7, for example, a P-type silicon single crystal semiconductor substrate (whose resistivity is about 8 Ω·cm, for example) is used as a semiconductor substrate 1. A digital demodulator circuit area peripheral guard ring GRd (P+ type guard ring area GR) is provided at the surface 2a of the semiconductor substrate 1 about the digital demodulator circuit area DM so as to surround it. The digital demodulator circuit area peripheral guard ring GRd is supplied with a reference potential via a digital demodulator circuit peripheral guard ring-ground pad 7rm.

A P-type well region WP and an N-type well region WN are provided at the surface 2a of the semiconductor substrate 1 in the digital demodulator circuit area peripheral guard ring GRd. N+ type source and drain regions SDn of an N channel type MOSFET (Qn) are provided at the surface 2a of the P-type well region WP. A gate electrode G is provided via a gate insulting film over the surface 2a of the semiconductor substrate 1 lying between the N+ type source and drain regions SDn.

On the other hand, P+ type source and drain regions SDp of a P channel type MOSFET (Qp) are provided at the surface 2a of the N-type well region WN. A gate electrode G is provided via an gate insulating film over the surface 2a of the semiconductor substrate 1 lying between the P+ type source and drain regions SDp.

A P+ type contact region CP is provided at the surface 2a of the P-type well region WP and supplied with a reference potential through a digital demodulator circuit-ground pad 7gm, for example. On the other hand, an N+ type contact region CN is provided at the surface 2a of the N-type well region WN and supplied with a power supply voltage (e.g., 1.2 volts) through a digital demodulator circuit-power pad 7vm, for example.

(4) Description of Interconnecting Structure for Both Chips (Refer Principally to FIG. 8):

A typical enlarged plan view of an interchip cutout region R1 of FIG. 1 is shown in FIG. 8. As shown in FIG. 8, a serial signal (normal digital signal having an amplitude of normal logic) outputted from the digital baseband processing circuit area DBB is converted to a parallel signal (normal parallel signal) as a normal digital signal by a serial-parallel converting circuit SPT of the input buffer circuit area BD. This normal parallel signal, i.e., a single-ended digital signal is assigned to a plurality (e.g., eight in this example) of differential output buffers DOB, at each of which it is converted to a differential signal, i.e., a balanced digital signal. In this example, the differential signal is a small-amplitude differential signal smaller in amplitude than the normal logic, specifically, an LVDS (Low Voltage Differential Signaling) signal.

The individual LVDS signals (or each LVDS signal pair) are sent out to the outside of the mixed signal chip 2m through their corresponding differential output pads 7×1 (first bonding pad), 7×2 (second bonding pad), 7×5 (fifth bonding pad) and 7×6 (sixth bonding pad) and the like.

The individual LVDS signal pairs sent to the outside of the mixed signal chip 2m are transmitted via their corresponding pair transmission lines PS1, PS2, PS3, PS7 and PS8 and the like. Incidentally, each of the respective pair transmission lines PS1 (PS2, PS3, PS7, PS8) is comprised of a positive-side signal line S+ and an inverted signal line S− that pairs up with it. These positive-side signal lines S+ and inverted signal lines S− are all bonding wires (in this example, e.g., gold wires identical in diameter and substantially identical in length) identical to other bonding wires.

The respective LVDS signals are transmitted via these bonding wires 8 (refer to FIG. 1, for example) to their corresponding differential input pads 7×3 (third bonding pad), 7×4 (fourth bonding pad), 7×7 (seventh bonding pad) and 7×8 (eighth bonding pad) and the like lying over the digital chip 2d.

The LVDS signals transmitted to the differential input pads 7×3 (7×4, 7×7 and 7×8) are respectively terminated and matched with terminating resistors MR (e.g., 100 Ω or so) provided for each signal line pair and differential-inputted to their corresponding differential input buffers DIB, where they are converted to single-ended digital signals (non-differential digital signals of normal amplitude), which in turn are individually outputted to the OFDM demodulator circuit area DM (digital demodulator circuit area) of FIG. 6. Here, a salicide resistor can be illustrated as one suitable for each terminating resistor MR, i.e., termination matching resistor. A chip built-in resistor is different from an external resistor and has a merit such as being able to be easily installed extremely in the vicinity of an input portion of an input buffer in addition to being able to reduce the fluctuation of a resistance value. Also, the chip built-in resistor also has a merit that fluctuations in terminating resistors about a plurality of differential line pairs can extremely be reduced.

In this example, the lengths of the bonding wires 8 (refer to FIG. 1) that configure the respective positive-side signal lines S+ and inverted signal lines S−, i.e., wire lengths D3 are all substantially the same and about 2 mm, for example. In this example as well, the bonding wires 8 (refer to FIG. 1) that configure the respective positive-side signal lines S+ and inverted signal lines S− are substantially parallel to each other (it means that the intervals between the respective parts are equal because the wires themselves are being curved). Thus, for example, a straight line 29×3 that couples the differential output pad 7×1 (first bonding pad) and the differential input pad 7×3 (third bonding pad), and a straight line 29×1 that couples the differential output pad 7×2 (second bonding pad) and the differential input pad 7×4 (fourth bonding pad) are substantially parallel to each other.

The distances (in-signal line pair) between the bonding wires 8 (refer to FIG. 1) that configure the respective positive-side signal lines S+ and inverted signal lines S−, i.e., in-differential transmission line pair distances D1 are substantially the same and about 60 μm, for instance in this example.

Further, in this example, the distances between the pairs of the bonding wires 8 (refer to FIG. 1) that configure the positive-side signal lines S+ and the inverted signal lines S−, and the pairs of the bonding wires 8 (refer to FIG. 1) that configure the positive-side signal lines S+ and the inverted signal lines S− both adjacent to the above, i.e., inter-differential transmission line pair distances D2 are also substantially the same as with the in-differential transmission line pair distances D1. Incidentally, the inter-differential transmission line pair distances D2 may be made larger than the in-differential transmission line pair distances D1 in terms of crosstalk. It is however desirable that when a restriction on a pad arrangement is loose, the inter-differential transmission line pair distance D2 is made larger than the in-differential transmission line pair distance D1. The in-differential transmission line pair distance D1 is preferably small in ensuring signal quality. There is however a natural limit to the in-differential transmission line pair distance D1 due to the feasibility of causing wire's contact or the like, a relation in pad width, a demand for parallelism of each pair of transmission lines, a demand for the greatest possible linearity, etc. It is also desirable that paired transmission lines that belong to the same group are set to the same length as each other. The transmission line as short as possible is suitable in ensuring signal quality.

Further, in this example, the eight differential output pads 7×1, 7×2, 7×5, 7×6 and the like lying over the mixed signal chip 2*m* are arranged over a substantially straight line 29*ym*, for example. On the other hand, the eight differential input pads 7×3, 7×4, 7×7 and 7×8 and the like lying over the digital chip 2*d* are also arranged over a straight line 29*yd* substantially parallel with the straight line 29*ym*. Thus, in this example, the respective bonding wire pairs that configure the respective pairs of differential signal lines are substantially parallel to one another. Accordingly, the straight line 29×1 is substantially parallel with a straight line 29×2 that couples the differential output pad 7×5 (fifth bonding pad) and the differential input pad 7×7 (seventh bonding pad).

Thus, the by-wire direct inter-chip coupling is used in the digital signal differential transmission because of the following merits. That is, since transmission lines cannot be ensured alternatively in a module or the like using a lead frame, there is no other choice but to use the direct bonding by wires. In a BGA or the like using a multilayer wiring board, however, it is a common practice to use both chips as flip chips and configure paired transmission lines by a first layer wiring of an interposer. There is also a method in which when the flip chips are not used (it is desired to reduce cost), both chips are once coupled to the paired transmission lines configured by the first layer wiring of the interposer by wires and held up over adjacent chips by wires again. There are however various restrictions on the paired transmission lines for LVDS. There is thus inevitably a need to use a multilayer wiring board high in cost such as a build-up substrate or the like (expensive as compared with one based on such a subtractive method as in the present example). There are also problems such as that in the inter-chip area, the paired transmission lines for LVDS take up the first layer wiring (take up even a second layer wiring for a shielding plane) and other wirings cannot be arranged. High-speed digital differential signal transmission such as an LVDS system needs to mount terminating resistors near the input buffer side. It is however essentially difficult to mount external resistors between chips that must be arranged in close proximity to each other, as required while their symmetry remains held.

On the other hand, in the combination of the wire-based direct inter-chip coupling and built-in resistors, such a problem does not occur, and digital differential transmission paths can easily be provided. That is, the wires have merits such as that they do not take up the wiring layers of the multiplayer wiring board because they run through the air, and crosstalk on wires in a wiring substrate is also reduced because they run at relatively high altitudes (corresponding to a range from about 250 μm to about 450 μm in this example). There is also a merit such as that there is no need to provide the build-up substrate or the like.

Such problems about the digital differential transmission paths are common to the configuration of the digital differential transmission paths not limited to between an RF chip and a digital chip, but also between a plurality of chips in a module.

(5) Description of Coupling Structure in BGA (Ball Grid Array) (Refer Principally to FIG. 9):

A supply state of power supplies and reference potentials in the RF module 20 (semiconductor integrated circuit device) is shown in FIG. 9 in the form of an equivalent typical circuit diagram. As shown in FIG. 9 (refer to FIG. 3 or 6), a guard band 4 is coupled to, for example, a guard band ground land Vgpb provided at the back surface 3*p* of an interposer 3 through a guard band ground pad 7*gb*, an inductance component Ls (parasitic inductance) lying over a path, and a resistive component Rs (parasitic resistance) lying over a path.

Thus, a basic idea to be described below is that the inductance component Ls and the resistive component Rs are set as large as possible between areas to avoid the propagation of noise, and each area that is not so required is controlled to the values of an inductance component Ls and a resistive component Rs of a degree enough to secure a normal common potential.

Likewise, a low-noise amplifier circuit area LNA is coupled to, for example, an analog ground land Vgpa provided at the back surface 3*p* of the interposer 3 through an LNA ground pad 7*ga*, a parasitic inductance Ls and a parasitic resistance Rs.

A PLL circuit area PLL is coupled to, for example, the analog ground land Vgpa provided at the back surface 3*p* of the interposer 3 through a PLL ground pad 7*gp*, a parasitic inductance Ls and a parasitic resistance Rs.

An analog-digital converter circuit area ADC is coupled to, for example, the analog ground land Vgpa provided at the back surface 3*p* of the interposer 3 through an ADC ground pad 7*gc*, a parasitic inductance Ls and a parasitic resistance Rs.

The low-noise amplifier circuit area LNA is coupled to, for example, an LNA power land Vdpa provided at the back surface 3*p* of the interposer 3 through an LNA power pad 7*va*, a parasitic inductance Ls and a parasitic resistance Rs.

The PLL circuit area PLL is coupled to, for example, a PLL circuit power land Vdpp provided at the back surface 3*p* of the interposer 3 through a PLL power pad 7*vp*, a parasitic inductance Ls and a parasitic resistance Rs.

The analog-digital converter circuit area ADC is coupled to, for example, an ADC power land Vdpc provided at the back surface 3*p* of the interposer 3 through an ADC power pad 7*vc*, a parasitic inductance Ls and a parasitic resistance Rs.

Since respective element circuits of a digital baseband processing circuit area DBB, an output buffer circuit area BM, an input buffer circuit area BD and a digital demodulator circuit area DM configure a digital system circuit group DC in the RF module 20, they are coupled to, for example, a common digital ground land Vgpd as mentioned below. That is, the digital baseband processing circuit area DBB is coupled to, for example, the digital ground land Vgpd provided at the back surface 3p of the interposer 3 through a digital baseband processing circuit-ground pad 7gd, a parasitic inductance Ls and a parasitic resistance Rs.

The output buffer circuit area BM is coupled to, for example, the digital ground land Vgpd provided at the back surface 3p of the interposer 3 through an output buffer circuit-ground land 7go, a parasitic inductance Ls and a parasitic resistance Rs.

The input buffer circuit area BD is coupled to, for example, the digital ground land Vgpd provided at the back surface 3p of the interposer 3 through an input buffer circuit-ground pad 7gi, a parasitic inductance Ls and a parasitic resistance Rs.

The digital demodulator circuit area DM is coupled to, for example, the digital ground land Vgpd provided at the back surface 3p of the interposer 3 through a digital demodulator circuit-ground pad 7gm, a parasitic inductance Ls and a parasitic resistance Rs.

The digital baseband processing circuit area DBB is coupled to, for example, a digital baseband-power land Vdpd provided at the back surface 3p of the interposer 3 through a digital baseband processing circuit-power pad 7vd, a parasitic inductance Ls and a parasitic resistance Rs.

The output buffer circuit area BM is coupled to, for example, an I/O power land Vdpi provided at the back surface 3p of the interposer 3 through an output buffer circuit-power pad Ivo, a parasitic inductance Ls and a parasitic resistance Rs.

The input buffer circuit area BD is coupled to, for example, the I/O power land Vdpi provided at the back surface 3p of the interposer 3 through an input buffer circuit-power pad 7vi, a parasitic resistance Ls and a parasitic resistance Rs.

The digital demodulator circuit area DM is coupled to, for example, a digital demodulator circuit-power land Vdpm provided at the back surface 3p of the interposer 3 through a digital demodulator circuit-power pad 7vm, a parasitic inductance Ls and a parasitic resistance Rs.

Further, the following lands are provided at the back surface 3p of the interposer 3 and coupled to their corresponding on-chip terminals via wirings, vias and the like in the interposer 3. That is, an output buffer circuit peripheral guard ring-ground land Vrpo is coupled to an output buffer circuit peripheral guard ring-ground pad 7ro. Likewise, a digital baseband circuit peripheral guard ring-ground land Vrpd is coupled to a digital baseband processing circuit peripheral guard ring-ground pad 7rd. An antenna land Vspa is coupled to an LNA signal pad 7sa. An LNA circuit peripheral guard ring-ground land Vrpa is coupled to an LNA peripheral guard ring-ground pad 7ra. A PLL circuit peripheral guard ring-ground land Vrpp is coupled to a PLL peripheral guard ring-ground pad Trp. An ADC circuit peripheral guard ring-ground land Vrpc is coupled to an ADC peripheral guard ring-ground pad 7rc. A seal ring-ground land Vgps is coupled to a mixed signal chip seal ring-ground pad 7gsm and a digital chip seal ring-ground pad 7gsd. An input buffer circuit peripheral guard ring-ground land Vrpi is coupled to an input buffer circuit peripheral guard ring-ground pad Tri. A digital demodulator circuit peripheral guard ring-ground land Vrpm is coupled to a digital demodulator circuit peripheral guard ring-ground land 7rm.

(6) Description of Relationship of Coupling Between BGA and Motherboard (Refer Principally to FIG. 10):

A concrete example of a relationship of coupling between respective lands of the RF module 20 of FIG. 9, and circuits, circuit elements, devices and the like in the motherboard 15 or the like is shown in FIG. 10. As shown in FIG. 10, an LNA power land Vdpa is coupled to, for example, an LNA linear voltage regulator LRa over the motherboard 15.

Likewise, a PLL circuit-power land Vdpp is coupled to, for example, a PLL circuit-linear voltage regulator LRp different from the previous LNA-linear voltage regulator LRa over the motherboard 15.

An ADC power land Vdpc is coupled to, for example, an ADC circuit-linear voltage regulator LRc different from the previous LNA-linear voltage regulator LRa and PLL circuit-linear voltage regulator LRp over the motherboard 15.

A digital baseband-power land Vdpd, an I/O power land Vdpi and a digital demodulator circuit-power land Vdpm are coupled to, for example, a digital system circuit-linear voltage regulator LRd different from the previous LNA-linear voltage regulator LRa, PLL circuit-linear voltage regulator LRp and ADC circuit-linear voltage regulator LRc over the motherboard 15.

Thus, the coupling of the lands to the individual voltage regulars is not essential but effective in preventing power noise from propagating through different element circuits.

An analog ground land Vgpa, a guard band-ground land Vgpb, a digital ground land Vgpd, a digital demodulator circuit peripheral guard ring-ground land Vrpm, an input buffer circuit peripheral guard ring-ground land Vrpi, and an output buffer circuit peripheral guard ring-ground land Vrpo are coupled to, for example, a common ground plane GC (common ground) over the motherboard 15.

Further, a digital baseband circuit peripheral guard ring-ground land Vrpd, an ADC circuit peripheral guard ring-ground land Vrpc, a PLL circuit peripheral guard ring-ground land Vrpp, an LNA circuit peripheral guard ring-ground land Vrpa and a seal ring-ground land Vgps are also coupled to, for example, the common ground plane GC (common ground) over the motherboard 15.

An antenna land Vspa is coupled to, for example, an antenna AT directly or over the motherboard 15, or at the motherboard 15 as needed.

(7) Description of One Example of Overall Structure of Interposer (Refer Principally to FIGS. 11 and 12):

In this subsection, one example (four-layer through substrate) of the structure of the interposer 3 of the RF module 20 described in relation to FIGS. 1 and 2 is shown. As shown in FIGS. 11 and 12, a wiring layer structure of the interposer 3 is comprised of, for example, four layers, i.e., a first-layer wiring layer L1 (front surface wiring layer), a second-layer wiring layer L2 (front surface-side internal wiring layer), a third-layer wiring layer L3 (back surface-side internal wiring layer) and a fourth-layer wiring layer L4 (back-surface wiring layer) or the like as seen from the front surface side.

An insulting member layer structure of the interposer 3 is comprised of, for example, a front-side solder resist film 12f, a front-side laminated insulation substrate 11f, a core insulation substrate 11c, a back surface-side laminated insulation substrate 11s, and a back-side solder resist film 12s or the like as seen from the front surface side.

The interposer 3 is provided with a plurality of (large number of) through vias 25. In these, there are included as needed, a through via 25a that couples first, second, third and fourth layers to each other, a through via 25b that couples the first and fourth layers to each other, a through via 25c that couples the first and third layers to each other, a through via 25d that couples the first, second and fourth layers to each other, a through via 25e that couples the second and fourth layers to each other, etc.

As the first-layer wiring layer L1 (front surface wiring layer), there are, for example, a first layer digital ground plane 21*dp* placed below a digital chip 2*d*, a protrusion wiring 31*p* coupled thereto, a first layer independent wiring 31*i* (or each bonding lead), etc.

As the second-layer wiring layer L2 (front surface-side internal wiring layer), there are, for example, a second layer analog ground plane 22*ap* placed below an analog chip 2*m*, a second layer main digital ground plane 22*dp* placed below the digital chip 2*d*, a second layer sub digital ground plane 22*ds* placed below the digital chip 2*d*, etc. Further, in addition to the above, as the second-layer wiring layer L2 (front surface-side internal wiring layer), there are, for example, a second layer digital ground plane 22*dm* disposed below the analog chip 2*m*, etc.

As the third-layer wiring layer L3 (back surface-side internal wiring layer), there are, for example, a third layer analog ground plane 23*ap* placed below the analog chip 2*m*, a DBB power plane 33*bm* placed below the analog chip 2*m*, an I/O power plane 33*id* placed below the digital chip 2*d*, an I/O power plane 33*im* placed below the analog chip 2*m*, a digital demodulator circuit-power plane 33*dd* placed below the digital chip 2*d*, etc.

As the fourth-layer wiring layer L4 (back surface wiring layer), there are, for example, a fourth layer analog ground plane 24, a fourth layer digital ground plane 24*d*, etc.

(8) Detailed Description of Both Lower End Portion of Mixed Signal Semiconductor Chip for Interposer and its Peripheral Structure (Refer Principally to FIGS. 13 and 14):

In this subsection, the lower end portion of the analog chip 2*m* of FIG. 12 and its peripheral structure will be described in further detail. As shown in FIGS. 13 and 14, there are, for example, external coupling lands 26, etc. as the fourth-layer wiring layer (back surface wiring layer) except for those described in the subsection (7).

(9) Detailed Description of Upper-End Left Corner Portion of Mixed Signal Semiconductor Chip for Interposer, and its Peripheral Structure (Refer Principally Refer to FIGS. 15 and 16):

In this subsection, the upper-end left corner portion of the analog chip 2*m* of FIG. 12 and the structure of its peripheral portion will be described in more detail. As shown in FIGS. 15 and 16, as the characteristic structure of the second-layer wiring layer L2 (front surface-side internal wiring layer), there are, for example, a second layer ground plane slit-like cutout portion 22*cs*, etc. except for those described in the subsections (7) and (8).

As the characteristic structure of the fourth-layer wiring layer L4 (back surface wiring layer), there are, for example, a fourth layer ground plane slit-like cutout portion 24*cs*, etc. except for those described in the subsection (7).

The ground plane cutout portions such as the slit-like cutout portions 22*cs* and 24*cs*, etc. such as described above have the effect of narrowing current paths lying over the second layer analog ground plane 22*ap* and the fourth layer analog ground plane 24*a*. Thus, the effect of reducing noise propagation is produced by increasing the impedance or the like between the LNA ground pad 7*ga* (low-noise amplifier area-reference voltage terminal) and the ADC ground pad 7*gc* (analog element circuit area-reference voltage terminal) or the like, for example. The same effect is obtained even between the PLL ground pad 7*gp* (analog element circuit area-reference voltage terminal) and the ADC ground pad 7*gc* (another analog element circuit area-reference voltage terminal), for example.

Incidentally, as shown in FIG. 16, the bump electrodes 10 are mounted to an opening of the back-side solder resist film 12*s* lying over each external coupling land 26.

(10) Detailed Description of Area Between Semiconductor Chips of Interposer, and its Peripheral Structure (Refer Principally to FIGS. 17 Through 19):

In this subsection, the area between the analog chip 2*m* and digital chip 2*d* in FIG. 12, and its peripheral structure will be described in more detail. Since the number of actual bonding pads is however numerous, only representative bonding pads will be shown for convenience of explanation when necessary in the case of those that belong to the same category.

As shown in FIGS. 17, 18 (section taken along line D-D' of FIG. 17) and 19 (section taken along line E-E' of FIG. 17), digital baseband processing circuit-power pads 7*vd* are repeatedly provided plural (three shown in the drawing), for example side by side over the analog chip 2*m*. Likewise, output buffer circuit-ground pads 7*go* are repeatedly provided plural (three shown in the drawing), for example side by side over the analog chip 2*m*. Further, output buffer circuit-power pads Ivo are repeatedly provided plural (three shown in the drawing), for example side by side over the analog chip 2*m*.

On the other hand, digital demodulator circuit-ground pads 7*gm* are repeatedly provided plural (three shown in the drawing), for example side by side over the digital chip 2*d*. Likewise, input buffer circuit-ground pads 7*gi* are repeatedly provided plural (three shown in the drawing), for example side by side over the digital chip 2*d*. Further, input buffer circuit-power pads 7*vi* are repeatedly provided plural (three shown in the drawing), for example side by side.

Here, as can be seen in FIG. 17, the digital baseband processing circuit-power pads 7*vd* are coupled to their corresponding DBB power plane 33*bm*. The output buffer circuit-power pads 7*vo* are coupled to their corresponding I/O power plane 33*im*. Further, the input buffer circuit-power pads 7*vi* are coupled to their corresponding I/O power plane 33*id*. Digital demodulator circuit-power pads 7*vm* (refer to FIG. 6 and the pads themselves are not illustrated in FIG. 17 and the like) are coupled to their corresponding digital demodulator circuit-power plane 33*dd*. Thus, since the digital baseband processing circuit-power pads 7*vd* and the output buffer circuit-power pads Ivo for the digital system element circuits lying over the mixed signal chip 2*m* are coupled to their corresponding power planes separated on a geometric basis, it is possible to prevent noise from propagating from the digital chip 2*d* through the output buffer circuit area BM. Likewise, since the input buffer circuit-power pads 7*vi* and the digital demodulator circuit-power pads 7*vm* lying over the digital chip 2*d* are coupled to their corresponding power planes separated on a geometric basis, it is possible to prevent noise from propagating from the digital chip 2*d* through the input buffer circuit area BD (and the output buffer circuit area BM).

2. Description of Principal Process in Manufacturing Method of Semiconductor Integrated Circuit Device According to the One Embodiment of the Present Application (Refer Principally to FIGS. 20 Through 29):

A description will hereinafter be made of a major part of a process for manufacturing a through substrate by a four-layer subtractive method having a glass epoxy core substrate as one example of an organic multilayer wiring board by taking for example the section of FIG. 19 in correspondence with the example of the section 1. As the type of organic multilayer wiring board, however, one not having a core substrate may be used in addition to one having the core substrate. This has a merit that the rigidity of the substrate can be ensured. As the material for the organic multilayer wiring board, other resin materials such as other epoxy-based materials, a polyimidebased material, a BCB (Benzocyclobutene)-based material, etc. may be used without being limited to a glass epoxy-based material. Incidentally, the glass epoxy-based material is excellent in cost performance. Further, the number of layers for the organic multilayer wiring board is not limited to four, but may be greater than or equal to six.

While the form of lamination of the organic multilayer wiring board will concretely be described here by taking the through substrate (non-build up system) for example, a build up system may be introduced into all or some. Further, as a patterning system of the organic multilayer wiring board, may be adopted, a semi-additive method, an additive method and the like without being limited to the subtractive method. These choices however increase in cost correspondingly.

Incidentally, it is needless to say that although a photoresist film is described with being predicated on a dry film resist film, it may be a coated resist film. It is also needless to say that although a solder resist is described assuming that it is a photosensitive material, it may be a non-photosensitive material. Further, although the patterning of these is described assuming an LDW (Laser Direct Writing) method, it may be another lithography means or may be a processing means other than the lithography. The lithography-based means however has a merit that it becomes simple in process. In particular, the direct drawing method such as the LDW method or the like is effective in process simplification.

Although drilling is described below assuming a mechanical drilling method, it is needless to say that it may be a laser drilling method or an etching-based drilling method in addition to the mechanical drilling method. Incidentally, the mechanical drilling method is normally advantageous in cost.

Further, although a method of die bonding is described below assuming a method of applying silver paste or the like onto the interposer 3 side in advance and mounting a chip thereto, a method of bonding a DAF (Die Attach Film) material layer on the chip side in advance may be used. The method using the DAF material layer has a merit that the process is simplified. On the other hand, the method of applying the adhesive layer such as the silver past has a demerit in terms of cost. The silver paste or the like has a merit that its coating property is satisfactory. Incidentally, it is needless to say that a die bonding adhesive may be silica-based filter containing paste or another paste material in addition to the silver paste.

Although a bonding wire is described below assuming a gold-based wire such as a gold wire or the like, it is needless to say that it may be a copper-based wire, a silver-based wire, an aluminum-based wire or a palladium-based wire or the like. Since the copper-based wire is relatively hard in addition to being advantageous in cost, it is effective in reducing a short circuit failure or the like. The copper-based wire is particularly suitable where a bonding pad is a copper-based pad. On the other hand, in the case of an aluminum-based pad, the gold-base wire, the palladium-based wire or the like is particularly suitable. It is however needless to say that the copper-based wire is also available.

Further, although the following process is described assuming a MAP (Mold Array Package) system for collectively sealing a large entire substrate with an sealing resin (batch sealing system) and thereafter dividing it into individual devices by dicing or the like, it is needless to say that it may be an individual sealing system which performs sealing for every unit device. Incidentally, the batch sealing system is advantageous in cost.

Concrete numerical values of the dimensions or the like of respective parts are shown below but intended to be explained more concretely. It is needless to say that the dimensions or the like of the parts are not limited to these numerical values.

Figure 20:
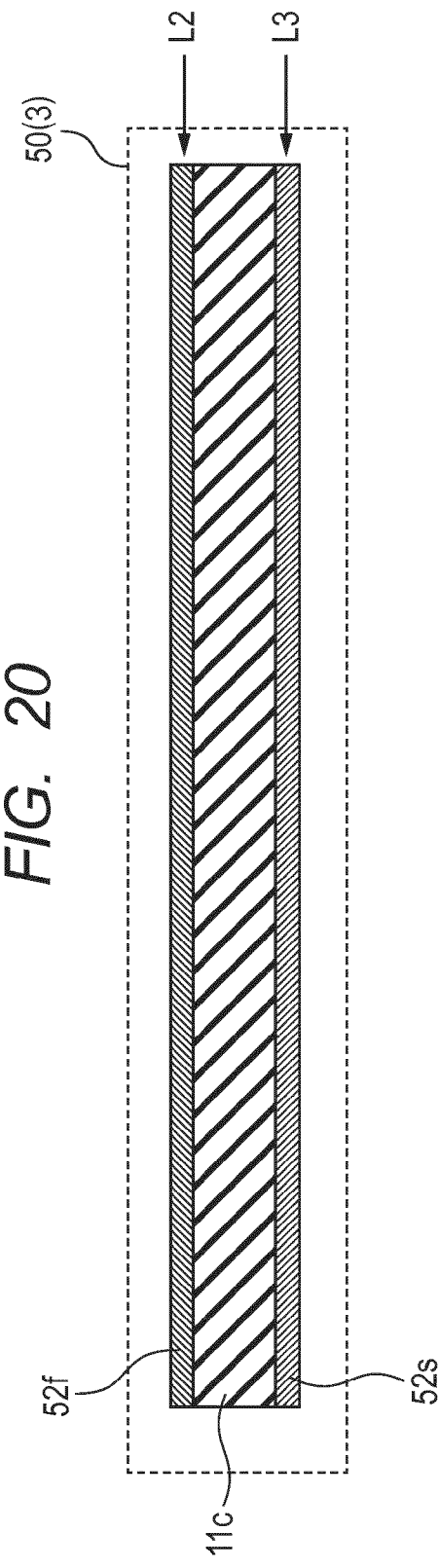
FIG. 20 is a typical sectional view of an RF module 20 being in a manufacturing process (process for provision of a double-sided copper-clad glass epoxy core substrate) corresponding to FIG. 19 for describing a principal process in a manufacturing method of the semiconductor integrated circuit device according to the one embodiment of the present application.
Figure 21:
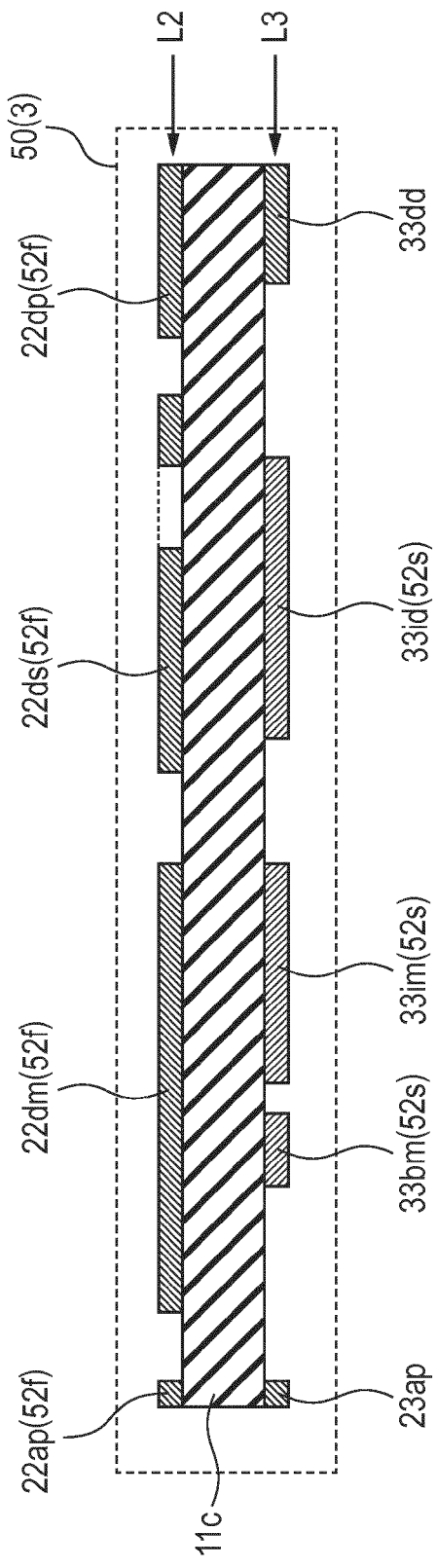
FIG. 21 is a typical sectional view of the RF module 20 being in a manufacturing process (processing process of second-layer wiring layer L2 and third-layer wiring layer L3) corresponding to FIG. 19 for describing the principal process in the manufacturing method of the semiconductor integrated circuit device according to the one embodiment of the present application.
Figure 22:
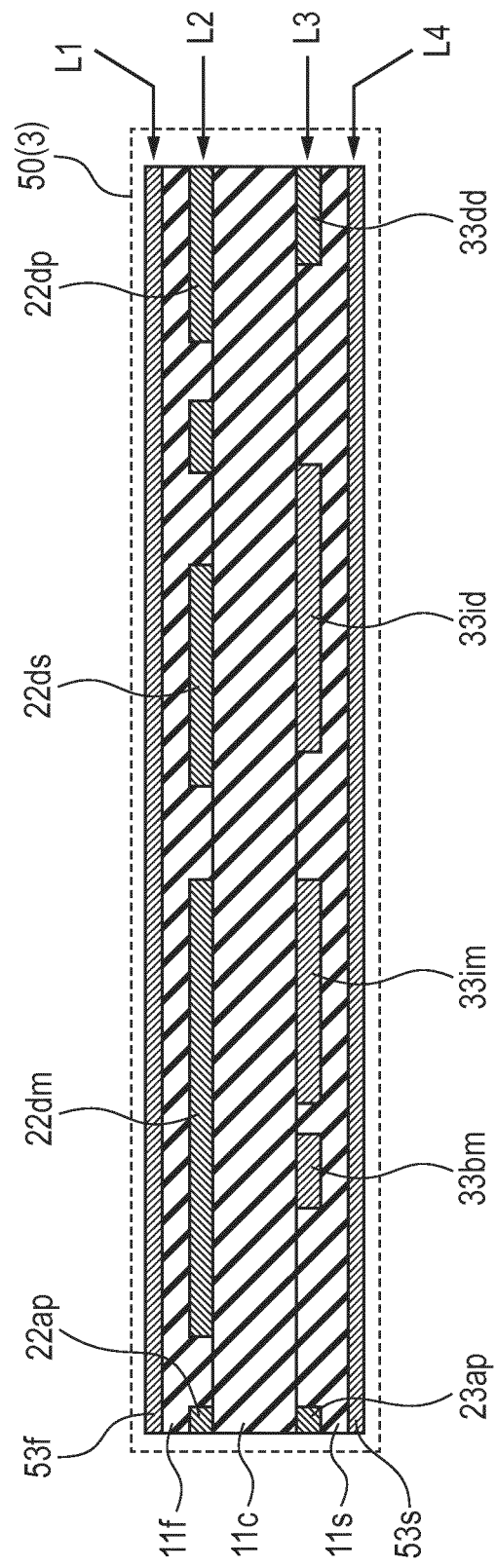
FIG. 22 is a typical sectional view of the RF module 20 being in a manufacturing process (lamination process of front-side laminated insulating substrate 11f, back-side laminated insulating substrate 11s, outer front surface copper plate 53f and outer back surface copper plate 53s) corresponding to FIG. 19 for describing the principal process in the manufacturing method of the semiconductor integrated circuit device according to the one embodiment of the present application.
Figure 23:
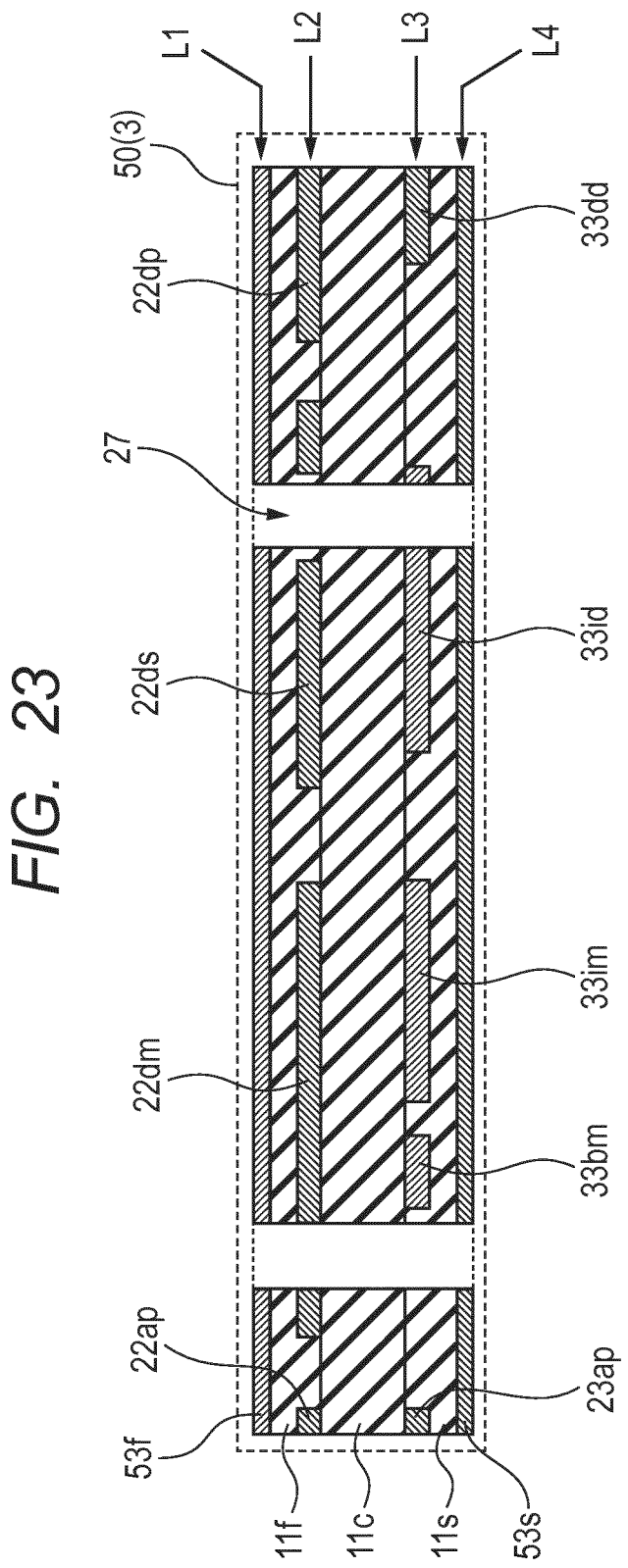
FIG. 23 is a typical sectional view of the RF module 20 being in a manufacturing process (through viahole forming process) corresponding to FIG. 19 for describing the principal process in the manufacturing method of the semiconductor integrated circuit device according to the one embodiment of the present application.
Figure 24:
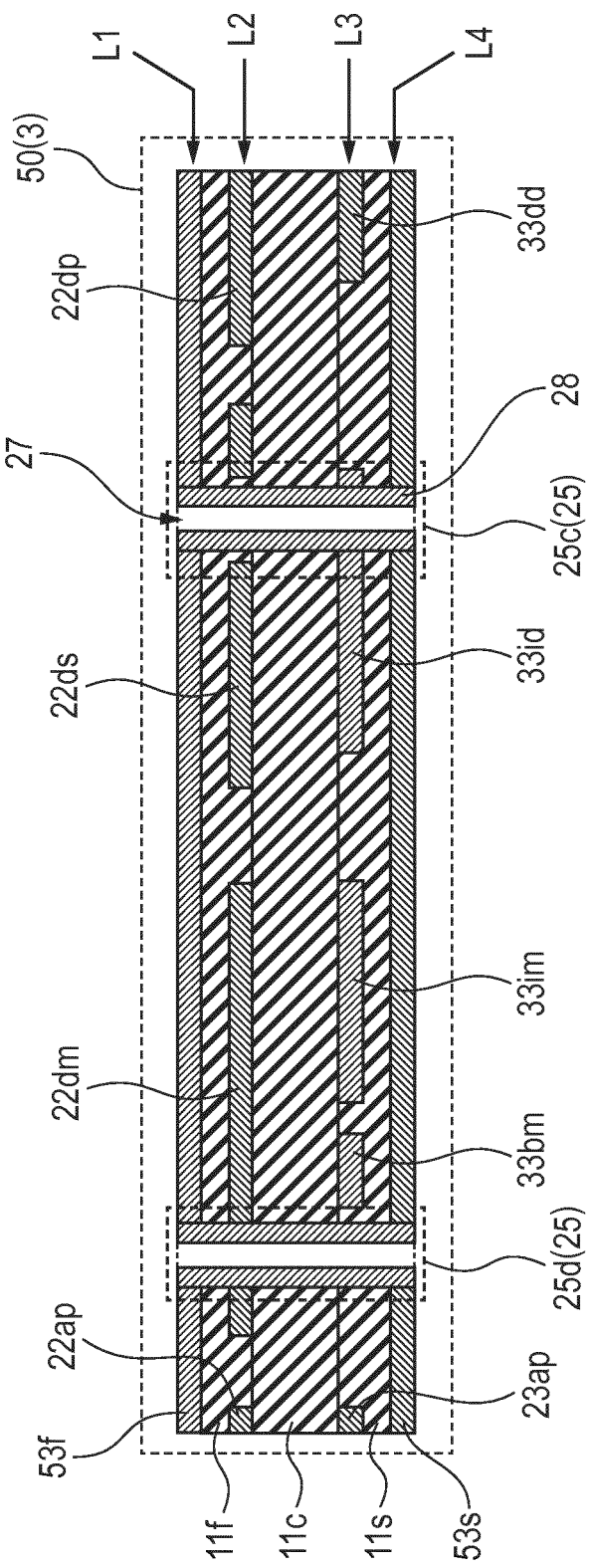
FIG. 24 is a typical sectional view of the RF module 20 being in a manufacturing process (through viahole plating process) corresponding to FIG. 19 for describing the principal process in the manufacturing method of the semiconductor integrated circuit device according to the one embodiment of the present application.
Figure 25:
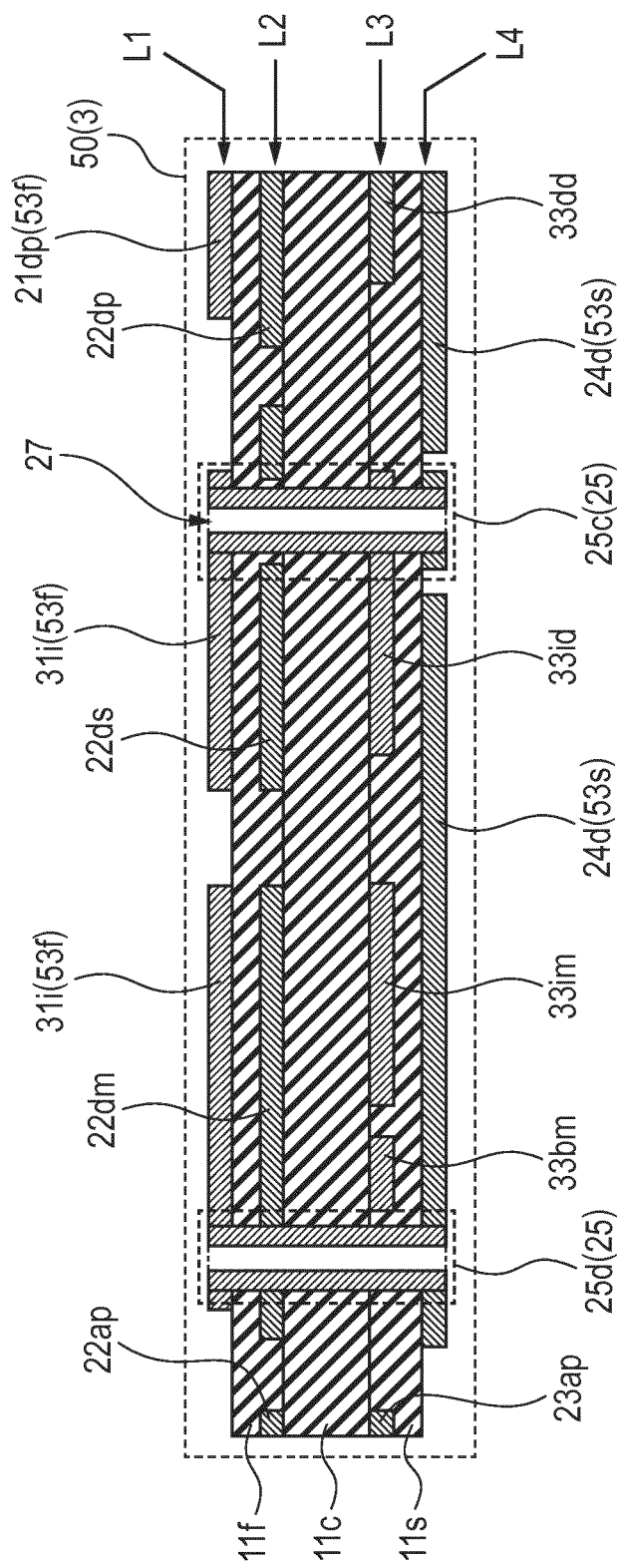
FIG. 25 is a typical sectional view of the RF module 20 being in a manufacturing process (processing process of outer front surface copper plate 53f and outer back surface copper plate 53s) corresponding to FIG. 19 for describing the principal process in the manufacturing method of the semiconductor integrated circuit device according to the one embodiment of the present application.
Figure 26:
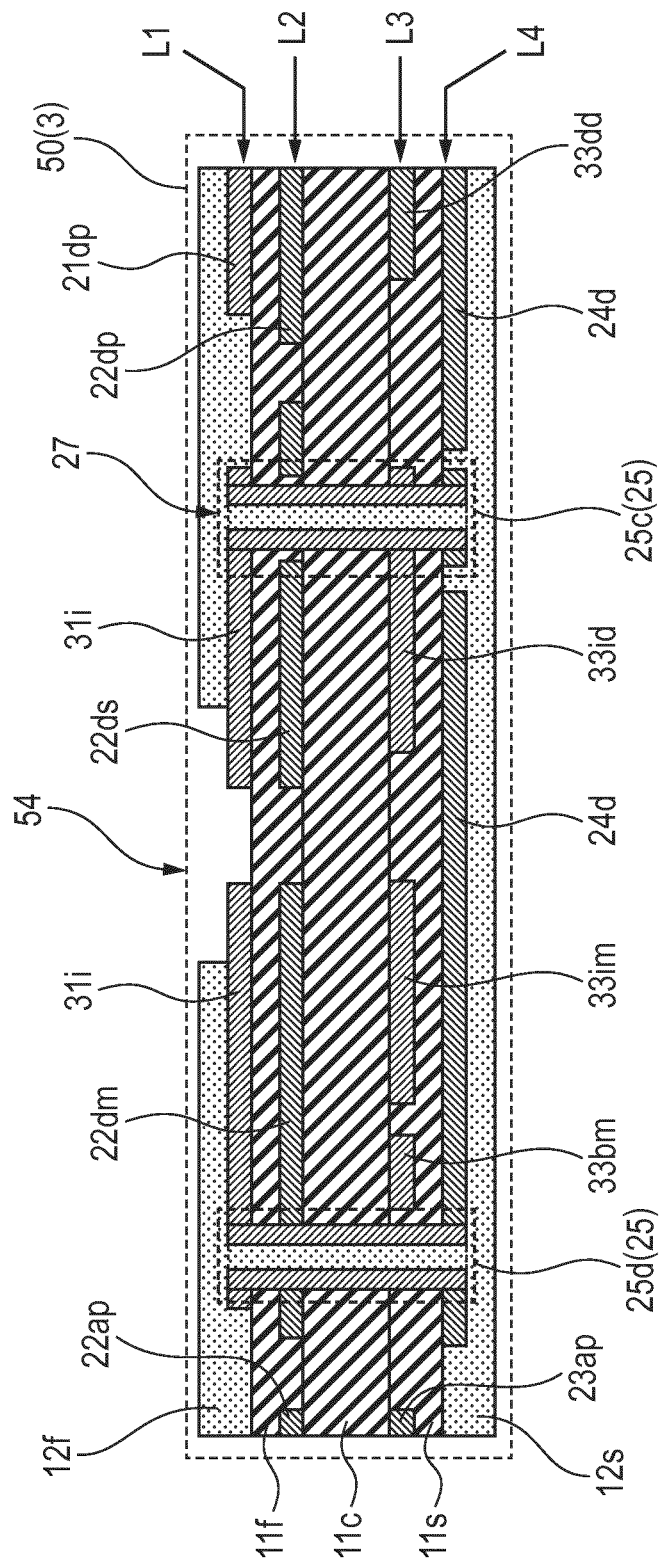
FIG. 26 is a typical sectional view of the RF module 20 being in a manufacturing process (deposition and processing process of front side solder resist film 12f and back side solder resist film 12s) corresponding to FIG. 19 for describing the principal process in the manufacturing method of the semiconductor integrated circuit device according to the one embodiment of the present application.
Figure 27:
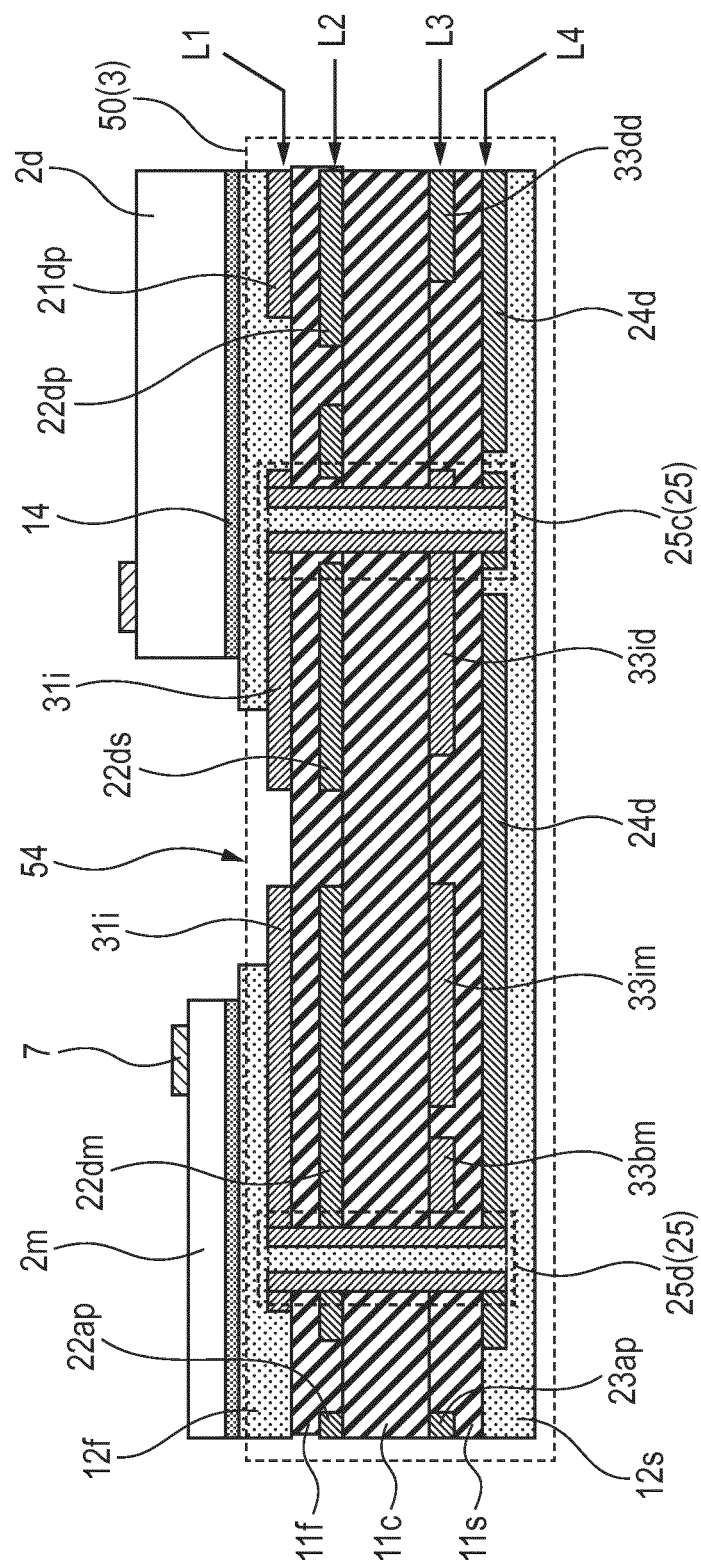
FIG. 27 is a typical sectional view of the RF module 20 being in a manufacturing process (forming and die bonding process of die bonding paste layer 14) corresponding to FIG. 19 for describing the principal process in the manufacturing method of the semiconductor integrated circuit device according to the one embodiment of the present application.
Figure 28:
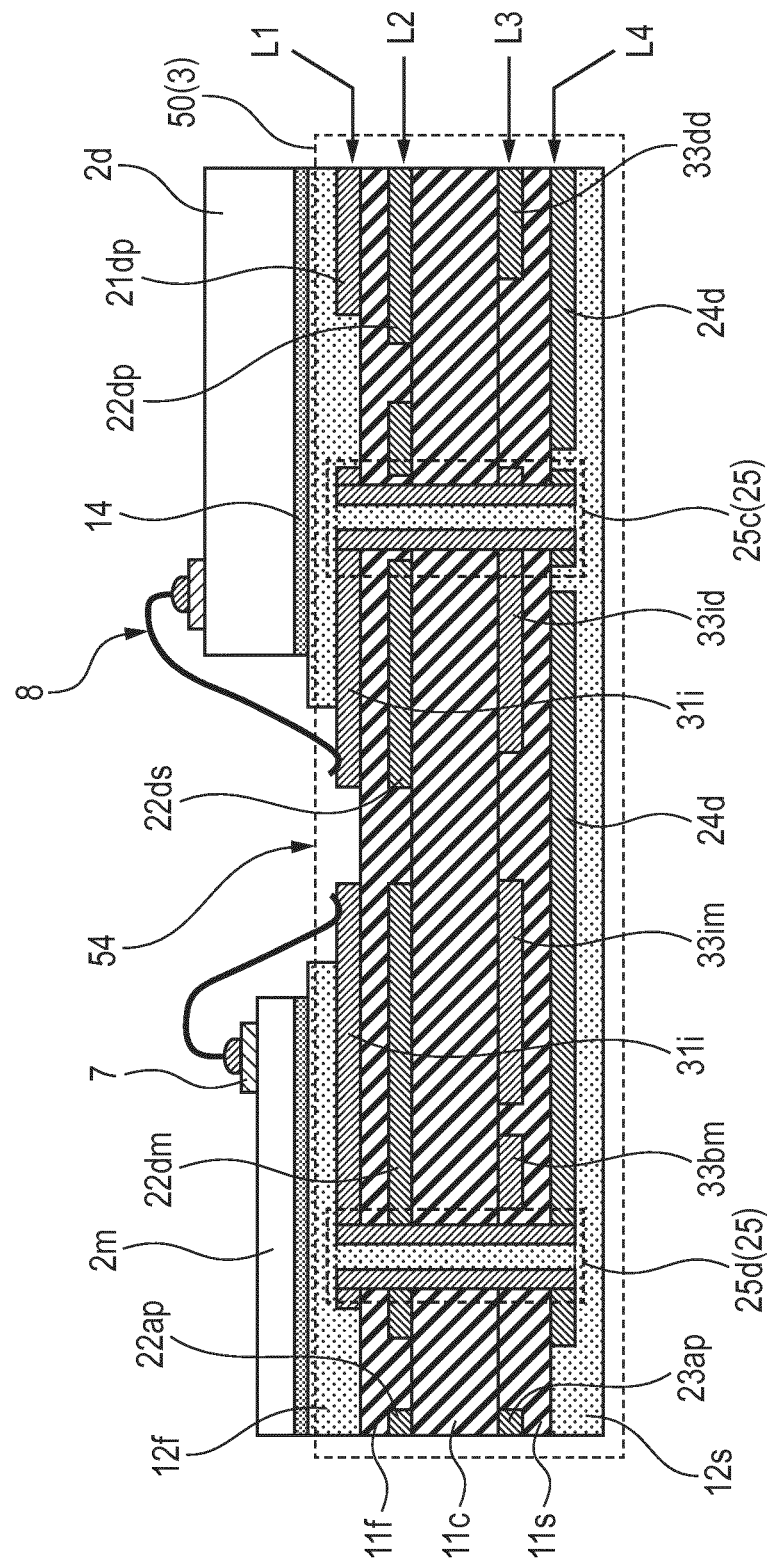
FIG. 28 is a typical sectional view of the RF module 20 being in a manufacturing process (wire bonding process) corresponding to FIG. 19 for describing the principal process in the manufacturing method of the semiconductor integrated circuit device according to the one embodiment of the present application.
Figure 29:
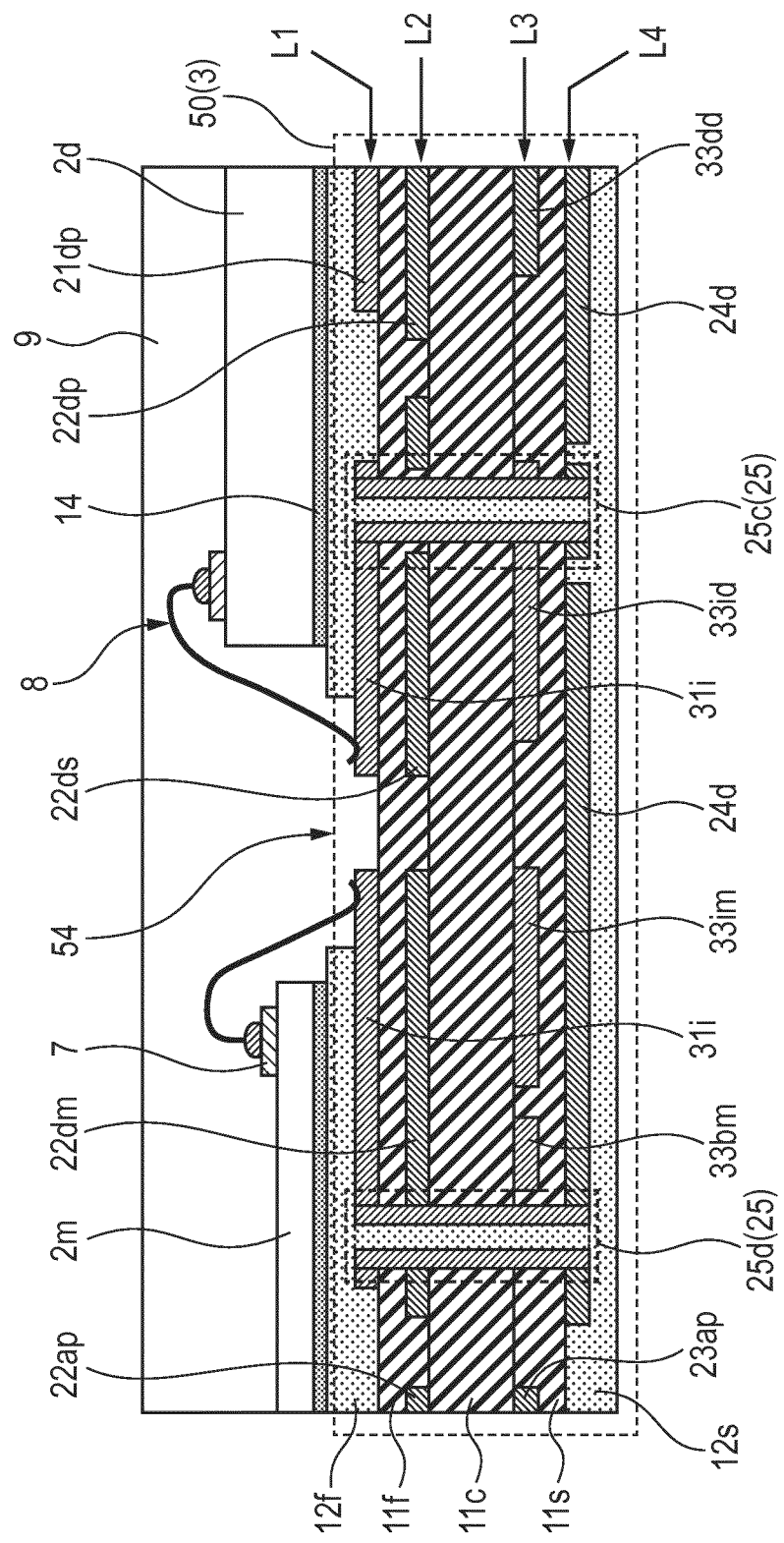
FIG. 29 is a typical sectional view of the RF module 20 being in a manufacturing process (resin sealing process) corresponding to FIG. 19 for describing the principal process in the manufacturing method of the semiconductor integrated circuit device according to the one embodiment of the present application.

FIG. 20 is a typical sectional view of an RF module 20 being in a manufacturing process (process for provision of a double-sided copper-clad glass epoxy core substrate) corresponding to FIG. 19 for describing a principal process in a manufacturing method of the semiconductor integrated circuit device according to the one embodiment of the present application. FIG. 21 is a typical sectional view of the RF module 20 being in a manufacturing process (processing process of second-layer wiring layer L2 and third-layer wiring layer L3) corresponding to FIG. 19 for describing the principal process in the manufacturing method of the semiconductor integrated circuit device according to the one embodiment of the present application. FIG. 22 is a typical sectional view of the RF module 20 being in a manufacturing process (lamination process of front-side laminated insulating substrate 11f, back-side laminated insulating substrate 11s, outer front surface copper plate 53f and outer back surface copper plate 53s) corresponding to FIG. 19 for describing the principal process in the manufacturing method of the semiconductor integrated circuit device according to the one embodiment of the present application. FIG. 23 is a typical sectional view of the RF module 20 being in a manufacturing process (through viahole forming process) corresponding to FIG. 19 for describing the principal process in the manufacturing method of the semiconductor integrated circuit device according to the one embodiment of the present application. FIG. 24 is a typical sectional view of the RF module 20 being in a manufacturing process (through viahole plating process) corresponding to FIG. 19 for describing the principal process in the manufacturing method of the semiconductor integrated circuit device according to the one embodiment of the present application. FIG. 25 is a typical sectional view of the RF module 20 being in a manufacturing process (processing process of outer front surface copper plate 53f and outer back surface copper plate 53s) corresponding to FIG. 19 for describing the principal process in the manufacturing method of the semiconductor integrated circuit device according to the one embodiment of the present application. FIG. 26 is a typical sectional view of the RF module 20 being in a manufacturing process (deposition and processing process of front side solder resist film 12f and back side solder resist film 12s) corresponding to FIG. 19 for describing the principal process in the manufacturing method of the semiconductor integrated circuit device according to the one embodiment of the present application. FIG. 27 is a typical sectional view of the RF module 20 being in a manufacturing process (forming and die bonding process of die bonding paste layer 14) corresponding to FIG. 19 for describing the principal process in the manufacturing method of the semiconductor integrated circuit device according to the one embodiment of the present application. FIG. 28 is a typical sectional view of the RF module 20 being in a manufacturing process (wire bonding process) corresponding to FIG. 19 for describing the principal process in the manufacturing method of the semiconductor integrated circuit device according to the one embodiment of the present application. FIG. 29 is a typical sectional view of the RF module 20 being in a manufacturing process (resin sealing process) corresponding to FIG. 19 for describing the principal process in the manufacturing method of the semiconductor integrated circuit device according to the one embodiment of the present application. The principal process in the manufacturing method of the semiconductor integrated circuit device according to the one embodiment of the present application will be described based on these.

First, as shown in FIG. 20, for example, a double-sided copper-clad insulating core substrate 50 adhered with copper sheets, i.e., an inner front-surface copper plate 52f and an inner back-surface copper plate 52s to both surfaces of a glass epoxy core substrate 11c (core insulating substrate) is provided. The thickness of the core insulating substrate 11c is about 100 μm, for example. The thickness of each of the inner front-surface copper plate 52f and the inner back-surface copper plate 52s is about 20 μm, for example.

Next, as shown in FIG. 21, the inner front-surface copper plate 52f and the inner back-surface copper plate 52s are respectively patterned by lithography using a dry film resist film or the like, for example. Thus, for example, a second layer analog ground plane 22ap disposed below an analog chip 2m is formed as the second-layer wiring layer L2 (surface front-side internal wiring layer). Likewise, for example, a second layer digital ground plane 22dm disposed below the analog chip 2m is formed as the second-layer wiring layer L2. Further, for example, a second layer subdigital ground plane 22ds disposed below a digital chip 2d is formed as the second-layer wiring layer L2. Besides, a second layer main digital ground plane 22dp disposed below the digital chip 2d is formed as the second-layer wiring layer L2.

On the other hand, for example, a third layer analog ground plane 23ap disposed below the analog chip 2m is formed as the third-layer wiring layer L3 (back surface-side internal wiring layer). Likewise, for example, a DBB power plane 33bm disposed below the analog chip 2m is formed as the third-layer wiring layer L3 (back surface-side internal wiring layer). Further, an I/O power plane 33im disposed below the analog chip 2m is formed as the third-layer wiring layer L3 (back surface-side internal wiring layer). Besides, for example, an I/O power plane 33id disposed below the digital chip 2d is formed as the third-layer wiring layer L3 (back surface-side internal wiring layer). Furthermore, for example, a digital demodulator circuit-power plane 33dd disposed below the digital chip 2d is formed as the third-layer wiring layer L3 (back surface-side internal wiring layer).

Next, as shown in FIG. 22, for example, the front-side laminated insulating substrate 11f and the outer front surface copper plate 53f (corresponding to the first-layer wiring layer L1) such as glass epoxy prepreg are laminated onto the front side of the double-sided copper-clad insulating core substrate 50. Further, for example, the back-side laminated insulating substrate 11s and the outer back surface copper plate 53s (corresponding to the fourth-layer wiring layer L4) such as the glass epoxy prepreg are laminated onto the back side of the double-sided copper-clad insulating core substrate 50. The thickness of each of the front-side laminated insulating substrate 11f and the back-side laminated insulating substrate 11s is about 40 μm, for example. The thickness of each of the outer front surface copper plate 53f and the outer back surface copper plate 53s is about 20 μm, for example.

Next, as shown in FIG. 23, through viaholes 27 are formed in the double-sided copper-clad insulating core substrate 50 (interposer 3).

Next, as shown in FIG. 24, a relatively thin copper film is formed over both surfaces of the double-sided copper-clad insulating core substrate 50 (interposer 3) and within the through viaholes 27 by, for example, an electroless copper plating method. Thereafter, for example, a relatively thick copper film is formed over both surfaces of the double-sided copper-clad insulating core substrate 50 (interposer 3) and within the through viaholes 27 by, for example, an electrolytic copper plating method with the thin copper film as a seed layer. Thus, an in-through viahole plated copper film 28 is formed within the through viahole 27. For example, through vias 25 such as a through via 25d that couples the first, second and fourth layers, and a through via 25c that couples the first and third layers, etc. are formed.

Next, as shown in FIG. 25, the outer front surface copper plate 53f and the outer back surface copper plate 53s are respectively patterned by, for example, lithography using a dry film resist film or the like. Thus, for example, a first layer independent wiring 31i is formed as the first-layer wiring layer L1 (front surface wiring layer). Likewise, for example, a first layer digital ground plane 21dp disposed below the digital chip is formed as the first-layer wiring layer L1 (front surface wiring layer).

On the other hand, for example, a fourth layer digital ground plane 24d is formed as the fourth-layer wiring layer L4 (back surface wiring layer). Incidentally, lands around the through vias 25 are also formed simultaneously at this time. They are however formed inevitably with being attached to the through vias 25, and their description in detail will therefore be omitted.

Next, as shown in FIG. 26, for example, a front side solder resist film 12f is applied onto the front surface side of the interposer 3 (organic multilayer wiring board), and a back side solder resist film 12s is applied onto the back surface side thereof, so that, for example, the solder resist material is filled in each through viahole 27. The thickness of each of the front side solder resist film 12f and the back side solder resist film 12s is about 25 μm, for example.

Thereafter, for example, the front side solder resist film 12f and the back side solder resist film 12s are patterned by lithography to thereby open or define a bonding opening 54 or the like. At this time, for example, an opening or the like lying over the external coupling land 26 of FIG. 16 is opened simultaneously with the patterning of the back side solder resist film 12s.

Next, as shown in FIG. 27, for example, silver past is applied onto the front surface side of the interposer 3 (organic multilayer wiring board) to form a die bonding paste layer 14 (adhesive layer, silver paste layer). The thickness of the die bonding paste layer 14 is about 40 μm, for example. Thereafter, the mixed signal chip 2m and the digital chip 2d are die-bonded through the silver paste layer 14.

Next, as shown in FIG. 28, for example, each of bonding pads (terminals) provided at the surface 2a of each of the mixed signal chip 2m and the digital chip 2d, and the bonding lead 31i are coupled to each other therebetween using a gold wire (e.g., about 18 μm in diameter) or the like. At this time, wire bonding is performed by, for example, gold wires or the like substantially simultaneously even between the mixed signal chip 2m and the digital chip 2d as shown in FIGS. 1 and 2, for example. As a bonding method, for example, ball wedge bonding using a capillary can be illustrated as a suitable one even between the chips and between each chip and its outside. As a bonding system, a thermo-sonic system can normally be illustrated as a suitable one. Incidentally, in this example, the digital chip 2 side is taken as a first bonding point in the case of the direct coupling between the two chips (refer to FIG. 1 and the like). This is because when the chips are directly coupled to each other by the wires, the thick chip taken as the first bonding point is hard to develop a short circuit and a failure in the thin chip taken as the second bonding point side due to wire sags. Incidentally, the thin chip can also be taken as the first bonding point. This is advantageous for a reduction in wire height and thinning of a package.

Next, as shown in FIG. 29, for example, the sealing of the mixed signal chip 2m and the digital chip 2d or the like is performed by, for example, an epoxy sealing resin, using a transfer mold, for example to thereby form a sealing resin body 9 on the front surface side of the interposer 3 (organic multilayer wiring board). The thickness of the sealing resin body 9 is about 800 μm, for example. Incidentally, the mold method may be other methods such as a compression mold method, etc. in addition to the transfer mold method.

Thereafter, as shown in FIG. 19, when solder bump electrodes 10 or the like are mounted and the interposer 3 (organic multilayer wiring board) is divided by dicing or the like as needed, a BGA device, i.e., an RF module (refer to FIG. 1) is obtained. The diameter of each solder bump electrode 10 is about 350 µm, for example.

3. Considerations as to Supplementary Explanations Related to the Embodiment (Including Modifications) and in General (Refer Principally to FIG. 30)

Figure 30:
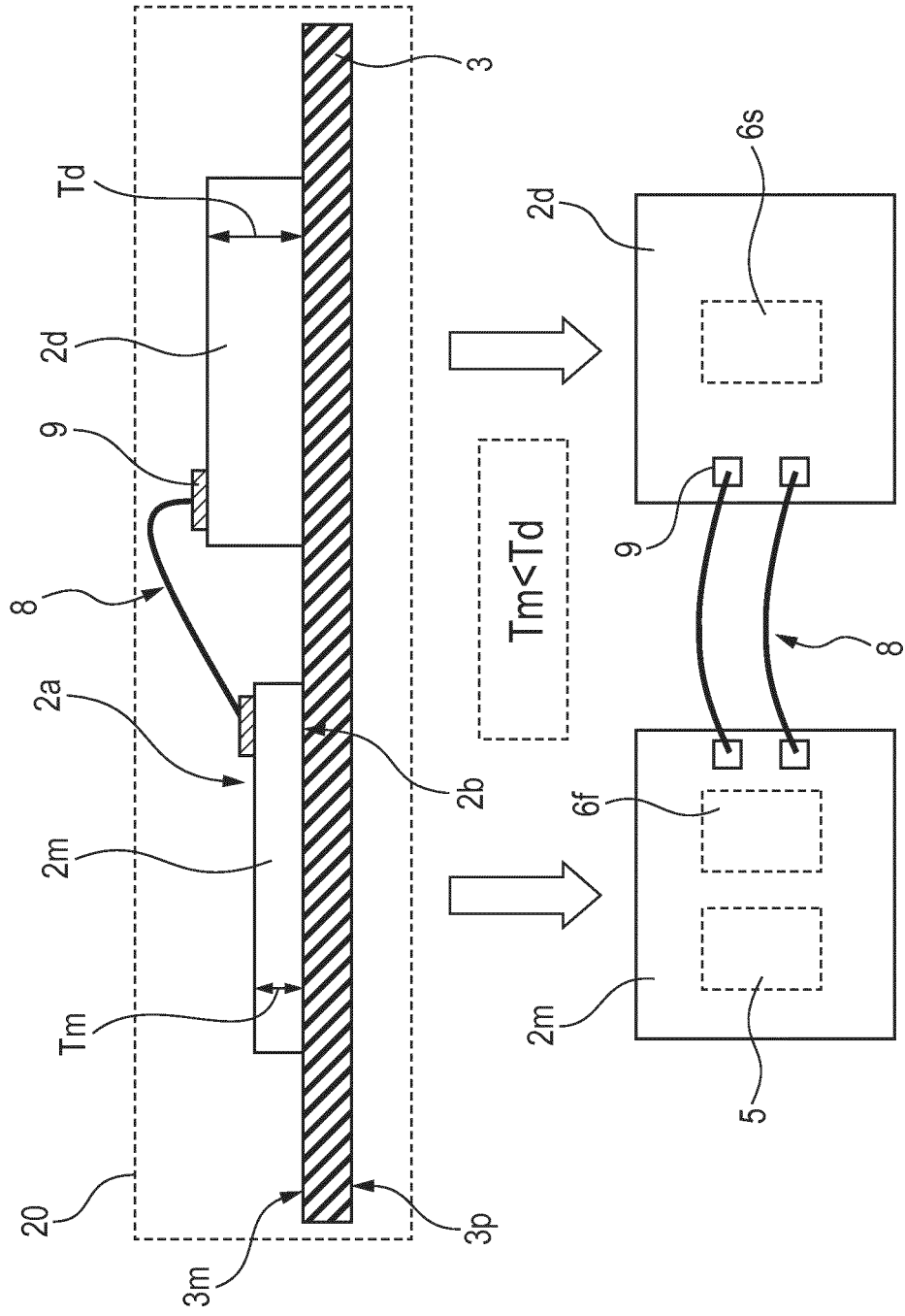
FIG. 30 is a diagram for describing a typical section or the like being the section taken along line Y-Y' of FIG. 1 substantially corresponding to FIG. 2 for describing the outline of the device structure in the semiconductor integrated circuit device according to the one embodiment of the present application.
Figure 31:
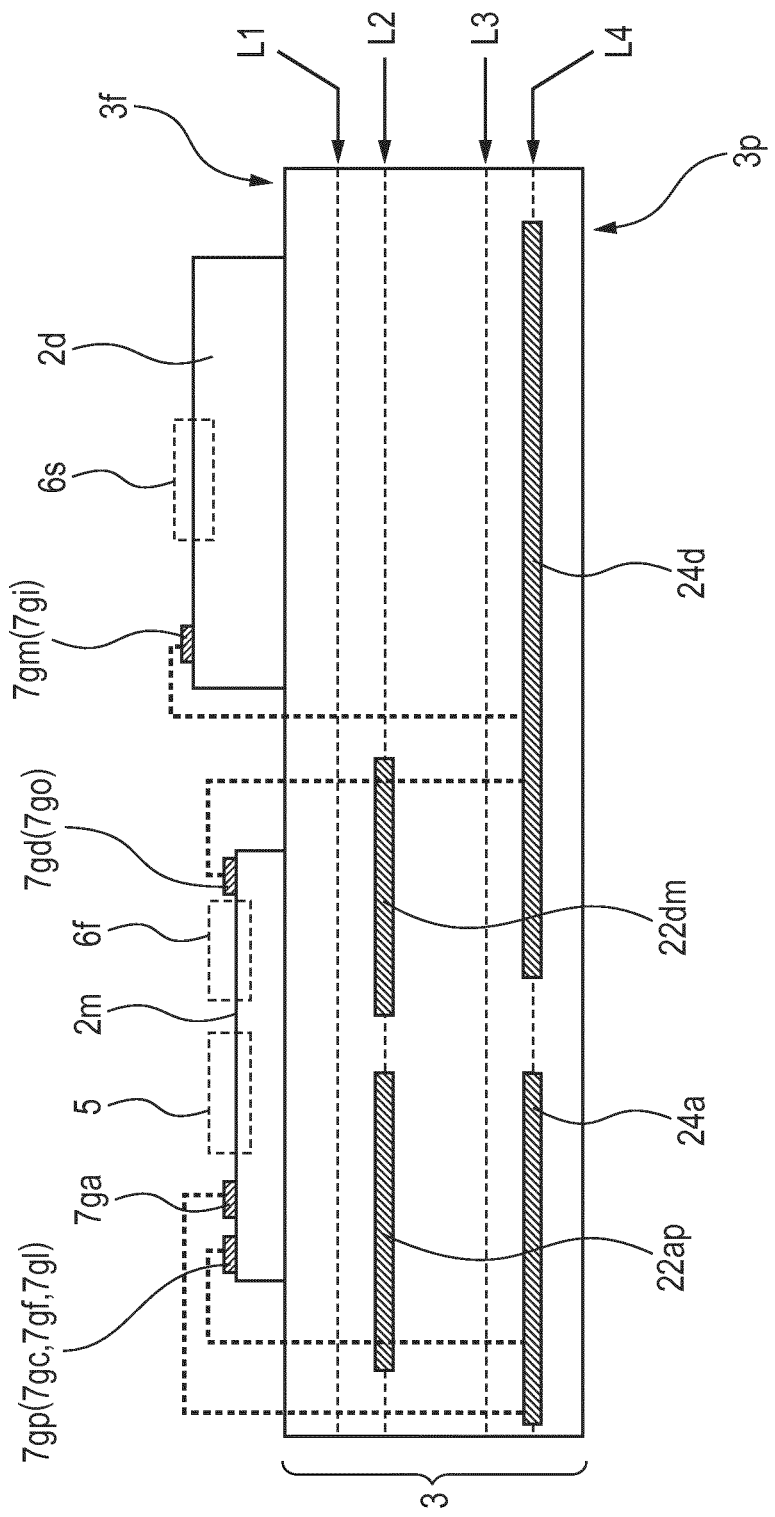
FIG. 31 is a typical sectional view of the RF module 20 for describing other characteristics of the device structure in the semiconductor integrated circuit device according to the one embodiment of the present application.

FIG. 30 is a diagram for describing a typical section or the like being the section taken along line Y-Y' of FIG. 1 substantially corresponding to FIG. 2 for describing the outline of the device structure in the semiconductor integrated circuit device according to the one embodiment of the present application. FIG. 31 is a typical sectional view of the RF module 20 for describing other characteristics of the device structure in the semiconductor integrated circuit device according to the one embodiment of the present application. Considerations as to supplementary explanations related to the embodiment (including medications) and in general will be made based on these.

(1) Technical Problems about SIP (System in Package) or the Like in which a Mixed Signal Chip and a Digital Chip Such as an RF Module of Flat Type Arrangement are Mixed Together:

In the RF module of flat type arrangement, there is a case in which two chips are required to be coupled to each other by wires. There are needs such as a digital processing unit being built in an RF chip that mainly processes an RF signal, etc. from the relationship of the degree of integration or the like. In such a case, for example, there is a problem that where both chips are taken as a bulk standard CMOS based on a silicon substrate, that is, an in-substrate structure is of a non-epitaxial substrate type bulk CMOS structure, digital noise propagates to an analog circuit through a relatively high-resistance P-type substrate region. On the other hand, there is a fear that when both chips are made identical in thickness, for example even in an assembly process, wires sag on the second bonding side upon inter-chip wire coupling, so that a wire short-circuit failure such as contact with each chip occurs.

(2) Description of Outline of Device Structure in Semiconductor Integrated Circuit Device According to the One Embodiment (Refer to FIG. 2, Principally Based on FIG. 30):

Thus, in the semiconductor integrated circuit device according to the one embodiment, these problems are reduced by making the thickness Tm of the mixed signal chip 2m (first semiconductor chip) thinner by comparison with the thickness Td of the digital chip 2d (second semiconductor chip) as shown in FIG. 30.

By doing so, the parasitic inductance and resistance of each in-substrate noise path in the mixed signal chip 2m (first semiconductor chip) inevitably increase. Accordingly, the propagation of digital noise from the first digital circuit area 6f to the analog circuit area 5 lying over the mixed signal chip 2m (first semiconductor chip) via the in-substrate noise path is limited.

On the other hand, since the surface on the digital chip 2d (second semiconductor chip) side is at a high position, and the surface on the mixed signal chip 2m (first semiconductor chip) side is at a low position, the altitude of each wire can substantially monotonously be lowered from a high place to a low place, thus making it possible to prevent a wire's short-circuit failure.

(3) Supplementary Explanations Related to Other Characteristics (Shortest Interconnecting Structure Between LNA Reference Voltage Terminal and Other Analog System Reference Voltage Terminal Via Analog System Back Surface Reference Voltage Plane) of Device Structure in Semiconductor Integrated Circuit Device According to the One Embodiment (Refer to FIGS. 15 and 16 and the Like, Principally Based on FIG. 31):

As shown in FIG. 31 or FIG. 15 and the like, the shortest interconnecting in the interposer 3 between an LNA ground pad 7ga of a low-noise amplifier circuit area LNA and a PLL ground pad 7gp (analog element circuit area-reference voltage terminal) of other analog system circuit, e.g., a PLL circuit area PLL is performed through a fourth layer analog ground plane 24a. Incidentally, as the analog element circuit area-reference voltage terminals, there are, for example, an ADC ground pad 7gc, an analog baseband processing circuit-ground pad 7gf, a mixer circuit-ground pad 7gl, etc. in addition to the above. These are also exactly the same.

Thus, since the LNA ground pad 7ga and the ground pad of other analog system circuit are shortest-interconnected by the fourth layer analog ground plane 24a, the impedance of a path between the two can be increased. As a result, it is possible to prevent digital noise from other analog system circuit from propagating to the low-noise amplifier circuit area LNA.

Thus, the special treatment of the low-noise amplifier circuit area LNA is ascribable to the fact that the low-noise amplifier circuit area LNA treats an especially weak input signal. This is also ascribable even to the fact that there is a high possibility that when it treats very broadband signals like this example, noise of all wavelengths will be picked up.

(4) Supplementary Explanations Related to Other Characteristics (Shortest Interconnecting Structure Between Digital System Reference Voltage Terminal of Mixed Signal Chip and Reference Voltage Terminal of Digital Chip Via Digital System Back Surface Reference Voltage Plane) of Device Structure in Semiconductor Integrated Circuit Device According to the One Embodiment (Refer to FIGS. 17, 18 and 19, Principally Based on FIG. 31):

As shown in FIG. 31 or 17 and the like, the shortest interconnecting in the interposer 3 between a ground pad of a digital system element circuit of the mixed signal chip 2m and a ground pad of a digital system element circuit of the digital chip 2d is performed through a fourth layer digital ground plane 24d. Here, the digital system element circuit of the mixed signal chip 2m is a digital baseband processing circuit area DBB, for example. The digital system element circuit is a digital demodulator circuit area DM, for example.

Incidentally, as the reference voltage terminals for the digital system element circuit of the mixed signal chip 2m, there are, for example, an output buffer circuit-ground pad 7go, etc. in addition to the above. These are also exactly the same. Likewise, as the reference voltage terminals for the digital system element circuit of the digital chip 2d, there are, for example, an input buffer circuit-ground pad 7gi, etc. in addition to the above. These are also exactly the same.

Thus, since the ground pad of the digital system element circuit of the mixed signal chip 2m and the ground pad of the digital chip 2d are shortest-interconnected by the fourth layer digital ground plane 24d, the impedance of a path between the two can be increased. As a result, it is possible to reduce the propagation of digital noise from the digital chip 2d to the mixed signal chip 2m.

(5) Supplementary Explanations Related to Other Characteristics (Shortest Interconnecting Structure Between Analogy System Reference Voltage Terminals Other Than LNA Via Analog System Reference Voltage Plane) of Device Structure in Semiconductor Integrated Circuit Device According to the One Embodiment (Refer to FIGS. 15 and 16 and the Like, Principally Based on FIG. 31):

As shown in FIG. 31 or FIG. 15 and the like, the shortest interconnecting in the interposer 3 between, for example, a PLL ground pad 7gp of the PLL circuit area PLL and an ADC ground pad 7gc of an analog-digital converter circuit area ADC, of analog system element circuit-ground pads of the mixed signal chip 2m is performed through a second layer analog ground plane 22ap. As the analog system element circuit-reference voltage terminals of the mixed signal chip 2m, there are, for example, an analog baseband processing circuit-ground pad 7gf, a mixer circuit-ground pad 7gl, etc. in addition to the above. These are also exactly the same.

By doing so, it is possible to ensure satisfactory grounding characteristics between the analog system element circuits other than the low-noise amplifier circuit area LNA while avoiding the propagation of noise to the low-noise amplifier circuit area LNA.

(6) Supplementary Explanations Related to Other Characteristics (Reference Voltage Plane Separation Structure Below Mixed Signal Chip) of Device Structure in Semiconductor Integrated Circuit Device According to the One Embodiment (Refer to FIGS. 15 Through 19, Principally Based on FIG. 31):

As shown in FIG. 31 and FIGS. 15 through 19, the shortest interconnecting in the interposer 3 between, for example, a digital baseband processing circuit-ground pad 7gd and an output buffer circuit-ground pad 7go of digital system element circuit-ground pads of the mixed signal chip 2m is performed through a second layer digital ground plane 22dm. Thus, since the second layer analog ground plane 22ap and the second layer digital ground plane 22dm lying below the analog chip 2m are geometrically separated from each other, it is possible to prevent digital nose from directly propagating through this plane.

4. Summary

Although the invention made above by the present inventors has been described specifically on the basis of the preferred embodiments, the present invention is not limited to the embodiments referred to above. It is needless to say that various changes can be made thereto within the scope not departing from the gist thereof.

For example, although the embodiment has concretely explained the device that principally uses the silicon system semiconductor substrate, the present invention is not limited to it. It is needless to say that it can be applied even to devices each of which uses a Ge system substrate or a compound semiconductor (GaAs, InP, SiGe, SiC, GaN) substrate (some chips may be such chips as described above).

Although the embodiment has concretely explained the device equipped with the plural chips principally mounted over the multilayer wiring board, the present invention is not limited to it. It is needless to say that it can be applied even to a device in which a plurality of chips are integrated using a lead frame.

Further, although the embodiment has concretely explained the device using the semiconductor chips each of which has mainly used the non-epitaxial type bulk silicon substrate, the present invention is not limited to it. It is needless to say that it can be applied even to a device using semiconductor chips each of which has used an epitaxial type bulk silicon substrate or an SOI substrate.

What is claimed is:

1. A semiconductor integrated circuit device comprising:
    (a) an organic multilayer wiring board having a chip mounting surface and an external land arrangement surface;
    (b) a first semiconductor chip mounted over the chip mounting surface and having an analog circuit area and a first digital circuit area;
    (c) a second semiconductor chip mounted over the chip mounting surface and having a second digital circuit area; and
    (d) a plurality of bonding wires which interconnect between a plurality of terminals provided over respective surfaces of the first and second semiconductor chips,
    wherein the thickness of the first semiconductor chip is thinner than the thickness of the second semiconductor chip,
    wherein a semiconductor substrate of the first semiconductor chip is a P-type single crystal semiconductor silicon substrate, comprising a non-epitaxial substrate type bulk CMOS structure,
    wherein the organic multilayer wiring board includes:
    (a1) a front surface wiring layer provided on the front surface side;
    (a2) a back surface wiring layer provided on the back surface side;
    (a3) a front surface-side internal wiring layer provided between the front surface wiring layer and the back surface wiring layer;
    (a4) a back surface-side internal wiring layer placed between the front surface wiring layer and the back surface wiring layer and provided on the side closer to the back surface wiring layer than the front surface-side internal wiring layer;
    (a5) a first analog circuit-internal layer reference voltage plane which is below the first semiconductor chip and provided in one of the front surface-side internal wiring layer and the back surface-side internal wiring layer; and
    (a6) a first digital circuit-internal layer reference voltage plane which is below the first semiconductor chip and which is provided in the one of the front surface-side internal wiring layer and the back surface-side internal wiring layer and plane-geometrically separated from the first analog circuit-internal layer reference voltage plane.

2. The semiconductor integrated circuit device according to claim 1,
    wherein the first semiconductor chip includes:
    (b1) a low-noise amplifier area provided in the analog circuit area;
    (b2) a plurality of analog element circuit areas provided within the analog circuit area, separately from the low-noise amplifier area;
    (b3) a low-noise amplifier area-reference voltage terminal for the low-noise amplifier area; and
    (b4) a plurality of analog element circuit area-reference voltage terminals, each of the plurality of analog element circuit area-reference voltage terminals for a different respective analog element circuit area,
    wherein the low-noise amplifier area-reference voltage terminal and each of the analog element circuit area-reference voltage terminals are interconnected through an analog circuit-back surface reference voltage plane provided in the back surface wiring layer.

3. The semiconductor integrated circuit device according to claim 2, wherein the analog element circuit area-reference voltage terminals are interconnected through the first analog circuit-internal layer reference voltage plane.

4. The semiconductor integrated circuit device according to claim 3,
wherein the front surface wiring layer includes:
(a1-1) a low-noise amplifier area-reference voltage wiring coupled to the low-noise amplifier area-reference voltage terminal by a bonding wire;
(a1-2) a low-noise amplifier area-power wiring coupled to a low-noise amplifier area-power terminal by a bonding wire; and
(a1-3) a low-noise amplifier area-signal wiring coupled to a low-noise amplifier area-signal terminal by a bonding wire,
wherein the first analog circuit-internal layer reference voltage plane has a cutout portion that monolithically includes the low-noise amplifier area-reference voltage wiring, the low-noise amplifier area-power wiring and the low-noise amplifier area-signal wiring, at a portion where the first analog circuit-internal layer reference voltage plane overlaps with these wirings.

5. The semiconductor integrated circuit device according to claim 4, further including:
(e) a first digital circuit area-reference voltage terminal provided over the first semiconductor chip;
(f) a second digital circuit area-reference voltage terminal provided over the second semiconductor chip; and
(g) a digital circuit-back surface reference voltage plane provided in the back surface wiring layer,
wherein the first digital circuit area-reference voltage terminal and the second digital circuit area-reference voltage terminal are interconnected through the digital circuit-back surface reference voltage plane.

6. The semiconductor integrated circuit device according to claim 5,
wherein the first digital circuit area includes:
(b5) a digital baseband processing circuit area; and
(b6) a differential output buffer circuit area for differential-outputting a signal outputted from the digital baseband processing circuit area to the outside of the first semiconductor chip, and
wherein the other of the front surface-side internal wiring layer and the back surface-side internal wiring layer includes:
(a5-1) a digital baseband processing circuit area-inner layer power plane which is below the first semiconductor chip and provided in the other of the front surface-side internal wiring layer and the back surface-side internal wiring layer, and
(a5-2) a differential output buffer circuit area-inner layer power plane which is below the first semiconductor chip and which is provided in the other of the front surface-side internal wiring layer and the back surface-side internal wiring layer and plane-geometrically separated from the digital baseband processing circuit area-inner layer power plane.

7. The semiconductor integrated circuit device according to claim 6,
wherein the second digital circuit area includes:
(b7) a digital demodulator circuit area; and
(b8) a differential input buffer circuit area for receiving a differential signal sent from the outside of the second semiconductor chip and sending the same to the digital demodulator circuit area, and
wherein the other of the front surface-side internal wiring layer and the back surface-side internal wiring layer includes:
(a5-3) a differential input buffer circuit area-inner layer power plane which is below the second semiconductor chip and provided in the other of the front surface-side internal wiring layer and the back surface-side internal wiring layer; and
(a5-4) a digital demodulator circuit-power plane which is below the second semiconductor chip and which is provided in the other of the front surface-side internal wiring layer and the back surface-side internal wiring layer and plane-geometrically separated from the differential input buffer circuit area-inner layer power plane.

8. The semiconductor integrated circuit device according to claim 7,
wherein the first semiconductor chip includes:
(b9) a guard band provided so as to separate between the analog circuit area and the first digital circuit area, and
(b10) a guard ring provided so as to surround a periphery of the low-noise amplifier area,
wherein the guard band and the guard ring are respectively electrically coupled to reference voltage terminals different from the low-noise amplifier area-reference voltage terminal and different from each other.

* * * * *